United States Patent
Misu et al.

(10) Patent No.: US 7,061,345 B2
(45) Date of Patent: Jun. 13, 2006

(54) FILTER CIRCUIT WITH SERIES AND PARALLEL ELEMENTS

(75) Inventors: Koichiro Misu, Tokyo (JP); Koji Ibata, Tokyo (JP); Kouji Murai, Tokyo (JP); Kenji Yoshida, Tokyo (JP); Kousaku Yamagata, Tokyo (JP); Kenji Itoh, Tokyo (JP); Isao Murase, Tokyo (JP); Masao Koshinaka, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 94 days.

(21) Appl. No.: 10/493,662

(22) PCT Filed: Dec. 13, 2002

(86) PCT No.: PCT/JP02/13088

§ 371 (c)(1),
(2), (4) Date: Apr. 26, 2004

(87) PCT Pub. No.: WO03/052930

PCT Pub. Date: Jun. 26, 2003

(65) Prior Publication Data

US 2004/0246077 A1    Dec. 9, 2004

(30) Foreign Application Priority Data

Dec. 14, 2001 (JP) ............................. 2001-382022
Jul. 29, 2002 (JP) ............................. 2002-220087
Sep. 2, 2002 (JP) ............................. 2002-256588

(51) Int. Cl.
  *H03H 9/54* (2006.01)
  *H03H 9/64* (2006.01)
(52) U.S. Cl. ........................ 333/187; 333/193; 333/186

(58) Field of Classification Search ................ 333/187, 333/195, 189–193
See application file for complete search history.

(56) References Cited

U.S. PATENT DOCUMENTS

| | | | | |
|---|---|---|---|---|
| 1,795,204 | A | * | 3/1931 | Espenschied ............... 333/189 |
| 3,970,972 | A | | 7/1976 | Bunner ....................... 333/234 |
| 4,954,793 | A | * | 9/1990 | Misu et al. ................. 333/133 |
| 5,291,159 | A | * | 3/1994 | Vale ........................... 333/188 |
| 5,760,663 | A | * | 6/1998 | Pradal ........................ 333/187 |
| 6,201,457 | B1 | * | 3/2001 | Hickernell .................. 333/193 |

FOREIGN PATENT DOCUMENTS

| | | |
|---|---|---|
| JP | 51-92147 A | 8/1976 |
| JP | 53-52344 A | 5/1978 |
| JP | 57-123714 A | 8/1982 |
| JP | 58-15316 A | 1/1983 |

(Continued)

OTHER PUBLICATIONS

Japan Society for the Promotion of Science 150th Committee on Acoustic Wave Device Technology, Ohmsha Co., Tokyo, Nov. 30, 1991, pp. 217-227.

(Continued)

*Primary Examiner*—Barbara Summons
(74) *Attorney, Agent, or Firm*—Birch, Stewart, Kolasch & Birch, LLP

(57) ABSTRACT

Filter circuitry is provided with a series element and a parallel element. The filter circuitry transmits signals that fall within a certain passband and attenuates signals that don't fall within the certain passband. The series element is comprised of a resonance element having antiresonance characteristics, and the parallel element is comprised of a series circuit including an inductor and a capacitor.

17 Claims, 33 Drawing Sheets

FOREIGN PATENT DOCUMENTS

| | | | | |
|---|---|---|---|---|
| JP | 1-194603 A | 8/1989 | | |
| JP | 1-290308 | * 11/1989 | ................ | 333/193 |
| JP | 6-350390 A | 12/1994 | | |
| JP | 9-116380 A | 5/1997 | | |
| JP | 10-126212 A | 5/1998 | | |
| JP | 2003-298393 | * 10/2003 | | |

OTHER PUBLICATIONS

Morio Onoe et al., Ohmsha Co., Tokyo, Sep. 20, 1982, pp. 175-188.

Yasuharu Suematsu, Kyoritsu Shuppan Co., Ltd., Tokyo, Oct. 5, 1973, pp. 206-207.

* cited by examiner

FILTER CIRCUIT WITH SERIES AND PARALLEL ELEMENTS

FIELD OF THE INVENTION

The present invention relates to filter circuitry that transmits signals that fall within a certain passband for use with communication equipment and so on and that attenuates signals that don't fall within the certain passband.

BACKGROUND OF THE INVENTION

FIG. 1 is a block diagram showing prior art filter circuitry as described in Japanese patent application publication (TOKKAIHEI) No. 10-126212 (referred to as reference 1 from here on), for example. In the figure, reference numeral 1 denotes a SAW resonator that constitutes a parallel element, reference numeral 2 denotes a SAW resonator that constitutes a series element, reference numeral 3 denotes an input terminal, reference numeral 4 denotes a ground terminal disposed on an input side of the prior art filter circuitry, reference numeral 5 denotes an output terminal, and reference numeral 6 denotes a ground terminal disposed on an output side of the prior art filter circuitry.

FIG. 2 is a block diagram showing each SAW resonator. For example, in the case of the SAW resonator 1 that is a parallel element as shown in FIG. 1, the SAW resonator 1 has an upper electric terminal 7 with the same potential as the input terminal 3, and a lower electric terminal 8 with the same potential as the ground terminal 4 disposed on the input side of the filter circuitry, as shown in FIG. 2.

FIG. 3 is a drawing showing a concrete structure of the SAW resonator 1. In the figure, reference numeral 9 denotes an IDT (Inter Digital Transducer). A number of electrode fingers 10 each having a width of d1 are alternately arranged at predetermined spacings of P1 over a length W. Each electrode finger 10 is typically composed of a metallic thin film having a thickness of h, which is mainly composed of aluminum or which can be mainly composed of a metallic material other than aluminum. Reference numeral 11 denotes a reflector in which a number of metallic strips 12 each having a width of d2 are arranged at predetermined spacings of P2, as in the case of the IDT 9.

Each reflector 11 as shown in FIG. 3 is a short-circuited strip reflector in which all metallic strips 12 are connected to one another so that they have the same potential. As an alternative, each reflector 11 can be an open-circuited strip in which all metallic strips 12 are not connected to one another so that they have their respective potentials. The spacings between the IDT 9 and the two reflectors 11 are g1 and g2 that can be equal to each other in most cases.

When an electrical signal is applied between the electric terminals 7 and 8, an electric field appears between two electrode fingers 10 that are adjacent to each other and results in the excitation of a surface acoustic wave. At this time, the surface acoustic wave is efficiently excited when the spacing P1 of the plurality of electrode fingers 10 is equal to one-half of the wavelength λ of the surface acoustic wave. In other words, the spacing P1 of the plurality of electrode fingers 10 determines the operating frequency of the SAW resonator. When a normal piezoelectric substrate is used, the surface acoustic wave excited between any two adjacent electrode fingers 10 propagates in two directions perpendicular to the plurality of electrode fingers 10, i.e., in two directions respectively extending from the IDT 9 to the two reflectors 11.

On the other hand, in each reflector 11, the differences among the mass loads and electric boundary conditions of the plurality of metallic strips 12 can cause a reflection of the surface acoustic wave at edges of the plurality of metallic strips 12. When the spacing P2 of the plurality of metallic strips 12 is equal to the one-half wavelength λ/2 of the surface acoustic wave, a strong reflection is caused because all reflected waves at the edges of the plurality of metallic strips 12 are in phase with one another.

In this case, the surface acoustic wave excited by the IDT 9 can reflect from the two reflectors 11 located on the both sides of the IDT 9, so that the energy of the surface acoustic wave is confined in the SAW resonator and the SAW resonator thus serves as a resonator. The operation of the SAW resonator is disclosed in detail by "Acoustic wave device technological handbook", 1st ed., pp. 217 to 227 (referred to as reference 2 from here on), which was edited by Japan Society for the Promotion of Science 150th Committee on Acoustic Wave Device Technology and which was published on Nov. 30, 1991). The SAW resonator has an input impedance that is minimized at a resonance frequency $f_r$, and an input admittance that is minimized at an antiresonance frequency $f_a$. In addition, the resonance frequency $f_r$ is lower than the antiresonance frequency $f_a$.

FIG. 4 is a circuit diagram showing an equivalent circuit of the SAW resonator. In the figure, reference numeral 13 denotes an electrode capacitance $C_0$ that the IDT 9 of FIG. 3 has, reference numeral 14 denotes an inductor $L_1$, and reference numeral 15 denotes a capacitor $C_1$.

The resonance frequency $f_r$ of the SAW resonator is equal to the frequency of a series resonance circuit comprised of the inductor 14 and the capacitor 15, and the impedance between the electric terminals 7 and 8 of the SAW resonator therefore becomes nearly-short-circuited at the resonance frequency $f_r$.

Furthermore, the antiresonance frequency $f_a$ of the SAW resonator is equal to the frequency of a parallel resonance circuit comprised of the electrode capacitance 13 and the series circuit (i.e., the combination of the inductor 14 and the capacitor 15), and the impedance between the electric terminals 7 and 8 of the SAW resonator therefore becomes nearly-open-circuited at the antiresonance frequency $f_a$. These relationships are given by the following equations:

$$f_r = \frac{1}{2\pi\sqrt{L_1 C_1}} \qquad (1)$$

$$f_a = \frac{1}{2\pi}\sqrt{\frac{1}{L_1 C_1}\left(\frac{C_1}{C_0}+1\right)} = f_r\sqrt{1+\frac{C_1}{C_0}} \qquad (2)$$

The reference 2 discloses an equivalent circuit in which the inductor 14 is assumed to have a resistance component R1 and a q-factor (Quality Factor) is taken into account when series resonance occurs. In the case of such an equivalent circuit, the impedance between the electric terminals 7 and 8 of the SAW resonator at the resonance frequency $f_r$ does not become completely-short-circuited, but has a minimum value.

FIG. 5 is an explanatory drawing for explaining an operation of the prior art filter circuitry of FIG. 1. FIG. 5A shows the impedance characteristics of the SAW resonator 2 that is a series element, FIG. 5B shows the admittance characteristics of the SAW resonator 1 that is a parallel element, and FIG. 5 C shows the filter characteristics of the prior art filter circuitry in which the SAW resonator 2 that is a series element and the two SAW resonators 1 each of which is a parallel element are connected as shown in FIG. 1.

Next, a description will be made as to the operation of the prior art filter circuitry.

The SAW resonator 2 that is the series element produces series resonance at a frequency $f_{r2}$, and produces parallel resonance at a frequency $f_{ra2}$. In other words, the resonance frequency of the SAW resonator 2 is $f_{r2}$ and the antiresonance frequency of the SAW resonator 2 is $f_{a2}$.

The vertical axis of FIG. 5A shows an imaginary part of the impedance of the SAW resonator 2. The SAW resonator 2 serves as a capacitor having a capacitance of $C_0$ in a frequency range in which no surface acoustic wave is excited. Therefore, the SAW resonator 2 has a negative imaginary impedance in a range of frequencies lower from the resonance frequency $f_{r2}$ and in a range of frequencies higher than the antiresonance frequency $f_{a2}$.

On the other hand, each of the two SAW resonators 1 that is a parallel element produces series resonance at a frequency $f_{r1}$, and produces parallel resonance at a frequency $f_{a1}$. In other words, the resonance frequency of the SAW resonator 1 is $f_{r1}$ and the antiresonance frequency of the SAW resonator 1 is $f_{a1}$.

The vertical axis of FIG. 5B shows an imaginary part of the admittance of each SAW resonator 1. The imaginary part of the admittance of each SAW resonator 1 has a positive admittance in a range of frequencies lower from the resonance frequency $f_{r1}$ and in a range of frequencies higher than the antiresonance frequency $f_{a1}$.

Here, the resonance frequency $f_{r2}$ of the SAW resonator 2 is set so that it is nearly equal to the antiresonance frequency $f_{a1}$ of each SAW resonator 1. At this time, because the SAW resonator 2 has an impedance that is nearly equal to 0 at a frequency which is close to the resonance frequency $f_{r2}$, the SAW resonator 2 becomes a short-circuited state. On the other hand, because each of the two SAW resonators 1 has an admittance that is nearly equal to 0 at a frequency which is close to the antiresonance frequency $f_{r1}$, each SAW resonator 1 becomes a nearly-open-circuited state. Therefore, a nearly-short-circuit occurs between the input terminal 3 and the output terminal 5, and a nearly-open-circuit occurs between the input terminal 3 and the ground terminal 4 disposed on the input side of the filter circuitry and a nearly-open-circuit similarly occurs between the output terminal 5 and the ground terminal 6 disposed on the input side of the filter circuitry. The filter circuitry disposed between the input terminal 3 and the output terminal 5 thus has a low-loss passband.

On the other hand, each SAW resonator 1 becomes a nearly-short-circuited state at a frequency that is close to the resonance frequency $f_{r1}$. In this case, because a nearly-short-circuit occurs between the input terminal 3 and the ground terminal 4 disposed on the input side of the filter circuitry and a nearly-short-circuit also occurs between the output terminal 5 and the ground terminal 6 disposed on the output side of the filter circuitry, no electrical signal can be transmitted from the input terminal 3 to the output terminal 5 and a large attenuation pole is formed. Because this attenuation pole has a frequency that is close to the resonance frequency $f_{r1}$ of the SAW resonator 1, the frequency of the attenuation pole is limited to a frequency that is lower than the antiresonance frequency $f_{a1}$ of the SAW resonator 1 that is placed in the passband of the filter circuitry.

The SAW resonator 2 becomes a nearly-open-circuited state at a frequency that is close to the antiresonance frequency $f_{a2}$. In this case, no electrical signal can be transmitted from the input terminal 3 to the output terminal 5 and a large attenuation pole is formed. Because this attenuation pole has a frequency that is close to the antiresonance frequency $f_{a2}$ of the SAW resonator 2, the frequency of the attenuation pole is limited to a frequency that is higher than the resonance frequency $f_{r2}$ of the SAW resonator 2 that is placed in the passband of the filter circuitry.

Even when using resonators other than the SAW resonators as the series element and two parallel elements included in the filter circuitry, the filter circuitry of FIG. 1 exhibits similar characteristics. For example, the filter circuitry of FIG. 1 exhibits similar characteristics even when using bulk wave resonators that utilize a thickness longitudinal vibration or thickness slip vibration as the series element and two parallel elements included in the filter circuitry.

For example, as disclosed in "Basic of solid vibration theory for electric and electronics", 1st ed., pp. 175 to 188 (referred to as reference 3 from here on), which was published on Sep. 20, 1982 by Ohmsha Co. and which was supervised by Morio Onoe, it is known that a bulk wave resonator has the following approximately-established relationship among a resonance frequency $f_r$, an antiresonance frequency $f_a$, and an electromechanical coupling constant $k^2$ of a piezoelectric element that constitutes the bulk wave resonator.

$$k^2 \sim 2(f_a - f_r)/f_a \qquad (3)$$

This equation (3) shows that the difference between the resonance frequency $f_r$ and antiresonance frequency $f_a$ of the bulk wave resonator is nearly equal to one-half of the electromechanical coupling constant $k^2$ of the used piezoelectric element which is multiplied by the antiresonance frequency $f_a$. This relationship is similarly established for SAW resonators. In other words, when filter circuitry is comprised of acoustic wave resonators such as bulk wave resonators or SAW resonators, because the difference between the center of frequencies within the passband of the filter circuitry and the frequency of an attenuation pole that provides large attenuation is equal to the difference between the resonance frequency $f_r$ and antiresonance frequency $f_a$ of an acoustic wave resonator included in the filter circuitry, the difference between the resonance frequency $f_r$ and antiresonance frequency $f_a$ of the acoustic wave resonator is limited to almost one-half of the center of frequencies within the passband of the filter circuitry which is multiplied by the electromechanical coupling constant $k^2$ of the used piezoelectric element. Therefore, the difference between the center of the passband of the filter circuitry and the center of the stopband of the filter circuitry that needs large attenuation is limited by the performance of the used piezoelectric element.

For example, although either lithium niobate ($LiNbO_3$) or lithium tantalate ($LiTaO_3$) is widely known and used as the piezoelectric element that is used in each SAW resonator included in the filter circuitry, such a piezoelectric element has an electromechanical coupling constant $k^2$ of at most ten and a few %. A problem is therefore that the difference between the center of the passband of the filter circuitry and the frequency of an attenuation pole that provides large attenuation is only about 5 to 6% of the center of the passband of the filter circuitry.

FIG. 6 is a block diagram showing other prior art filter circuitry as disclosed in Japanese patent application publication (TOKKAIHEI) No. 6-350390 (referred to as reference 4 from here on), for example. The other prior art filter circuitry is so constructed as to include, as a series element, a series circuit comprised of a first SAW resonator 2a, a second SAW resonator 2b, and an inductor 16, and, as a parallel element, a parallel resonance circuit comprised of an inductor 15 and a capacitor 14.

FIG. 7 is an explanatory drawing for explaining an operation of the other prior art filter circuitry of FIG. 6. FIG. 7A shows an impedance characteristic 17 of the first SAW resonator 2a, an impedance characteristic 18 of the second SAW resonator 2b, and an impedance characteristic 19 of the inductor 16.

The first SAW resonator 2a has a resonance frequency of $f_{r1}$ and an antiresonance frequency of $f_{a1}$, and the second SAW resonator 2b has a resonance frequency of $f_{r2}$ and an antiresonance frequency of $f_{a2}$. The antiresonance frequency $f_{a1}$ of the first SAW resonator 2a is lower than the resonance frequency $f_{r2}$ of the second SAW resonator 2b.

FIG. 7B shows an admittance characteristic 20 of the parallel resonance circuit comprised of the inductor 14 and the capacitor 15. The parallel resonance circuit has an antiresonance frequency of $f_{ap}$, and the antiresonance frequency $f_{ap}$ of the parallel resonance circuit is so set as to be intermediate between the antiresonance frequency $f_{a1}$ of the first SAW resonator 2a and the resonance frequency $f_{r2}$ of the second SAW resonator 2b.

The vertical axis of each of FIGS. 7A and 7B shows an imaginary part. FIG. 7C shows a pass filter characteristic of the filter circuitry constructed as show in FIG. 6.

Because the antiresonance frequency $f_{ap}$ of the parallel resonance circuit that consists of the inductor 14 and the capacitor 15 is set to a frequency $f_{pass}$ that falls within the passband of the filter circuit, the parallel resonance circuit has an impedance that becomes nearly-open-circuited. Because the first SAW resonator 2a operates at a frequency higher than the antiresonance frequency $f_{a1}$ thereof, the first SAW resonator 2a has a capacitive impedance. In addition, because the second SAW resonator 2b operates at a frequency higher than the resonance frequency $f_{r2}$ thereof, the second SAW resonator 2b has a capacitive impedance. Therefore, the inductor 16 having an inductivity impedance, is indispensable in order to cancel out the capacitive impedances of the first and second SAW resonators 2a and 2b. In general, an inductor has a large loss at a frequency that is of the order of GHz. For example, an inductor formed on a dielectric substrate has a q-factor of the order of several tens, and a high-q-factor inductor, such as an air-core coil, has a q-factor of at most the order of 100. Therefore, in the case where an inductor is included in each of the series element and parallel element of the filter circuitry as shown in FIG. 6, there is a problem that loss in the passband increases.

Furthermore, in the parallel resonance circuit that is the parallel element, the admittance of the inductor 14 becomes predominant at a frequency lower than the antiresonance frequency $f_{ap}$ of the parallel resonance circuit because it is smaller than the admittance of the capacitor 15, and the parallel resonance circuit exhibits an inductive admittance. On the other hand, the admittance of the capacitor 15 becomes predominant at a frequency higher than the antiresonance frequency $f_{ap}$ of the parallel resonance circuit because it is smaller than the admittance of the inductor 14, and the parallel resonance circuit exhibits a capacitive admittance. A further problem encountered with the prior art filter circuitry is therefore that because at a frequency within the passband the filter circuitry has an impedance having a component other than a pure resistance component, which increases with increase in the difference between the frequency and the antiresonance frequency $f_{ap}$, it is difficult to implement low-loss characteristics over a wide frequency band.

FIG. 8 is a block diagram showing prior art filter circuitry as shown in Japanese patent application publication No. (TOKKAIHEI) No. 9-116380 (referred to as reference 5 from here on), for example. In the figure, reference numeral 21 denotes a resonance circuit in which a capacitor 13 and a series resonance circuit (i.e., a capacitor 15 and an inductor 14) are connected in parallel with each other.

The resonance circuit 21 is the same as the one as shown in FIG. 4, and, essentially, it is no different from a SAW resonator. In addition, from the viewpoint of design, the resonance frequency of the resonance circuit 21 is so set as to be nearly equal to the antiresonance frequency of each SAW resonator 1 that is a parallel element, as in the case of the prior art filter circuitry as shown in FIG. 1.

While the difference between the resonance frequency and antiresonance frequency of a SAW resonator is determined dependent upon the electromechanical coupling constant of a piezoelectric element used in the SAW resonator, the resonance circuit 21 as shown in FIG. 8 does not have such a limitation and therefore the filter circuitry including the resonance circuit 21 has room for broadening of the passband. However, the q-factor of the inductor included in the resonance circuit 21 is considerably smaller than the q-factor of the SAW resonator 2 of the filter circuitry of FIG. 1. Another problem is therefore that while a wider-band characteristic can be implemented as compared with the filter circuitry including the SAW resonator 2, it is difficult to implement a low-loss pass filter characteristic.

A further problem is that because the q-factor of the resonance circuit 21 is small, it is difficult for the prior art filter circuitry to provide steeper attenuation at frequencies higher than the passband of the filter circuit, which is produced by the series element of the filter circuitry and it is difficult for the attenuation pole which the resonance circuit 21 forms to produce a steep zero point, so that the attenuation characteristic degrades in a frequency band higher than the passband of the filter circuitry.

In other words, a problem with prior art filter circuitry constructed as mentioned above is that when frequencies within the passband are away from those within the attenuation band, it is difficult to implement a low-loss wide-band pass filter characteristic and it is also difficult to provide a large attenuation over a wide frequency band.

The present invention is proposed to solve the above-mentioned problem, and it is therefore an object of the present invention to provide filter circuitry that can implement a low-loss wide-band pass filter characteristic and can provide a large attenuation over a wide frequency band, even though frequencies within the passband are away from those within the attenuation band.

DISCLOSURE OF THE INVENTION

In accordance with the present invention, there is provided filter circuitry including a series element comprised of a resonance element having an antiresonance characteristic and a parallel element comprised of a series circuit having an inductor and a capacitor. The filter circuitry can thus have a low-loss wide-band pass filter characteristic even if a passband has a range of frequencies that is separated far apart from a range of frequencies of an attenuation band, and can also provide a large attenuation over a wide frequency band.

PREFERRED EMBODIMENTS OF THE INVENTION

In order to explain the present invention in greater detail, the preferred embodiments will be described below with reference to the accompanying figures.

Embodiment 1

Figure 9:
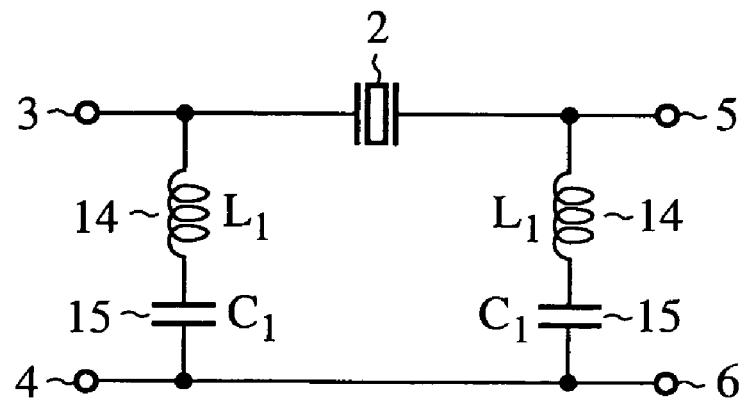
FIG. 9 is a block diagram showing the structure of filter circuitry according to embodiment 1 of the present invention.

FIG. 9 is a block diagram showing filter circuitry according to embodiment 1 of the present invention. In the figure, reference numeral 2 denotes a SAW resonator (i.e., a resonator) having an antiresonance characteristic, the SAW resonator constituting a series element of the filter circuitry, reference numeral 3 denotes an input terminal, reference numeral 4 denotes a ground terminal disposed on an input side of the filter circuitry, reference numeral 5 denotes an output terminal, reference numeral 6 denotes a ground terminal disposed on an output side of the filter circuitry, reference numeral 14 denotes an inductor, and reference numeral 15 denotes a capacitor. Two series circuits each comprised of one inductor 14 and one capacitor 15 are parallel elements of the filter circuitry, and have a π-shaped circuit structure.

Figure 10:
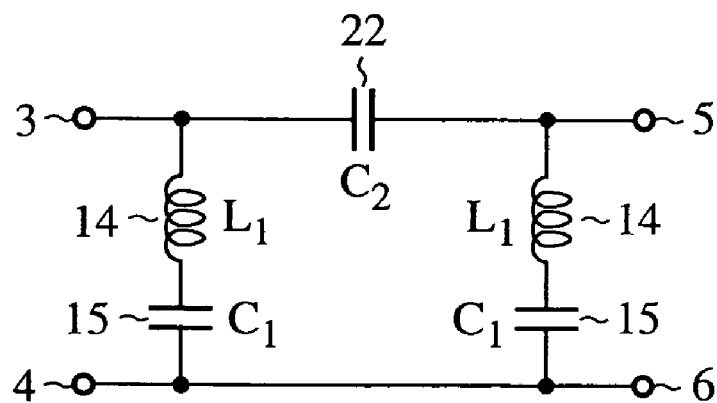
FIG. 10 is a circuit diagram showing an equivalent circuit of the filter circuitry that operates in a range of frequencies in which a SAW resonator doesn't excite any surface acoustic wave.

FIG. 10 is a circuit diagram showing an equivalent circuit of the filter circuitry that operates in a frequency range in which the SAW resonator 2 doesn't excite any surface acoustic wave, i.e., in a range of frequencies lower than a resonance frequency $f_{rs}$ of the SAW resonator 2 or a range of frequencies higher than an antiresonance frequency $f_{as}$ of the SAW resonator 2. The SAW resonator 2 serves as a capacitor 22 having a capacitance of $C_2$ at any frequency within the frequency range in which the SAW resonator 2 doesn't excite any surface acoustic wave.

Figure 11:
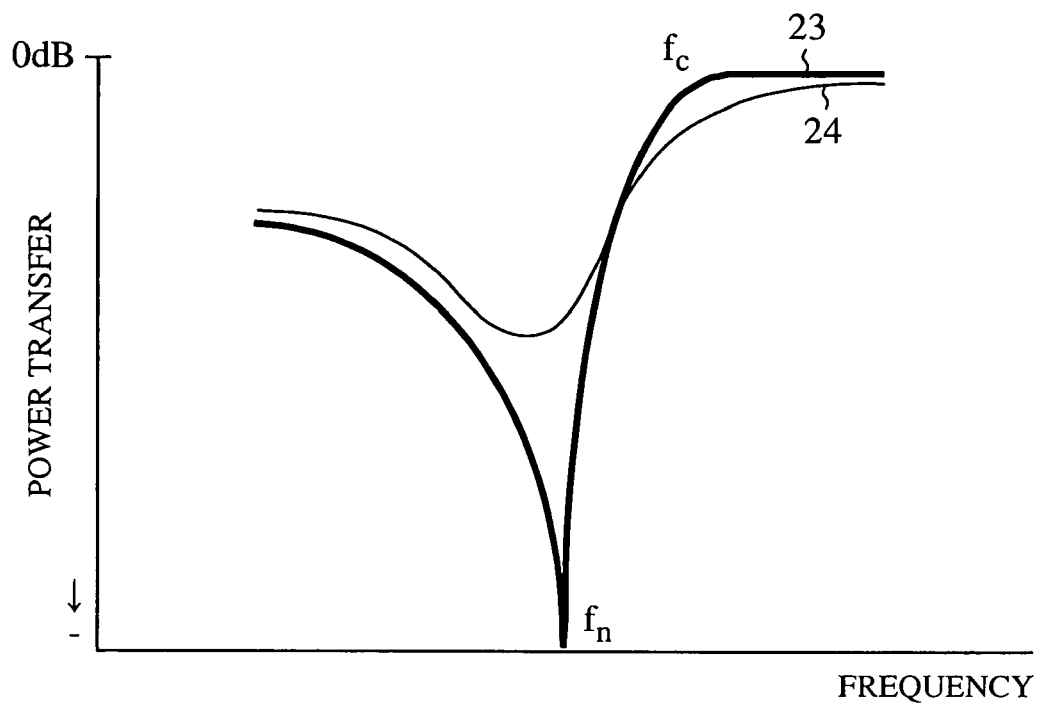
FIG. 11 is an explanatory drawing for explaining a circuit operation of the filter circuitry as shown in FIG. 10.

Each series resonance circuit comprised of one inductor 14 and one capacitor 15, which is a parallel element of the filter circuitry, produces series resonance, that is, exhibits a resonance characteristic at a frequency $f_n$(see FIG. 11). At this time, the input terminal 3 and the ground terminal 4 disposed on the input side of the filter circuitry are nearly short-circuited, and therefore most of electrical signals applied to the input terminal 3 are reflected from this input terminal. In the same manner, the output terminal 5 and the ground terminal 6 disposed on the output side of the filter circuitry are nearly short-circuited, and therefore input signals can hardly propagate between the input terminal 3 and the output terminal 5. In other words, the filter circuitry represents an attenuation pole, and exhibits a large blocking characteristic. In each series resonance circuit, when the input signal falls within a range of frequencies higher than the resonance frequency $f_n$, the impedance $j\omega L_1$ of the inductor 14 increases and the impedance $1/j\omega C_1$ of the capacitor 15 decreases with increase in the frequency of the input signal. Therefore, the impedance of the inductor 14 becomes predominant in each series resonance circuit. The filter circuitry thus having two inductors 14 as parallel elements thereof and a capacitor 22 as a series element thereof exhibits a high-pass filter characteristic with a cutoff frequency of $f_c$ (see FIG. 11).

When there is no loss in any of the two inductors 14, the two capacitors 15, and the capacitor 22, the filter circuitry exhibits a stopping characteristic and therefore provides an extremely-steep attenuation pole at a frequency close to the resonance frequency $f_n$. Furthermore, the filter circuitry exhibits a low-loss characteristic at a range of frequencies equal to or higher than the cutoff frequency $f_c$. Each inductor 14 typically has an inductance smaller than 100 nH in a frequency range from 800 MHz to about 2 GHz, which is used for mobile communications, for example. It is therefore rare that the q-factor of each inductor 14 having such an inductance exceeds at most 100. The q-factor of each inductor 14 is determined by assuming that a resistance component is connected in series to each inductor 14. The q-factor of each inductor 14 is equal to the ratio of the impedance of the inductor 14 and the resistance of the resistance component. The q-factor of each inductor decreases with increase in the inductance of each inductor. While an air-core coil has a higher q-factor than other types of inductors, a type of inductor that consists of a conductive line formed on a surface of a dielectric substrate has a q-factor of at most several tens, for example, and it is not rare that such an inductor has a q-factor of 10 or less.

On the other hand, each of the two capacitors 15 and the capacitor 22 typically has a capacitance smaller than 100 pF in a frequency range, which is used for mobile communications. The q-factor of each capacitor 15 having such a capacitance is of the order of several hundreds. The q-factor of each capacitor 15 is determined by assuming that a resistance component is connected in parallel with each capacitor 15. The q-factor of each capacitor 15 is therefore equal to the reciprocal of the product of the resistance of the resistance component and the admittance of each capacitor 15. Therefore, in each series resonance circuit, the q-factor of each inductor 14 greatly exerts an influence upon the filter characteristic of each series resonance circuit.

FIG. 11 is an explanatory drawing for explaining a circuit operation of the filter circuitry of FIG. 10. In the figure, reference character $f_n$, denotes the frequency of the attenuation pole, and reference character $f_c$ denotes the cutoff frequency. Reference numeral 23 denotes a pass filter characteristic when there is no loss in any of the two inductors 14, the two capacitors 15, and the capacitor 22, which constitute the equivalent circuit of FIG. 10, and reference numeral 24 denotes a pass filter characteristic when a loss in each of the two inductors 14, the two capacitors 15, and the capacitor 22 is taken into account.

When there is no loss in any of the two inductors 14, the two capacitors 15, and the capacitor 22, that is, when each of the two inductors 14, the two capacitors 15, and the capacitor 22 has an adequately large q-factor, as indicated by the pass filter characteristic 23, the filter circuitry can form an attenuation pole that exhibits an extremely-steep attenuation characteristic at a frequency close to the resonance frequency $f_n$. However, when the q-factor of each of the two inductors 14, the two capacitors 15, and the capacitor 22 is taken into account according to their actual operating conditions, the attenuation characteristic degrades more greatly, as indicated by the pass filter characteristic 24, as compared with the case where it is assumed that there is no loss in any of the two inductors 14, the two capacitors 15, and the capacitor 22. In other words, the attenuation characteristic of the attenuation pole at a frequency close to the resonance frequency $f_n$ degrades with increase in the uncertainty of the frequency position of the attenuation pole, and the amount of attenuation also decreases. In addition, insertion loss increases in a passband having a range of frequencies higher than the cutoff frequency $f_c$. Therefore, the equivalent circuit, as shown in FIG. 10, which consists of the two inductors 14, the two capacitors 15, and the capacitors 22, actually has such a pass filter characteristic as the pass filter characteristic 24, and therefore cannot achieve adequate performance.

Figure 12:
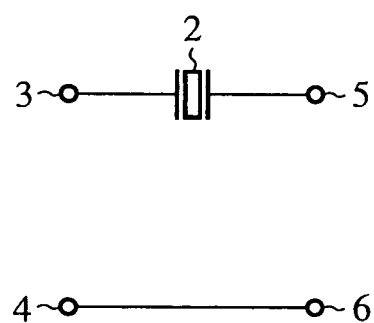
FIG. 12 is a block diagram showing a concrete structure of the SAW resonator.

In accordance with this embodiment 1, the filter circuitry uses the SAW resonator 2 as a series element thereof in order to solve the above-mentioned problem. FIG. 12 is a block diagram showing a concrete structure of the SAW resonator 2, and FIG. 13 is an explanatory drawing for explaining the pass filter characteristic 25 of the SAW resonator 2.

Figure 13:
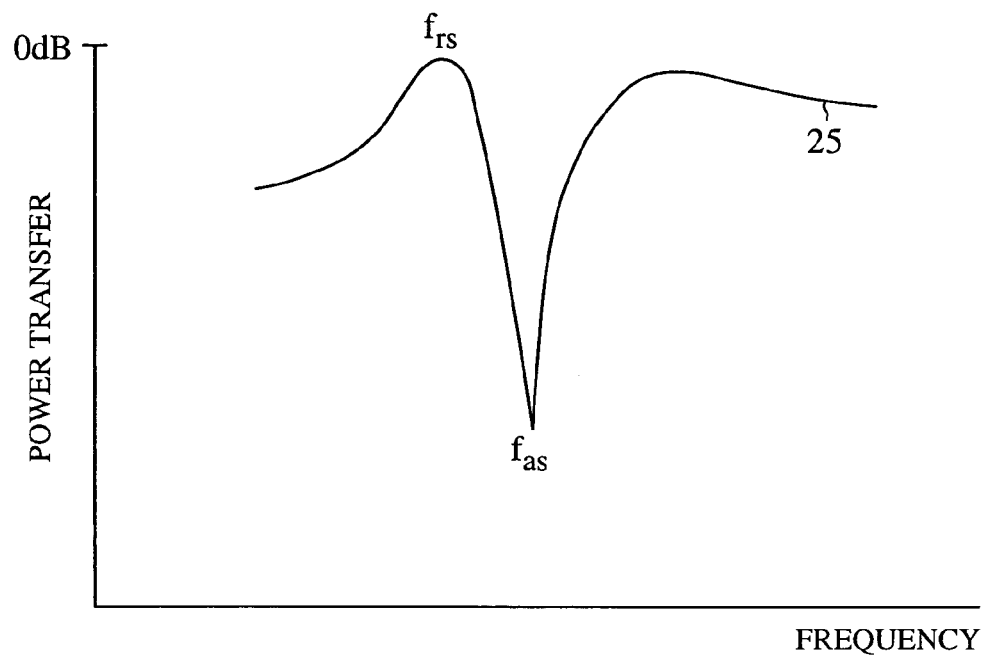
FIG. 13 is an explanatory drawing for explaining a pass filter characteristic of the SAW resonator.

The filter circuitry according to this embodiment 1 that uses the SAW resonator 2 as a series element exhibits the pass filter characteristic 25 as shown in FIG. 13. In other words, the SAW resonator 2 exhibits a series resonance characteristic at a frequency $f_{rs}$, and exhibits a parallel resonance characteristic at a frequency $f_{as}$. The frequency $f_{rs}$ is referred to as the resonance frequency of the SAW resonator, and the frequency $f_{as}$ is referred to as the antiresonance frequency of the SAW resonator. Because the SAW resonator 2 becomes nearly-short-circuited at the resonance frequency $f_{rs}$, the pass filter characteristic 25 shows that the filter circuitry has a low-loss characteristic at the resonance frequency $f_{rs}$. On the other hand, at the antiresonance frequency $f_{as}$, because the SAW resonator 2 becomes nearly-open-circuited, the pass filter characteristic 25 shows that the filter circuitry forms an attenuation pole. At this time, the SAW resonator 2 can form a steeper attenuation pole as compared with the attenuation pole as shown in FIG. 11, which is formed by a series resonance circuit that consists of one inductor 14 and one capacitor 15.

Figure 14:
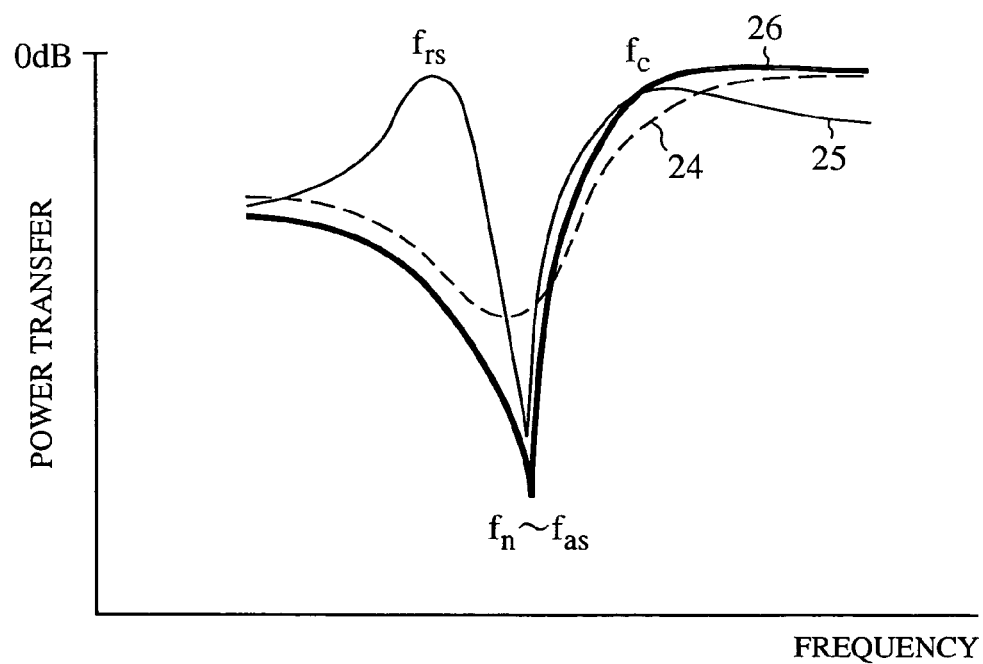
FIG. 14 is an explanatory drawing for explaining an operation of the filter circuitry as shown in FIG. 9.

FIG. 14 is an explanatory drawing for explaining an operation of the filter circuitry of FIG. 9. In the figure, reference numeral 26 denotes a pass filter characteristic of the filter circuitry of FIG. 9. It can be assumed that a superimposing of the pass filter characteristic 24 as shown in FIG. 11 upon the pass filter characteristic 25 as shown in FIG. 13 yields the pass filter characteristic 26.

The SAW resonator 2 can form a steep attenuation pole at a frequency close the antiresonance frequency $f_{as}$. However, the difference between the frequency of the attenuation pole and the resonance frequency $f_{rs}$ of the SAW resonator 2 has a limitation of the electromechanical coupling constant $k^2$ of a piezoelectric element for use in the SAW resonator 2. In other words, it is impossible to freely provide a desired frequency difference between the frequency of the attenuation pole and the resonance frequency $f_{rs}$ of the SAW resonator 2. Therefore, there is a limitation in the width of a frequency range in which the attenuation pole provides a predetermined amount or more of attenuation. When the resonance frequency $f_n$ of each series circuit that consists of one inductor 14 and one capacitor 15 is set to be closer to the antiresonance frequency $f_{rs}$ of the SAW resonator 2, a slightly-varying-attenuation characteristic, which cannot form a steep attenuation pole as indicated by the pass filter characteristic 24 shown by a broken line, is superimposed upon the pass filter characteristic 25 of the SAW resonator 2, and the amount of attenuation can be therefore increased as compared with the case of the use of only the SAW resonator 2 having the pass filter characteristic 25.

In a range of frequencies that are equal to or higher than the cutoff frequency $f_c$, and that is a frequency range that is higher than the antiresonance frequency $f_{as}$, the SAW resonator 2 excites little surface acoustic wave and only serves as the capacitor 22 having a capacitance of $C_2$. In a normal surface acoustic wave filter or SAW resonator that excites a surface acoustic wave in such a passband, when high power is input to the filter or SAW resonator, stress-induced migration occurs along with excitation of a surface acoustic wave and electromigration occurs along with an inflow of a large current, so that a breakdown occurs in the surface acoustic wave filter or SAW resonator. In contrast, in the filter circuitry of FIG. 9, because only electromigration due to an inflow of a large current can cause a breakdown in the SAW resonator 2, the filter circuitry in accordance with embodiment 1 of the present invention has higher robustness against high power than such a prior art surface acoustic wave filter. In addition, the frequency $f_{as}$ of the attenuation pole and the cutoff frequency $f_c$ can be set independent of the electromechanical coupling constant $k^2$ of the piezoelectric element for use in the SAW resonator 2. Compared with such prior art filter circuitry using a surface acoustic wave, which has a passband in the vicinity of the resonance frequency $f_{rs}$ of the SAW resonator 2, the number of degrees of freedom of the design can be dramatically improved.

In a frequency range that is higher than the antiresonance frequency $f_{as}$, the dielectric loss of the piezoelectric element that constitutes the SAW resonator 2, the electrode resistance of the SAW resonator 2 and so on exert an influence upon the q-factor of the capacitor 22 that corresponds to the capacitance of the SAW resonator 2. The piezoelectric element is typically constructed of a piezoelectric single crystal, and has a dielectric loss smaller than that of a high-permittivity dielectric substance for use in each capacitor 15. The SAW resonator 2 has an electrode resistance dependent on the design of the SAW resonator 2. For example, when the SAW resonator 2 needs a capacitance of 2 pF, by assuming that the operation frequency is 900 MHz and the electrode resistance is 1 Ω, the q-factor of the capacitor 22 is given by the following equation:

$$Q = (1\Omega \cdot 2\pi 900 \text{ MHZ} \cdot 2 \, pF)^{-1} = 88 \quad (4)$$

Thus the capacitor 22 has a q-factor nearly equal to that of each inductor 14, and this results in a loss in the SAW resonator 2. It is therefore necessary to determine the number of electrodes and the thickness of electrode films of the SAW resonator 2 such that the electrode resistance of the SAW resonator 2 becomes below a certain value.

Embodiment 2

Figure 15:
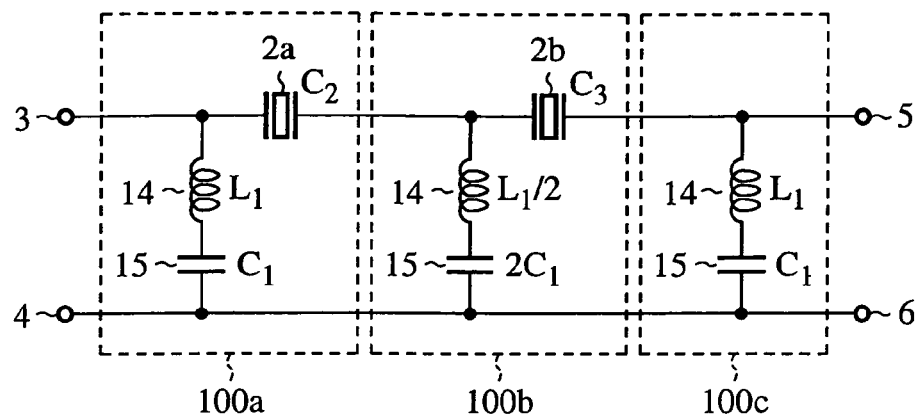
FIG. 15 is a block diagram showing the structure of filter circuitry according to embodiment 2 of the present invention.
Figure 16:
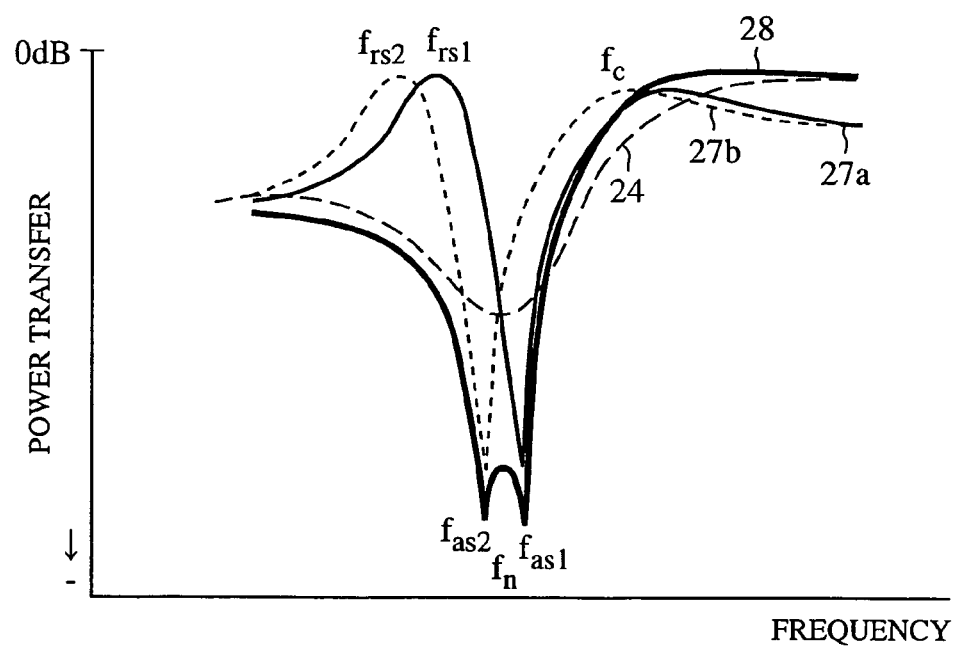
FIG. 16 is an explanatory drawing for explaining an operation of the filter circuitry as shown in FIG. 15.

FIG. 15 is a block diagram showing filter circuitry according to embodiment 2 of the present invention, and FIG. 16 is an explanatory drawing for explaining an operation of the filter circuitry of FIG. 15. In the figure, reference numeral 2a denotes a first SAW resonator, reference numeral 2b denotes a second SAW resonator, reference numeral 27a denotes a pass filter characteristic of the first SAW resonator 2a, reference numeral 27b denotes a pass filter characteristic of the second SAW resonator 2b, and reference numeral 28 denotes a pass filter characteristic of the filter circuitry of FIG. 15.

The first SAW resonator 2a has a resonance frequency of $f_{rs1}$, an antiresonance frequency of $f_{as1}$, and a capacitance of $C_2$. The second SAW resonator 2b has a resonance frequency of $f_{rs2}$ an antiresonance frequency of $f_{as2}$, and a capacitance of $C_3$. The capacitance $C_2$ of the first SAW resonator 2a is nearly equal to the capacitance $C_3$ of the second SAW resonator 2b. The antiresonance frequency $f_{rs1}$ of the first SAW resonator 2a is so set as to be higher than the antiresonance frequency $f_{as2}$ of the second SAW resonator 2b. Accordingly, the resonance frequency $f_{rs1}$ of the first SAW resonator 2a is higher than the resonance frequency $f_{rs2}$ of the second SAW resonator 2b.

One inductor 14 and one capacitor 15 included in a parallel element disposed on a side of an input terminal 3 have much the same inductance and capacitance as one inductor 14 and one capacitor 15 included in another parallel element disposed on a side of an output terminal 5, respectively. In addition, one inductor 14 included in another parallel element disposed between the first SAW resonator 2a and the second SAW resonator 2b has an inductance that is one-half ($L_1/2$) of the inductance $L_1$ of the inductor 14 disposed in the vicinity of the input terminal 3. One capacitor 15 included in the other parallel element disposed between the first SAW resonator 2a and the second SAW resonator 2b has a capacitance ($2C_1$) that is twice the capacitance $C_1$ of the capacitor 15 disposed in the vicinity of the input terminal 3. This structure as shown in FIG. 15 is equivalent to a cascade connection of two π-shaped circuits, each of which is shown in FIG. 9.

The inductance of each inductor 14, the capacitance of each capacitor 15, the capacitance $C_2$ of the first SAW resonator 2a, and the capacitance $C_3$ of the second SAW resonator 2b are determined so that the cutoff frequency $f_c$ and the frequency $f_n$ of an attenuation pole for each section 100a, which are determined by those components' values, becomes equal to those for any other section. In addition, the frequency $f_n$ of the attenuation pole is so set as to be intermediate between the antiresonance frequency $f_{as1}$ of the first SAW resonator 2a and the resonance frequency $f_{as2}$ of the second SAW resonator 2b.

Because the antiresonance frequency $f_{as1}$ of the first SAW resonator 2a is so set as to be higher than the resonance frequency $f_{as2}$ of the second SAW resonator 2b in the filter circuitry having the structure as shown in FIG. 15, the frequency $f_{as1}$ of an attenuation pole formed by the first SAW resonator 2a differs from the frequency $f_{as2}$ of an attenuation pole formed by the second SAW resonator 2b and therefore a larger amount of attenuation can be provided over a wide frequency range.

On the other hand, although a frequency difference between the cutoff frequency $f_c$ and the antiresonance frequency $f_{as1}$ of the first SAW resonator 2a differs from a frequency difference between the cutoff frequency $f_c$ and the antiresonance frequency $f_{as2}$ of the second SAW resonator 2b, the filter circuitry of FIG. 15 operates independent on the SAW resonator characteristics of the first and second SAW resonators 2a and 2b in a frequency range that is higher than the cutoff frequency $f_c$. Therefore, the filter circuitry has an excellent pass filter characteristic independent on the frequency difference between the antiresonance frequency $f_{as1}$ of the first SAW resonator 2a and the antiresonance frequency $f_{as2}$ of the second SAW resonator 2b.

However, a relationship between a frequency difference between the attenuation pole caused by the antiresonance frequency $f_{as1}$ of the first SAW resonator 2a and the attenuation pole caused by the antiresonance frequency $f_{as2}$ of the second SAW resonator 2b and an attenuation characteristic depends on the electromechanical coupling constants of piezoelectric elements for use in the first and second SAW resonators 2a and 2b.

Embodiment 3

Figure 17:
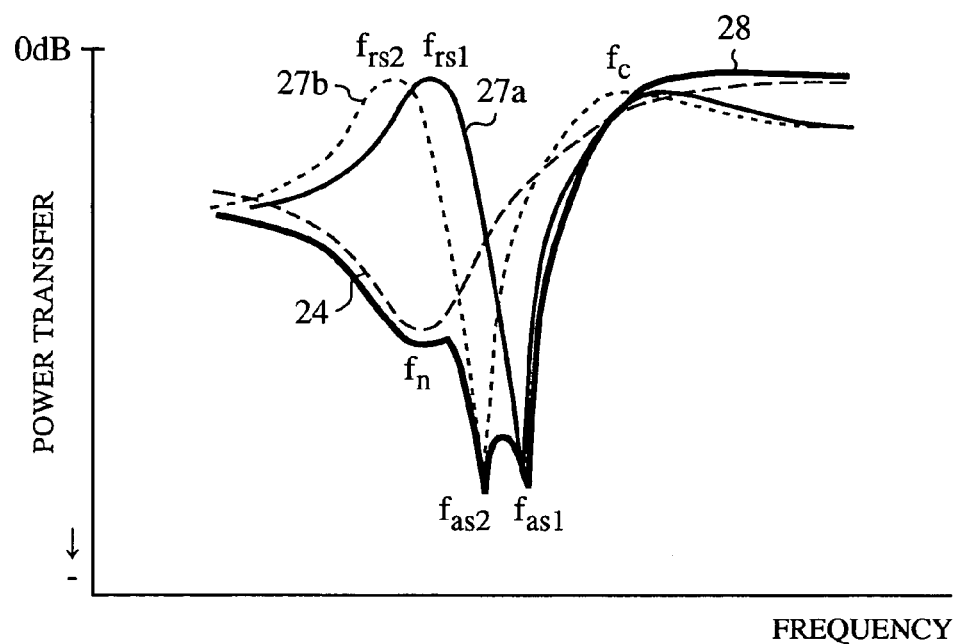
FIG. 17 is an explanatory drawing for explaining an operation of filter circuitry according to embodiment 3 of the present invention.

FIG. 17 is an explanatory drawing for explaining an operation of filter circuitry according to embodiment 3 of the present invention. The filter circuitry that operates as shown in FIG. 17 has the same structure as the filter circuitry of FIG. 15. The inductance of each inductor 14, the capacitance of each capacitor 15, the capacitance $C_2$ of a first SAW resonator 2a, and the capacitance $C_3$ of a second SAW resonator 2b are determined so that a cutoff frequency $f_c$ and a frequency $f_n$ of an attenuation pole for each section 100a, which are determined by those components' values, become equal to those for any other section, as in the case of FIG. 16. The frequency $f_n$ of the attenuation pole is so set as to be lower than the antiresonance frequency $f_{as1}$ of the first SAW resonator 2a and the antiresonance frequency $f_{as2}$ of the second SAW resonator 2b.

Because a frequency difference between the attenuation pole caused by the antiresonance frequency $f_{as1}$ of the first SAW resonator 2a and the attenuation pole caused by the antiresonance frequency $f_{as2}$ of the second SAW resonator 2b depends on the electromechanical coupling constants of piezoelectric elements for use in the first and second SAW resonators 2a and 2b, a realistic frequency difference is of the order of the product of the electromechanical coupling constant $k^2$ and these antiresonance frequencies. However, as shown in FIG. 17, by setting the frequency $f_n$ of the attenuation pole, which is determined according to the inductance of each inductor 14, the capacitance of each capacitor 15, the capacitance $C_2$ of the first SAW resonator 2a, and the capacitance $C_3$ of the second SAW resonator 2b, to be lower than the antiresonance frequency $f_{as2}$ of the second SAW resonator 2b, a large amount of attenuation can be provided over a wider frequency range. Furthermore, because the frequency $f_n$ of the attenuation pole can be set independently without any relation to the SAW resonator characteristics of the first and second SAW resonators 2a and 2b, the number of degrees of freedom of the design of the filter circuitry can be increased.

In addition, because in a frequency other than a passband or a range of frequencies close to the cutoff frequency $f_c$, the filter circuitry mainly uses the attenuation poles of the first and second SAW resonators 2a and 2b, the filter circuitry can implement a steep attenuation characteristic. Furthermore, in a frequency range that is lower than the frequency of the attenuation pole of the second SAW resonator 2b, the filter circuitry can provide a large amount of attenuation over a wider frequency range by using the attenuation pole having the frequency $f_n$, which is determined by the inductance of each inductor 14, the capacitance of each capacitor 15, the capacitance $C_2$ of the first SAW resonator 2a, and the capacitance $C_3$ of the second SAW resonator 2b. Because each inductor 14 has a small q-factor, it is difficult for the attenuation pole having the frequency $f_n$ to implement a steep attenuation characteristic in a frequency range close the cutoff frequency $f_c$. However, the filter circuitry can implement a large attenuation characteristic over a wide frequency range by enlarging the frequency difference between the frequency $f_n$ of the attenuation pole and the cutoff frequency $f_c$. Therefore, by forming an attenuation pole at a frequency position as shown in FIG. 17, the filter circuitry can solve the above-mentioned problem caused by the small q-factor of each inductor 14 and can implement an excellent attenuation characteristic.

Embodiment 4

Figure 18:
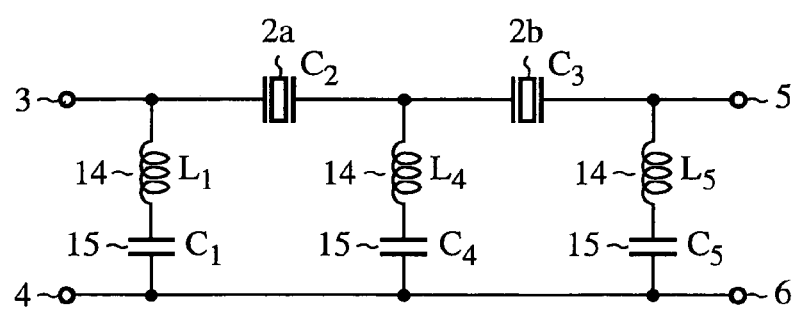
FIG. 18 is a block diagram showing filter circuitry according to embodiment 4 of the present invention.

FIG. 18 is a block diagram showing filter circuitry according to embodiment 4 of the present invention. Although the filter circuitry of FIG. 18 has the same circuit structure as the filter circuitry of FIG. 15, the inductance of each inductor 14 and the capacitance of each capacitor 15 vary from section to section.

Figure 19:
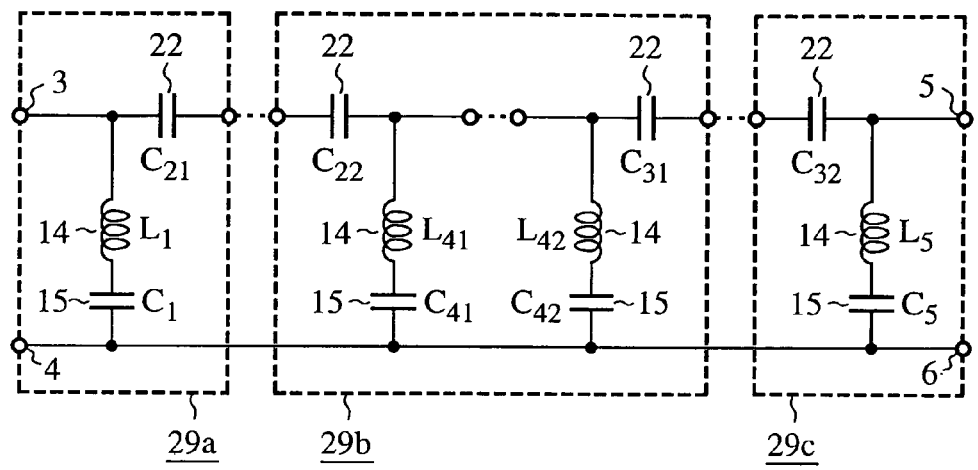
FIG. 19 is a circuit diagram for explaining an operation of the filter circuitry as shown in FIG. 18.

FIG. 19 is a circuit diagram for explaining an operation of the filter circuitry of FIG. 18. In the figure, reference numeral 29a denotes a first L-shaped circuit that consists of a part of a capacitance $C_2$ of a first SAW resonator 2a and a parallel circuit comprised of an inductor 14 and a capacitor 15 disposed in the vicinity of an input terminal 3, reference numeral 29b denotes a first T-shaped circuit that is a combination of an L-shaped circuit that consists of a part of the capacitance $C_2$ of the first SAW resonator 2a, a part of one inductor 14 located between the first and second SAW resonators 2a and 2b, and a part of one capacitor 15 located between the first and second SAW resonators 2a and 2b, and another L-shaped circuit that consists of a part of a capacitance $C_3$ of the second SAW resonator 2b, a remaining part of the inductor 14 located between the first and second SAW resonators 2a and 2b, and a remaining part of the capacitor 15 located between the first and second SAW resonators 2a and 2b, and reference numeral 29c denotes a second L-shaped circuit that consists of a remaining part of the capacitance $C_3$ of the second SAW resonator 2b and a parallel circuit comprised of an inductor 14 and a capacitor 15 disposed in the vicinity of an output terminal 5.

The values of the components included in the first L-shaped circuit, the first T-shaped circuit, and the second L-shaped circuit as shown in FIG. 19 have the following relationship with the values of the components included in the filter circuitry of FIG. 18:

$$1/C_2 = 1/C_{21} + 1/C_{22} \quad (5)$$

$$1/C_3 = 1/C_{31} + 1/C_{32} \quad (6)$$

$$C_4 = C_{41} + C_{42} \quad (7)$$

$$1/C_4 = 1/C_{41} + 1/C_{42} \quad (8)$$

When the values of the components included in the first L-shaped circuit, the first T-shaped circuit, and the second L-shaped circuit are determined so that each section such as the first L-shaped circuit, the first T-shaped circuit, or the second L-shaped circuit, has the same cutoff frequency $f_c$ and the same nominal impedance, even if the attenuation pole of each section has a frequency that varies from section to section, a cascade connection of these sections can implement a characteristic in which the pass filter characteristics of the three sections are superimposed. Such a design method of designing filter circuitry is widely known.

Figure 20:
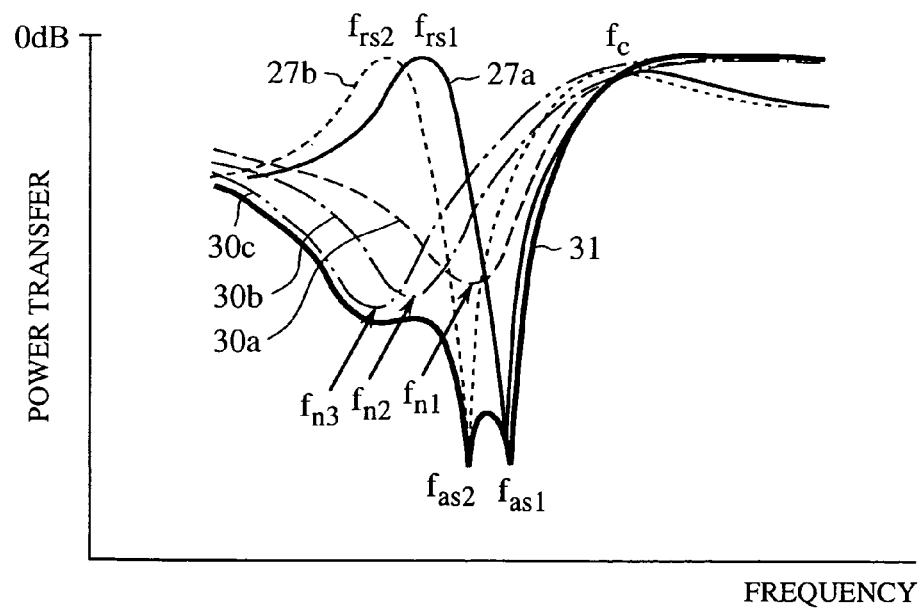
FIG. 20 is an explanatory drawing for explaining the operation of the filter circuitry as shown in FIG. 18.

FIG. 20 is an explanatory drawing for explaining an operation of the filter circuitry of FIG. 18. In the figure, reference numeral 30a denotes a pass filter characteristic of the first L-shaped circuit, reference numeral 30b denotes a pass filter characteristic of the first T-shaped circuit, reference numeral 30c denotes a pass filter characteristic of the second L-shaped circuit, and reference numeral 31 denotes a pass filter characteristic of the filter circuitry of FIG. 18.

Both the antiresonance frequency $f_{as1}$ of the first SAW resonator 2a and the antiresonance frequency $f_{as2}$ of the second SAW resonator 2b are so set as to be lower than the passband of the filter circuit, and the antiresonance frequency $f_{as1}$ of the first SAW resonator 2a is so set as to be higher than the antiresonance frequency $f_{as2}$ of the second SAW resonator 2b. In addition, the frequency $f_{n1}$ of the attenuation pole of the first L-shaped circuit, the frequency $f_{n2}$ of the attenuation pole of the first T-shaped circuit, and the frequency $f_{n3}$ of the attenuation pole of the second L-shaped circuit are so set as to be all lower than the antiresonance frequency $f_{as2}$ of the second SAW resonator 2b, and in such a manner that they differ from one another. The filter circuitry thus having such the structure can provide a large amount of attenuation over a extremely-large frequency range.

Embodiment 5

Figure 21:
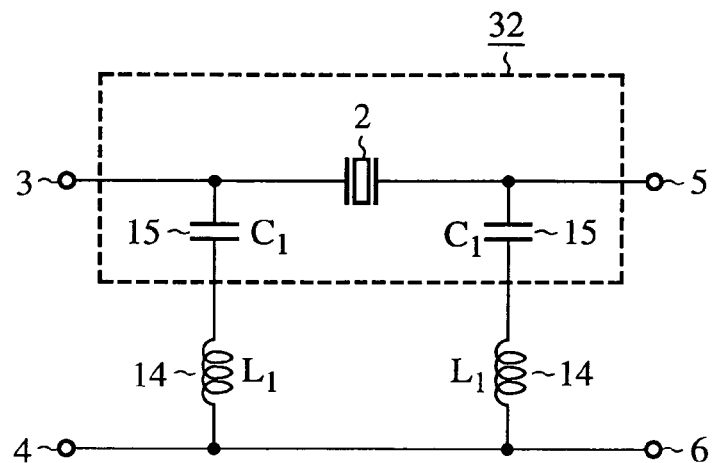
FIG. 21 is a block diagram showing filter circuitry according to embodiment 5 of the present invention.

FIG. 21 is a block diagram showing filter circuitry according to embodiment 5 of the present invention. The filter circuitry of FIG. 21 differs from that of FIG. 9 in that in each parallel element one inductor 14 and one capacitor 15 connected in series are running in order different from that in which they are running in each parallel element of FIG. 9. The filter circuitry operates in the same way that the filter circuitry as shown in FIG. 9 does. When each component included in the filter circuitry has the same value as that of FIG. 9, the filter circuitry exhibits the same characteristics as shown in FIG. 14. As shown in FIG. 21, two capacitors 15, as well as a SAW resonator 2, are formed on the same chip 32, unlike those of FIG. 9.

Figure 1:
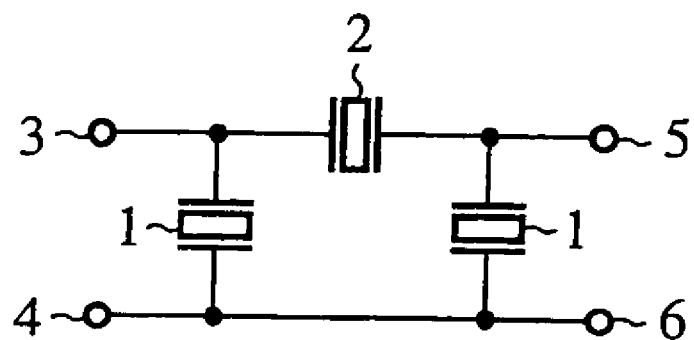
FIG. 1 is a block diagram showing prior art filter circuitry.
Figure 2:
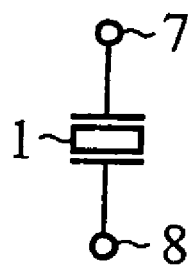
FIG. 2 is a block diagram showing a SAW resonator.
Figure 3:
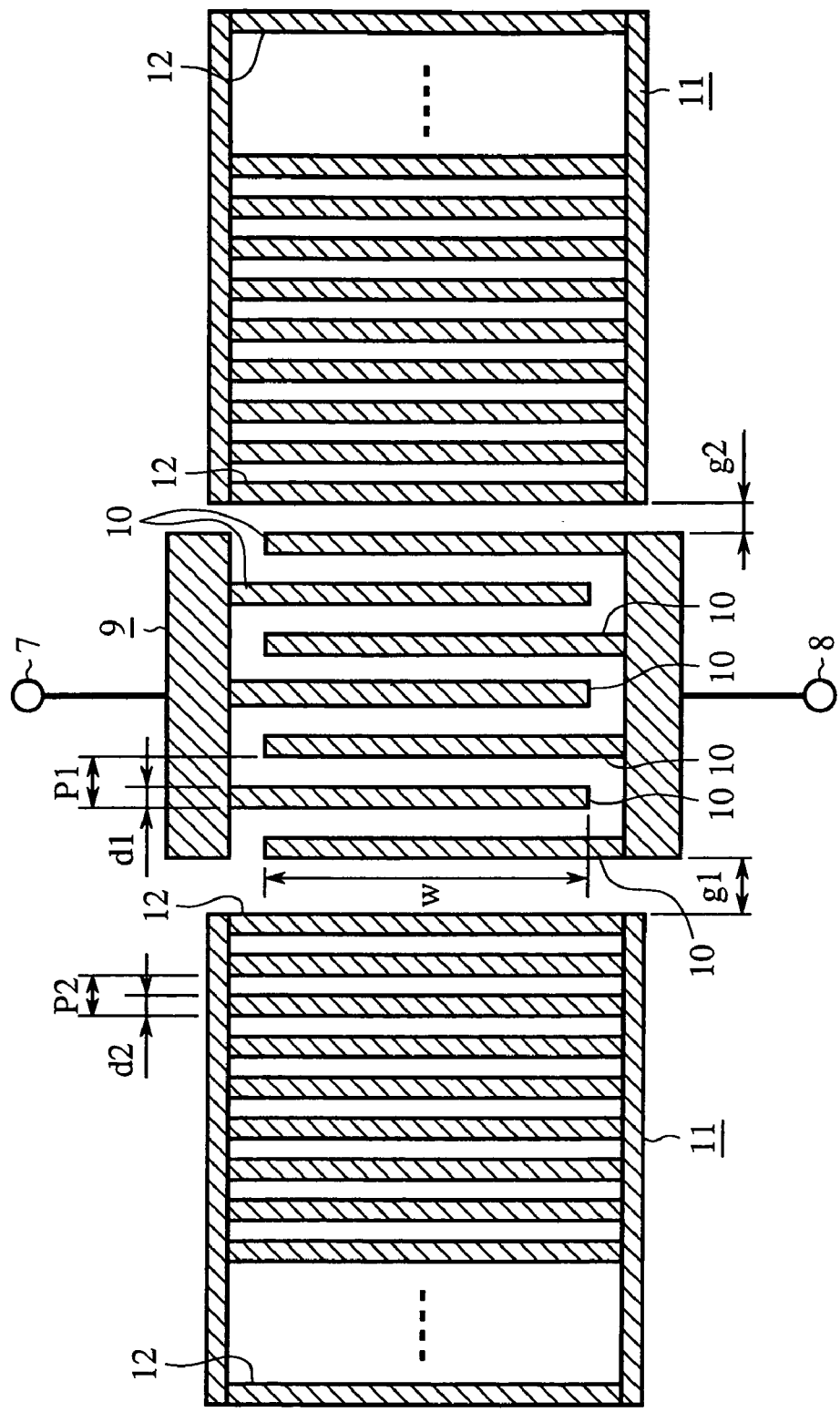
FIG. 3 is a drawing showing a concrete structure of the SAW resonator.
Figure 4:
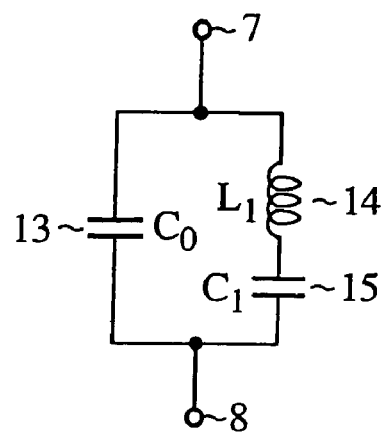
FIG. 4 is a circuit diagram showing an equivalent circuit of the SAW resonator.
Figure 6:
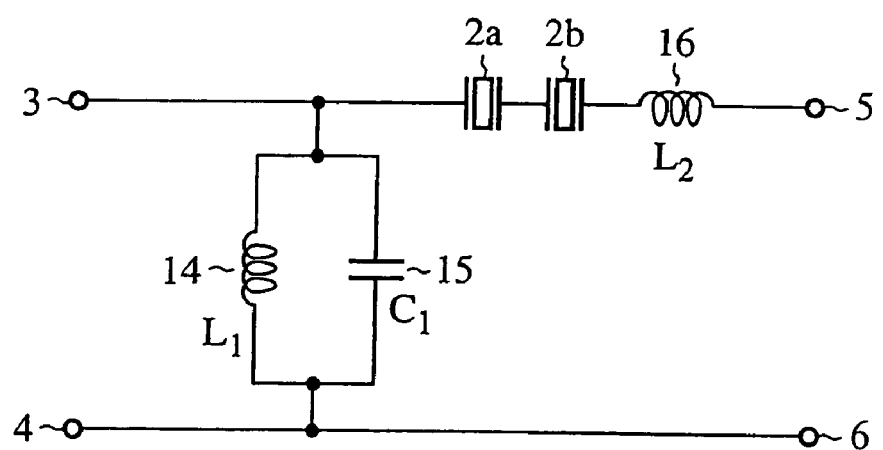
FIG. 6 is a block diagram showing other prior art filter circuitry.
Figure 5A:
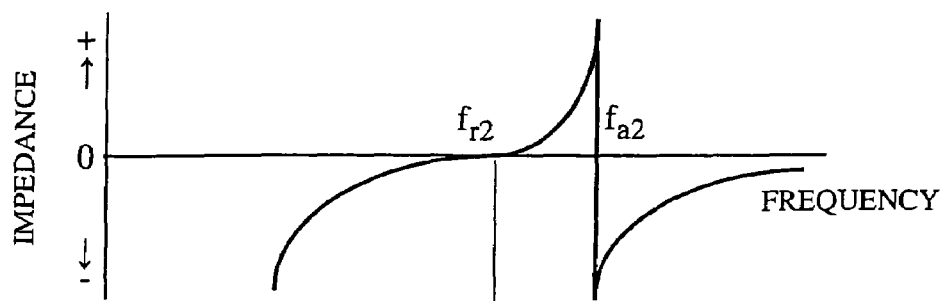
FIG. 5 is an explanatory drawing for explaining an operation of the prior art filter circuitry as shown in FIG. 1.
Figure 5B:
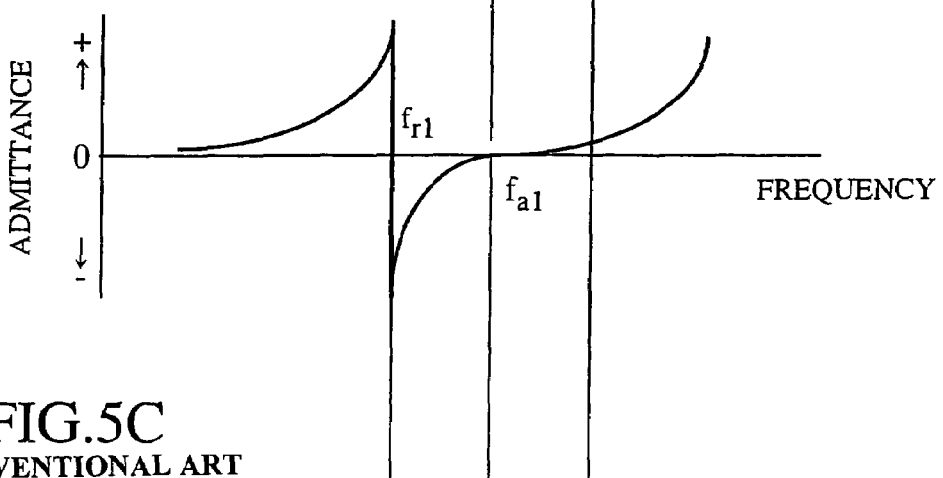
Figure 5C:
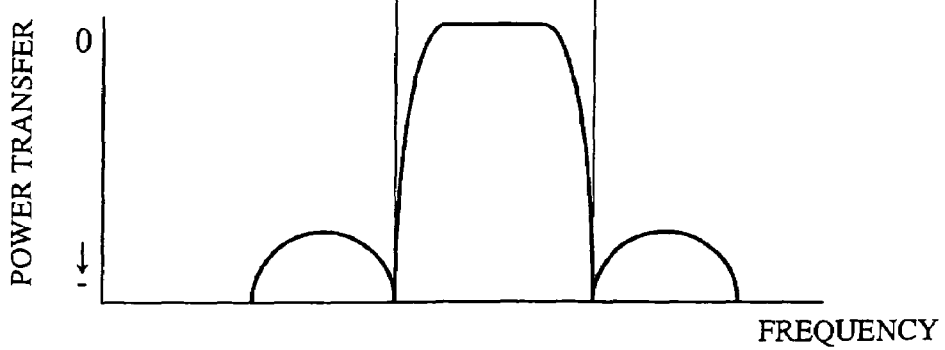
Figure 7A:
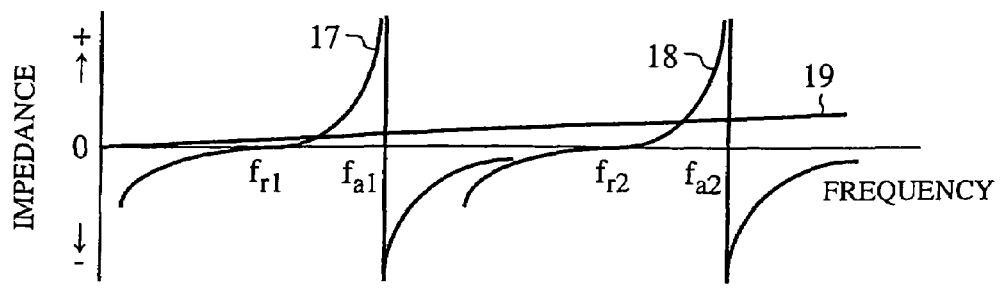
FIG. 7 is an explanatory drawing for explaining an operation of the filter circuitry as shown in FIG. 6.
Figure 7B:
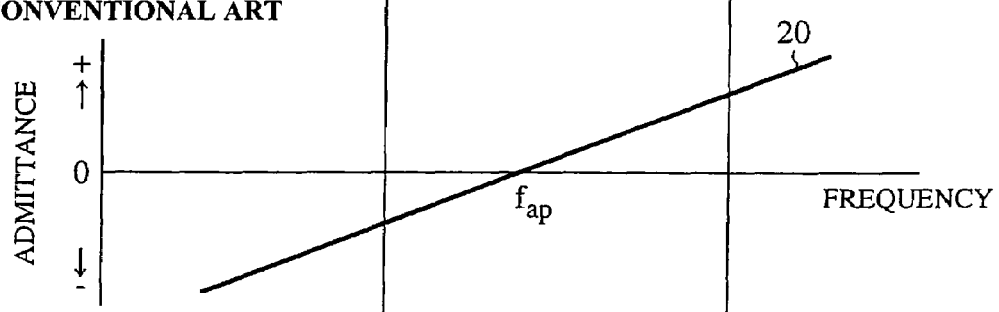
Figure 7C:
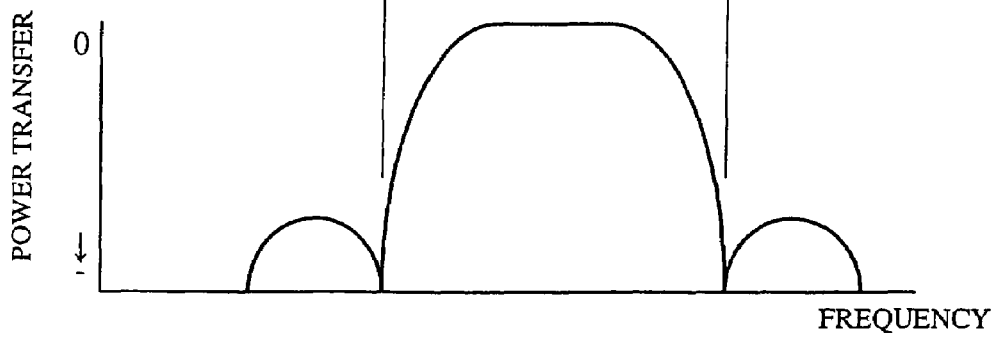
Figure 8:
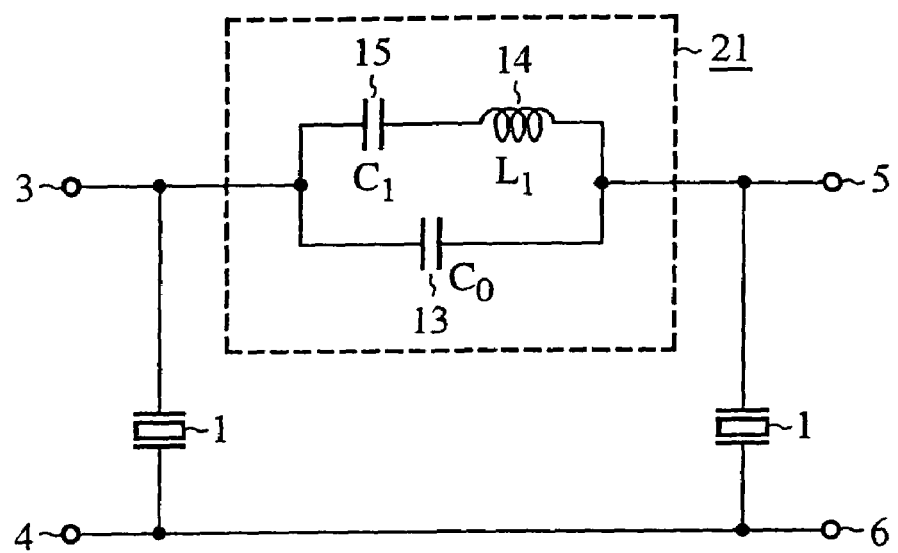
FIG. 8 is a block diagram showing other prior art filter circuitry.

A piezoelectric element for use in the SAW resonator 2 typically has a permittivity of several tens or more, and is useful as a high dielectric substrate. Furthermore, because the pattern of an IDT 9 as shown in FIG. 3 serves as a simple capacitor in a frequency range in which it doesn't excite any surface acoustic wave, the two capacitors 15 can be implemented by forming the IDT 9 such that the IDT 9 has a frequency considerably different from the antiresonance frequency of the SAW resonator 2. Then the two capacitors 15 are formed on the same piezoelectric element together with the SAW resonator 2 and the piezoelectric element on which the two capacitors 15 and the SAW resonator 2 are formed is cut out as the single chip 32, so that the SAW resonator 2 and the two capacitors 15 can be incorporated into an extremely-small area. In addition, because the pattern of such the IDT 9 is formed with great accuracy, the capacitances of the two capacitors can be determined more accurately as compared with a case where a normal chip capacitor or the like is used in each parallel element of the filter circuitry.

Embodiment 6

Figure 22:
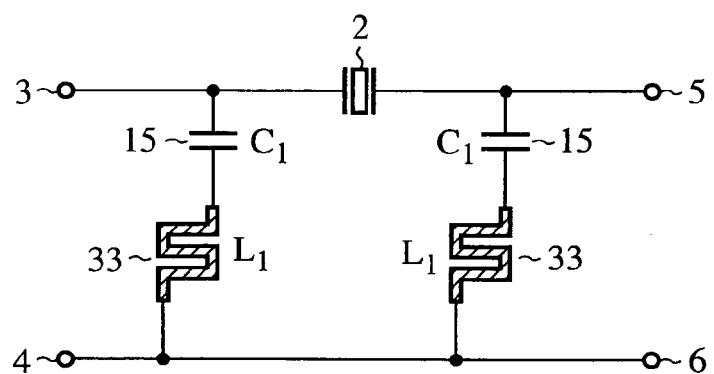
FIG. 22 is a block diagram showing filter circuitry according to embodiment 6 of the present invention.

FIG. 22 is a block diagram showing filter circuitry according to embodiment 6 of the present invention. In the figure, reference numeral 33 denotes a short stub that is a distributed constant transmission line having a grounded end. The dependent matrix of a distributed constant transmission line having a characteristic impedance Z and an electrical length θ is given by the following equation:

$$\text{DEPENDENT MATRIX} = \begin{bmatrix} \cos\theta & jz\sin \\ j\sin\theta/z & \cos\theta \end{bmatrix} \quad (9)$$

where the electrical length θ has a relationship with a wave number k and the length D of the distributed constant transmission line, which is given by the following equation:

$$\theta = kD = 2\pi D/\lambda = \omega D/c \qquad (10)$$

where λ is the wavelength of an electromagnetic wave propagating through the distributed constant transmission line, ω is an angular frequency, and c is the propagation velocity of the electromagnetic wave propagating through the distributed constant transmission line.

Because the impedance Zs of the short stub having a grounded end terminal is equal to jZ tan θ, the impedance Zs of the short stub for a small θ is approximately given by the following equation:

$$Zs = jZ \tan \theta \approx jZ\theta = jZ\omega D/c = j\omega(ZD/c) \qquad (11)$$

The equation (11) shows that such a type of the short stub serves approximately as an inductor having an inductance (ZD/c). Therefore the replacement of each inductor 14 included in the above-mentioned filter circuitry with one short stub 33 can provide the same advantage. Particularly, when the filter circuitry is formed on a dielectric substrate, for example, the distributed constant transmission line, such as a short stub, only has to be formed as a line pattern on the dielectric substrate. In addition, when the dielectric substrate is so constructed as to have a multilayered structure, the filter circuitry can be incorporated into a more complex circuit.

Embodiment 7

Figure 23:
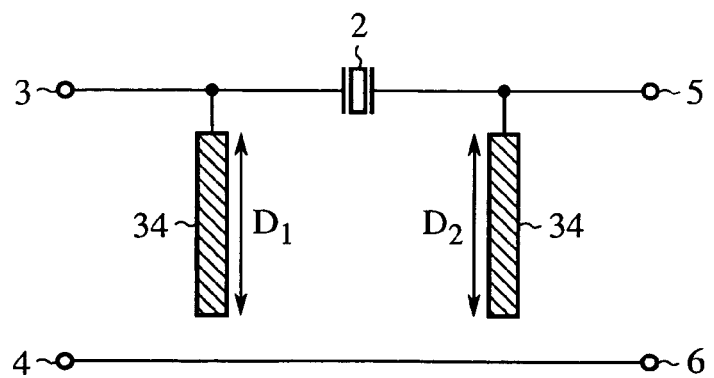
FIG. 23 is a block diagram showing filter circuitry according to embodiment 7 of the present invention.

FIG. 23 is a block diagram showing filter circuitry according to embodiment 7 of the present invention. In the figure, reference numeral 34 denotes an open stub. The open stub is a distributed constant transmission line having an open end terminal. In this case, the impedance Z0 of the open stub is given by the following equation:

$$Z_0 = -jZ \cos \theta \qquad (12)$$

When the electrical length θ is so set as to be equal to one-quarter of the wavelength of an electromagnetic wave at a frequency $f_r$, the impedance Z0 becomes 0 at the frequency $f_r$ and the polarity of the impedance Z0 changes at the frequency $f_r$. This fact shows that series resonance occurs and that an open stub 34 can be used instead of each series circuit that consists of one inductor 14 and one capacitor 15, as shown in FIG. 9. Because one end terminal of each open stub can be opened, wiring required for connection of the end terminal can be omitted when a dielectric substrate, such as a multilayered substrate, is used.

Embodiment 8

Figure 24:
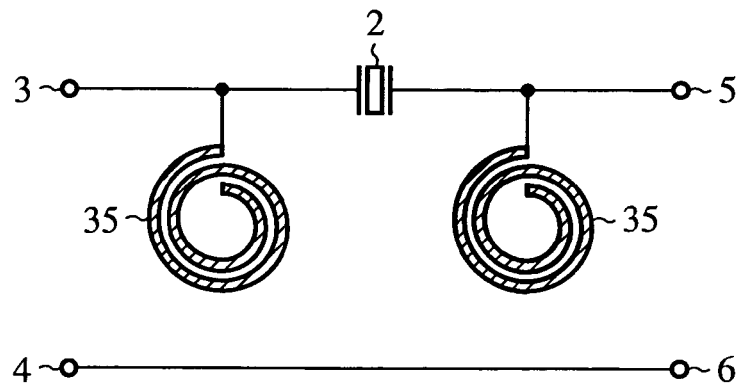
FIG. 24 is a block diagram showing filter circuitry according to embodiment 8 of the present invention.

FIG. 24 is a block diagram showing filter circuitry according to embodiment 8 of the present invention. In the figure, reference numeral 35 denotes an open stub shaped like a spiral. Each open stub 35 needs not necessarily be a straight distributed constant transmission line. In each open stub 35 that is shaped like a spiral, because magnetic fluxes generated by electromagnetic fields that propagate through concentric circular portions of the spiral open stub efficiently strengthen one another, the present embodiment offers an advantage of being able to implement the same characteristics with a smaller area as compared with the case of using a straight open stub 34 as previously mentioned.

Embodiment 9

Figure 25:
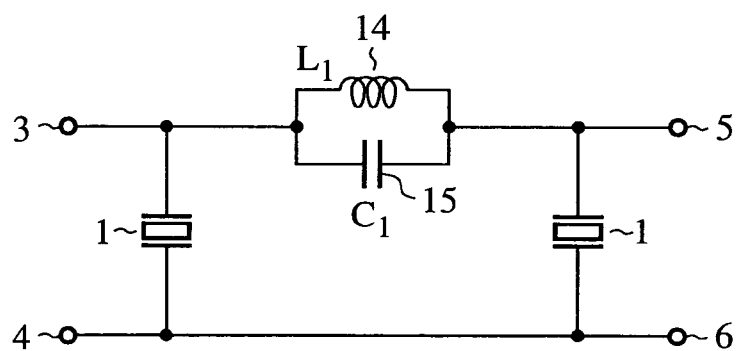
FIG. 25 is a block diagram showing filter circuitry according to embodiment 9 of the present invention.

FIG. 25 is a block diagram showing filter circuitry according to embodiment 9 of the present invention. The filter circuitry uses, as a parallel element, a SAW resonator 1, and uses, as a series element, a parallel circuit comprised of an inductor 14 and a capacitor 15.

Figure 26:
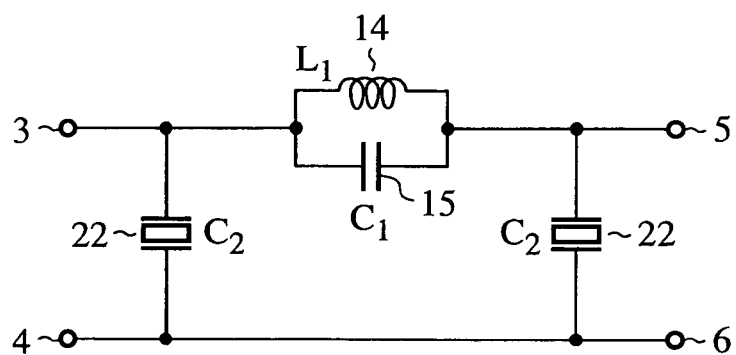
FIG. 26 is a circuit diagram showing an equivalent circuit of the filter circuitry that operates in a range of frequencies in which a SAW resonator included in the filter circuitry as shown in FIG. 25 doesn't excite any surface acoustic wave.
Figure 27:
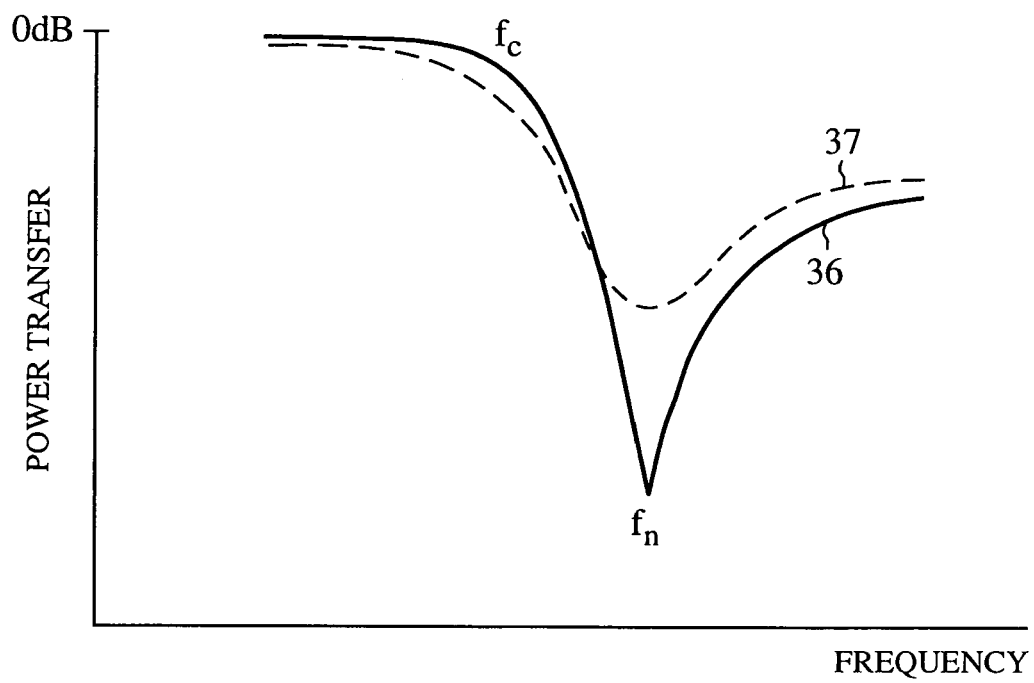
FIG. 27 is an explanatory drawing for explaining an operation of the filter circuitry as shown in FIG. 26.

FIG. 26 shows an equivalent circuit of the filter circuitry that operates in a frequency range in which the SAW resonator 1 of the filter circuitry of FIG. 25 doesn't excite any surface acoustic wave. In this equivalent circuit, it is assumed that each SAW resonator 1 is a capacitor 22 having the same capacitance $C_2$ as the electrodes thereof. FIG. 27 is an explanatory drawing for explaining an operation of the filter circuitry of FIG. 26. The series element included in the filter circuitry of FIG. 26 produces parallel resonance, i.e., antiresonance at a frequency $f_n$. At this time, the impedance of the series element that exists in a route extending from an input terminal 3 to an output terminal 5 is open-circuited, and the series element disposed between the input terminal 3 and the output terminal 5 forms an attenuation pole and has a large attenuation characteristic, as indicated by a pass filter characteristic 36.

Each of the inductor 14 and capacitor 15 included in the parallel circuit has a loss, and it is rare that the inductor 14 has a q-factor that exceeds 100 in a range of frequencies of about the order of GHz, and the inductor 14 typically has a q-factor of the order of 50 to 80. Therefore, the series element disposed between the input terminal 3 and the output terminal 5 actually exhibits an attenuation characteristic that degrades to such an extent that the attenuation pole does not show a zero point clearly, as indicated by a pass filter characteristic 37, and the loss in a passband that is lower than a cutoff frequency $f_c$ increases.

Figure 28:
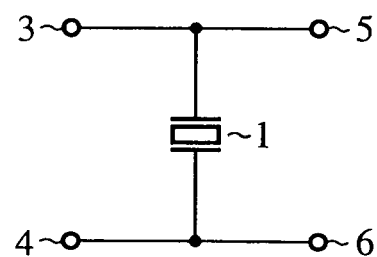
FIG. 28 is a circuit diagram of the filter circuitry including, as a parallel element, a SAW resonator.
Figure 29:
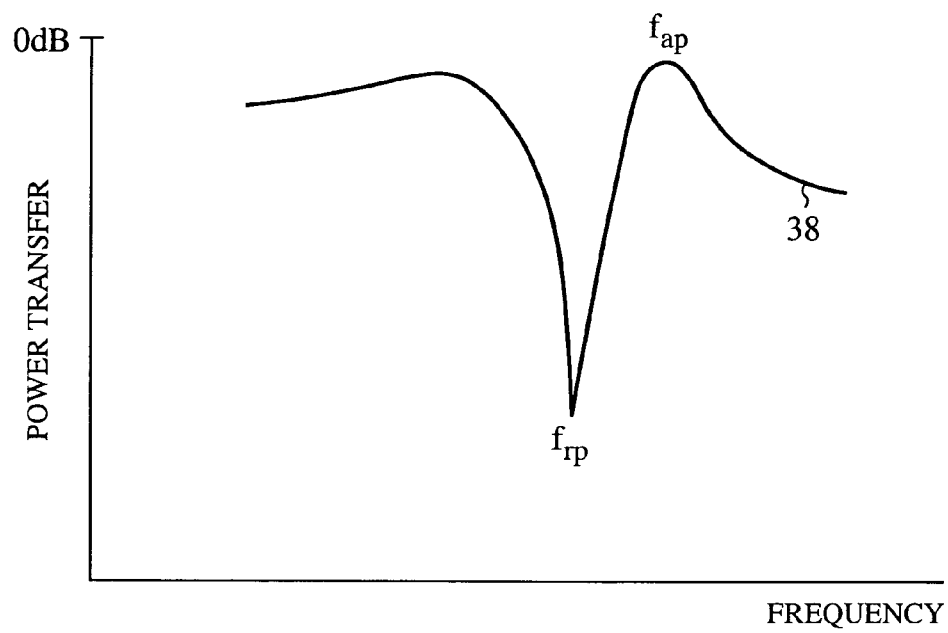
FIG. 29 is an explanatory drawing showing a pass filter characteristic of the SAW resonator as shown in FIG. 28.

FIG. 28 is a circuit diagram of a SAW resonator 1 that is disposed as a parallel element, and FIG. 29 is an explanatory drawing showing a pass filter characteristic of the SAW resonator 1 as shown in FIG. 28. In the figure, reference numeral 38 denotes the pass filter characteristic of the SAW resonator 1.

When the SAW resonator 1 is disposed as a parallel element, the SAW resonator 1 forms a large attenuation pole in the pass filter characteristic because the SAW resonator 1 becomes short-circuited at a resonance frequency $f_{rp}$ thereof. In contrast, the SAW resonator 1 becomes open-circuited at an antiresonance frequency $f_{ap}$ thereof. In this case, it is clear from the pass filter characteristic of the SAW resonator that the power passing through the filter circuitry has a minimum value.

Figure 30:
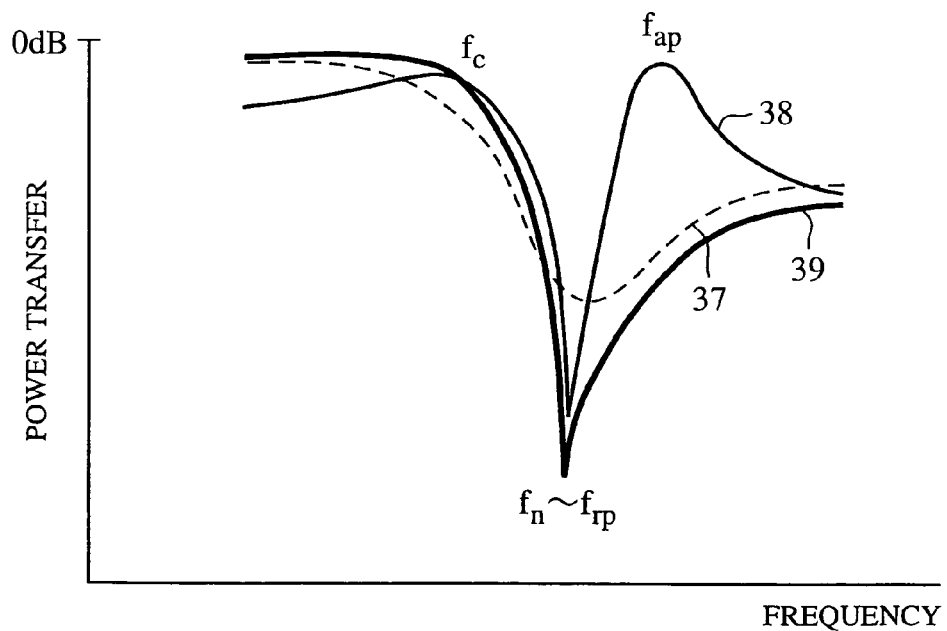
FIG. 30 is an explanatory drawing for explaining an operation of the filter circuitry as shown in FIG. 25.

FIG. 30 is an explanatory drawing showing an operation of the filter circuitry of FIG. 25. In the figure, reference numeral 39 denotes a pass filter characteristic of the filter circuitry of FIG. 25.

In the filter circuitry of FIG. 25, both the resonance frequency $f_{rp}$ of each SAW resonator 1 and the antiresonance frequency $f_n$ of the series element are so set as to be higher than the frequency cutoff $f_c$. When this setting is made, because each SAW resonator 1 operates at a frequency that is lower than the resonance frequency $f_{rp}$ in the passband of the filter circuitry, each SAW resonator 1 can be made to operate in a state in which it doesn't excite any surface acoustic wave. In a normal surface acoustic wave filter or SAW resonator that excites a surface acoustic wave in the passband, when high power is input to the filter or SAW resonator, stress-induced migration occurs along with excitation of a surface acoustic wave and electromigration occurs along with an inflow of a large current, so that a breakdown occurs in the surface acoustic wave filter or SAW resonator. In contrast, in the filter circuitry of FIG. 25, because only electromigration due to an inflow of a large current can cause a breakdown in each SAW resonator 1, the filter circuitry in accordance with embodiment 9 of the present invention has higher robustness against high power than such a prior art surface acoustic wave filter.

In addition, even though a frequency difference between the passband or the cutoff frequency $f_c$ and the resonance frequency $f_{rp}$ of each SAW resonator 1 is larger than the product of the electromechanical coupling constant $k^2$ of a piezoelectric element for use in each SAW resonator 1 and either the cutoff frequency $f_c$ or the resonance frequency $f_{rp}$ of each SAW resonator 1, an excellent filter characteristic can be implemented.

The pass filter characteristic 39 of the filter circuitry of FIG. 25 is obtained by superimposing the pass filter characteristic 37 of the filter circuitry of FIG. 26 upon the pass filter characteristic of the SAW resonator 1 as shown in FIG. 28. Although the circuit structure of the filter circuitry of FIG. 26 cannot implement a steep attenuation characteristic in the vicinity of the passband, the filter circuitry of FIG. 25 can implement an excellent attenuation characteristic with a steep attenuation pole formed in the vicinity of the resonance frequency $f_{rp}$ of each SAW resonator 1.

Embodiment 10

Figure 31:
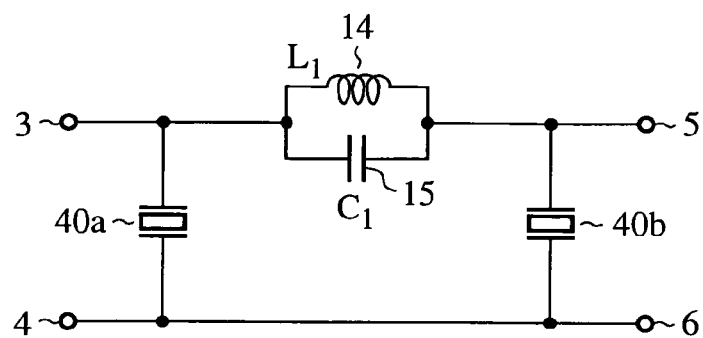
FIG. 31 is a block diagram showing filter circuitry according to embodiment 10 of the present invention.
Figure 32:
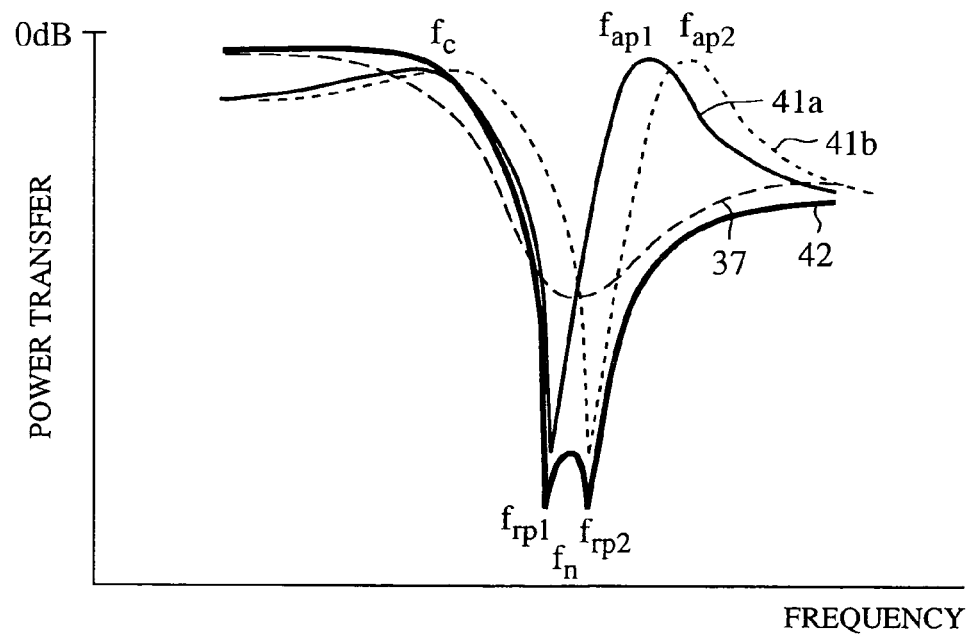
FIG. 32 is an explanatory drawing for explaining an operation of the filter circuitry as shown in FIG. 31.

FIG. 31 is a block diagram showing filter circuitry according to embodiment 10 of the present invention. FIG. 32 is an explanatory drawing for explaining an operation of the filter circuitry of FIG. 31. Although the filter circuitry of FIG. 31 has the same structure as the filter circuitry of FIG. 25, two SAW resonators 40 have resonance frequencies that are different from each other. In other words, when the first SAW resonator 40a has a resonance frequency of $f_{rp1}$, the second SAW resonator 40b has a resonance frequency of $f_{rp2}$, and a parallel circuit comprised of one inductor 14 and one capacitor 15 has an antiresonance frequency of $f_n$, $f_{rp1}$, $f_{rp2}$, and $f_n$ satisfy the following relationship with respect to a cutoff frequency $f_c$:

$$f_c < f_{rp1} < f_n < f_{rp2} \tag{13}$$

By thus making the resonance frequency $f_{rp1}$ of the first SAW resonator 40a differ from the resonance frequency $f_{rp2}$ of the second SAW resonator 40b, a frequency range in which a steep attenuation characteristic can be implemented can be made to be wider than that as shown in FIG. 30.

Embodiment 11

Figure 33:
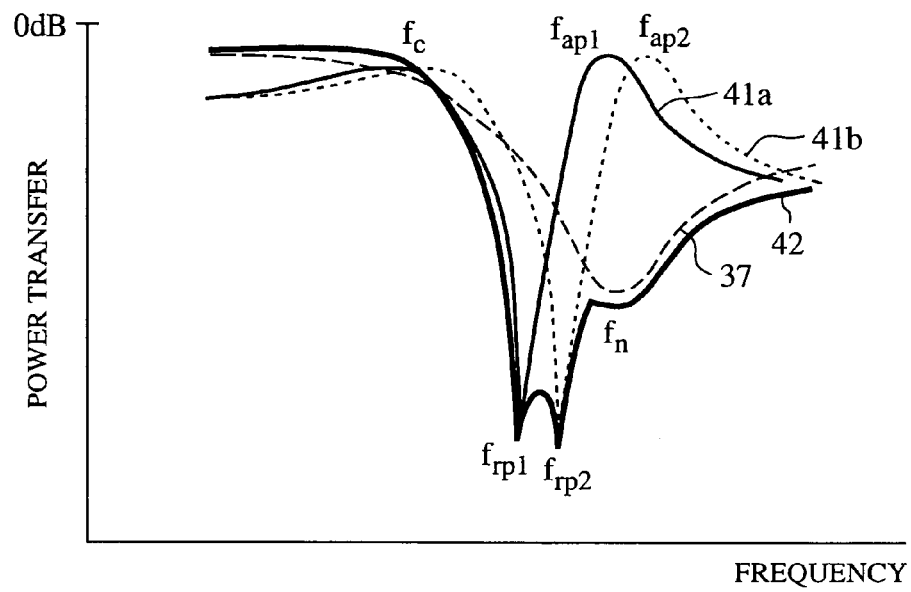
FIG. 33 is an explanatory drawing showing an operation of filter circuitry according to embodiment 11 of the present invention.

FIG. 33 is an explanatory drawing showing an operation of filter circuitry according to embodiment 11 of the present invention. The filter circuitry has the same circuit structure as the filter circuitry of FIG. 31. While the resonance frequency $f_{rp1}$ of a first SAW resonator 40a is so set as to be different from the resonance frequency $f_{rp2}$ of a second SAW resonator 40b, as in the case of FIG. 31, the antiresonance frequency $f_n$ of a parallel circuit comprised of one inductor 14 and one capacitor 15 is so set as to be higher than the resonance frequency $f_{rp1}$ of the first SAW resonator 40a and the resonance frequency $f_{rp2}$ of the second SAW resonator 40b.

When this setting of the antiresonance frequency $f_n$ of the parallel circuit is made, attenuation poles formed by the first and second SAW resonators 40a and 40b can implement a steep attenuation property of providing steep attenuation in the vicinity of a cutoff frequency $f_c$, and an attenuation pole in the vicinity of the antiresonance frequency $f_n$, which is formed by the parallel circuit comprised of the inductor 14 and the capacitor 15, can implement an attenuation characteristic in a frequency range that is higher than the frequencies of the attenuation poles formed by the first and second SAW resonators 40a and 40b. Because the attenuation pole formed by the parallel circuit comprised of the inductor 14 and the capacitor 15 can easily provide a larger attenuation over a wide frequency range as it is away from the cutoff frequency $f_c$, the filter circuitry can implement an excellent attenuation characteristic over a wider frequency range as compared with the case as shown in FIG. 32.

Embodiment 12

Figure 34:
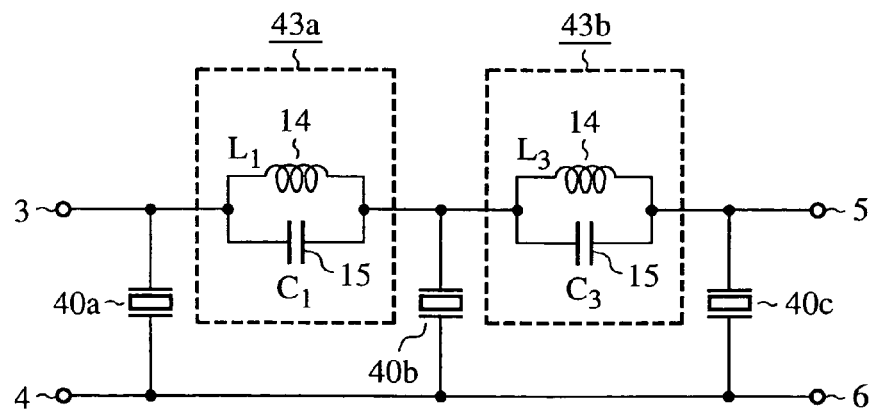
FIG. 34 is a block diagram showing filter circuitry according to embodiment 12 of the present invention.
Figure 35:
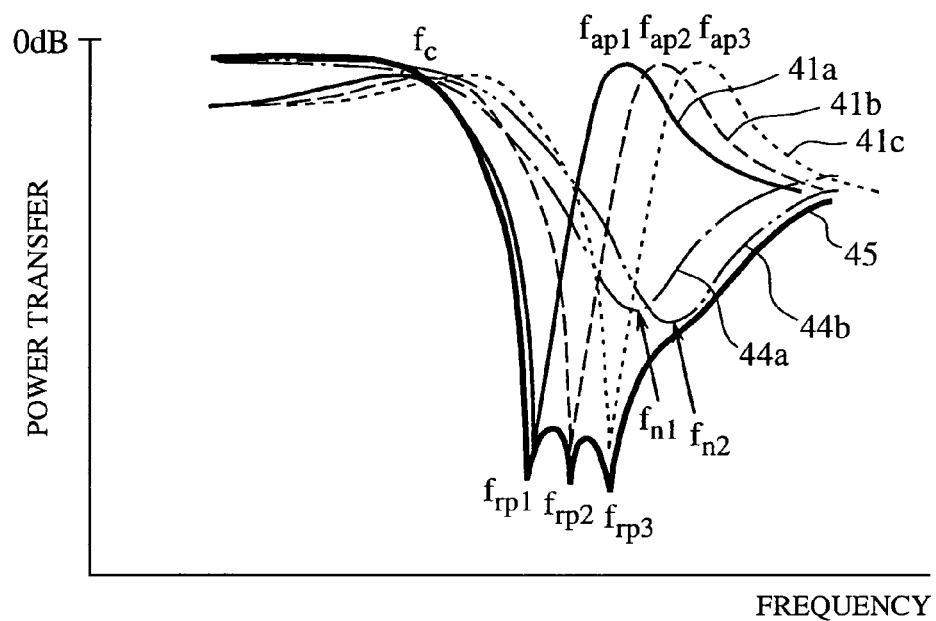
FIG. 35 is an explanatory drawing for explaining an operation of the filter circuitry as shown in FIG. 34.

FIG. 34 is a block diagram showing filter circuitry according to embodiment 12 of the present invention. The filter circuitry includes a second series element 43b and a third SAW resonator 40c in addition to the structure of the filter circuitry of FIG. 31. FIG. 35 is an explanatory drawing showing an operation of the filter circuitry of FIG. 34. In the figure, reference numeral 45 denotes a pass filter characteristic of the filter circuitry of FIG. 34.

It is assumed that an equivalent circuit that is produced based on the filter circuitry of FIG. 34 and that operates in a frequency range in which each SAW resonator doesn't excite any surface acoustic wave is divided into a plurality of L-shaped circuits, as in the case of the filter circuitry of FIG. 19, a π-shaped circuit including a first series element 43a has a pass filter characteristic 44a and forms an attenuation pole having a frequency of $f_{n1}$, and a π-shaped circuit including the second series element 43b has a pass filter characteristic 44b and forms an attenuation pole having a frequency of $f_{n2}$. By establishing the following relationship among the resonance frequency $f_{rp1}$ of a first SAW resonator 40a, the resonance frequency $f_{rp2}$ of a second SAW resonator 40b, and the resonance frequency $f_{rp3}$ of the third SAW resonator 40c, an excellent attenuation characteristic can be implemented over an extremely-wide frequency range.

$$f_c < f_{rp1} < f_{rp2} < f_{rp3} < f_{n1} < f_{n2} \tag{14}$$

Embodiment 13

Figure 36:
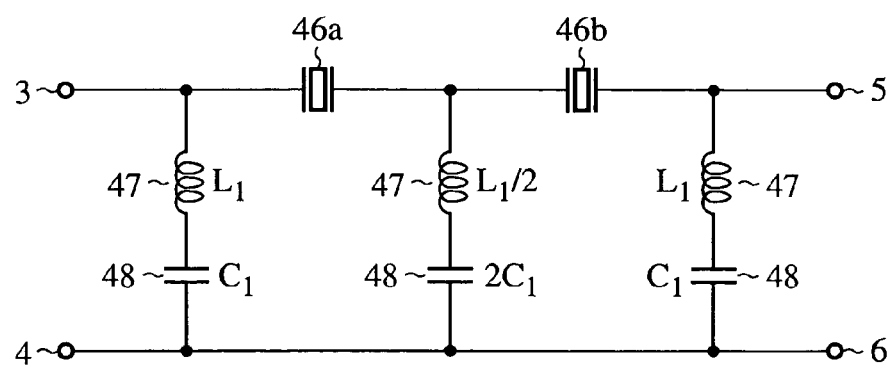
FIG. 36 is a block diagram showing filter circuitry according to embodiment 13 of the present invention.
Figure 37:
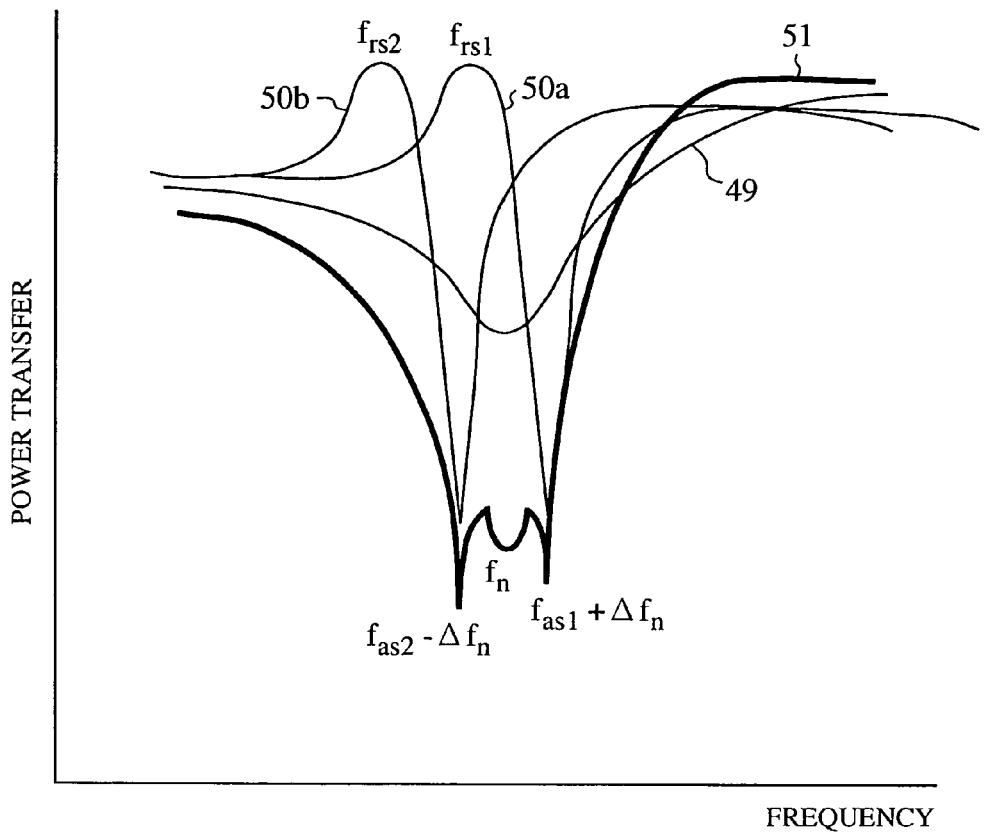
FIG. 37 is an explanatory drawing for explaining an operation of the filter circuitry as shown in FIG. 36.

FIG. 36 is a block diagram showing filter circuitry according to embodiment 13 of the present invention, and FIG. 37 is a diagram for explaining an operation of the filter circuitry of FIG. 36. In the figures, reference numeral 46a denotes a first SAW resonator, reference numeral 46b denotes a second SAW resonator, reference numeral 47 denotes an inductor, reference numeral 48 denotes a capacitor, reference numeral 49 denotes a pass filter characteristic of a series resonance circuit, reference numeral 50a denotes a pass filter characteristic of the first SAW resonator 46a, reference numeral 50b denotes a pass filter characteristic of the second SAW resonator 46b, and reference numeral 51 denotes a pass filter characteristic of the filter circuitry of FIG. 36.

The first SAW resonator 46a has a resonance frequency of $f_{rs1}$, an antiresonance frequency of $f_{as1}$ and a capacitance of $C_2$. The second SAW resonator 46b has a resonance frequency of $f_{rs2}$ an antiresonance frequency of $f_{as2}$, and a capacitance of $C_3$. The capacitance $C_2$ of the first SAW resonator 46a is nearly equal to the capacitance $C_3$ of the second SAW resonator 46b. The antiresonance frequency $f_{as1}$ of the first SAW resonator 46a is so set as to be higher than the antiresonance frequency $f_{as2}$ of the second SAW resonator 46b. Accordingly, the resonance frequency $f_{rs1}$ of the first SAW resonator 46a is higher than the resonance frequency $f_{rs2}$ of the second SAW resonator 46b.

One inductor 47 and one capacitor 48 included in a parallel element disposed in the vicinity of an input terminal 3 have the same inductance and capacitance as one inductor 47 and one capacitor 48 included in another parallel element disposed in the vicinity of an output terminal 5, respectively. In addition, one inductor 47 included in another parallel element disposed between the first SAW resonator 46a and the second SAW resonator 46b has an inductance that is one-half of the inductance $L_1$ of the inductor 47 disposed in the vicinity of the input terminal 3. One capacitor 48 included in the other parallel element disposed between the first SAW resonator 46a and the second SAW resonator 46b has a capacitance that is twice the capacitance $C_1$ of the capacitor 48 disposed in the vicinity of the input terminal 3.

The inductance of each inductor 47, the capacitance of each capacitor 48, the capacitance $C_2$ of the first SAW resonator 46a, and the capacitance $C_3$ of the second SAW resonator 46b are determined so that a cutoff frequency $f_c$ and the frequency $f_n$ of an attenuation pole for each section 100a, which are determined by those components' values, becomes equal to those for any other section.

The frequency $f_n$ of the attenuation pole changes with change in the inductance of each inductor 47 and the capacitance of each capacitor 48. When a chip including one inductor 47 and one capacitor 48 is used as each parallel element, each of the inductance of the inductor 47 and the capacitance of the capacitor 48 has an error of ± several % or less. Therefore, the frequency $f_n$ of the attenuation pole changes due to such components which constitute the filter circuitry. The frequency $f_n$ of the attenuation pole cannot be set to be a desired frequency, and becomes higher than the antiresonance frequency $f_{as1}$ of the first SAW resonator 46a. As an alternative, the frequency $f_n$ of the attenuation pole becomes lower than the antiresonance frequency $f_{as2}$ of the second SAW resonator 46b. In this case, the filter circuitry may not implement an adequate attenuation characteristic.

In order to solve the above-mentioned problem, the antiresonance frequency $f_{as1}$ of the first SAW resonator 46a is so set as to be higher than a desired frequency by a change in the frequency $f_n$ of the attenuation pole, which is caused by both a variation of the inductance of each inductor 47 and a variation of the capacitance of each capacitor 48, and the antiresonance frequency $f_{as2}$ of the second SAW resonator 46b is so set as to be lower than a desired frequency by a change in the frequency $f_n$ of the attenuation pole, which is caused by both a variation of the inductance of each inductor 47 and a variation of the capacitance of each capacitor 48.

In other words, when the frequency $f_n$ of the attenuation pole, which is determined by the inductance of each inductor 47, the capacitance of each capacitor 48, the capacitance $C_2$ of the first SAW resonator 46a, and the capacitance $C_3$ of the second SAW resonator 46b, has a change $\Delta f_n$ that is caused by variations of the component values of each inductor 47 and each capacitor 48, the antiresonance frequency $f_{as1}$ of the first SAW resonator 46a and the antiresonance frequency $f_{as2}$ of the second SAW resonator 46b are so set that the following relationship is established:

$$f_{as2} - \Delta f_n < f_n, f_{as1} + \Delta f_n \quad (15)$$

By setting both the antiresonance frequency $f_{as1}$ of the first SAW resonator 46a and the antiresonance frequency $f_{as2}$ of the second SAW resonator 46b so that they satisfy the above-mentioned relationship, because the frequency $f_n$ of the attenuation pole, which is determined by the inductance of each inductor 47, the capacitance of each capacitor 48, the capacitance $C_2$ of the first SAW resonator 46a, and the capacitance $C_3$ of the second SAW resonator 46b, is intermediate between the antiresonance frequency $f_{as1}$ of the first SAW resonator 46a and the antiresonance frequency $f_{as2}$ of the second SAW resonator 46b even if the component values of each inductor 47 and each capacitor 48 have variations, the filter circuitry can implement an excellent attenuation characteristic.

Embodiment 14

Figure 38:
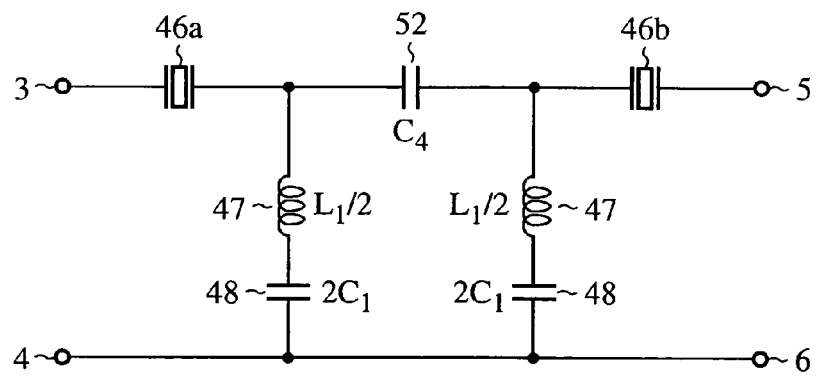
FIG. 38 is a block diagram showing filter circuitry according to embodiment 14 of the present invention.

FIG. 38 is a block diagram showing filter circuitry according to embodiment 14 of the present invention. In the figure, reference numeral 52 denotes a capacitor.

A first SAW resonator 46a has an antiresonance frequency of $f_{as1}$ and a capacitance of $C_2$, and a second SAW resonator 46b has an antiresonance frequency of $f_{as2}$ and a capacitance of $C_3$. The capacitance $C_2$ of the first SAW resonator 46a is so set as to be nearly equal to the capacitance $C_3$ of the second SAW resonator 46b. The capacitor 52 has a capacitance of $C_4$, each inductor 47 has an inductance of $L_1/2$, and each capacitor 48 has a capacitance of $2C_1$.

The structure as shown in FIG. 38 is equivalent to the one in which a π-shaped circuit, as shown in FIG. 9, including, as a series element, the SAW resonators 46a and 46b, and, as parallel elements, two series resonance circuits each comprised of one inductor 47 and one capacitor 48 is replaced by a cascade of two T-shaped circuits each comprised of two SAW resonators and a series resonance circuit having one inductor 47 and one capacitor 48, and at least one of the SAW resonators, each of which is a series element, is replaced by a capacitor.

Figure 39:
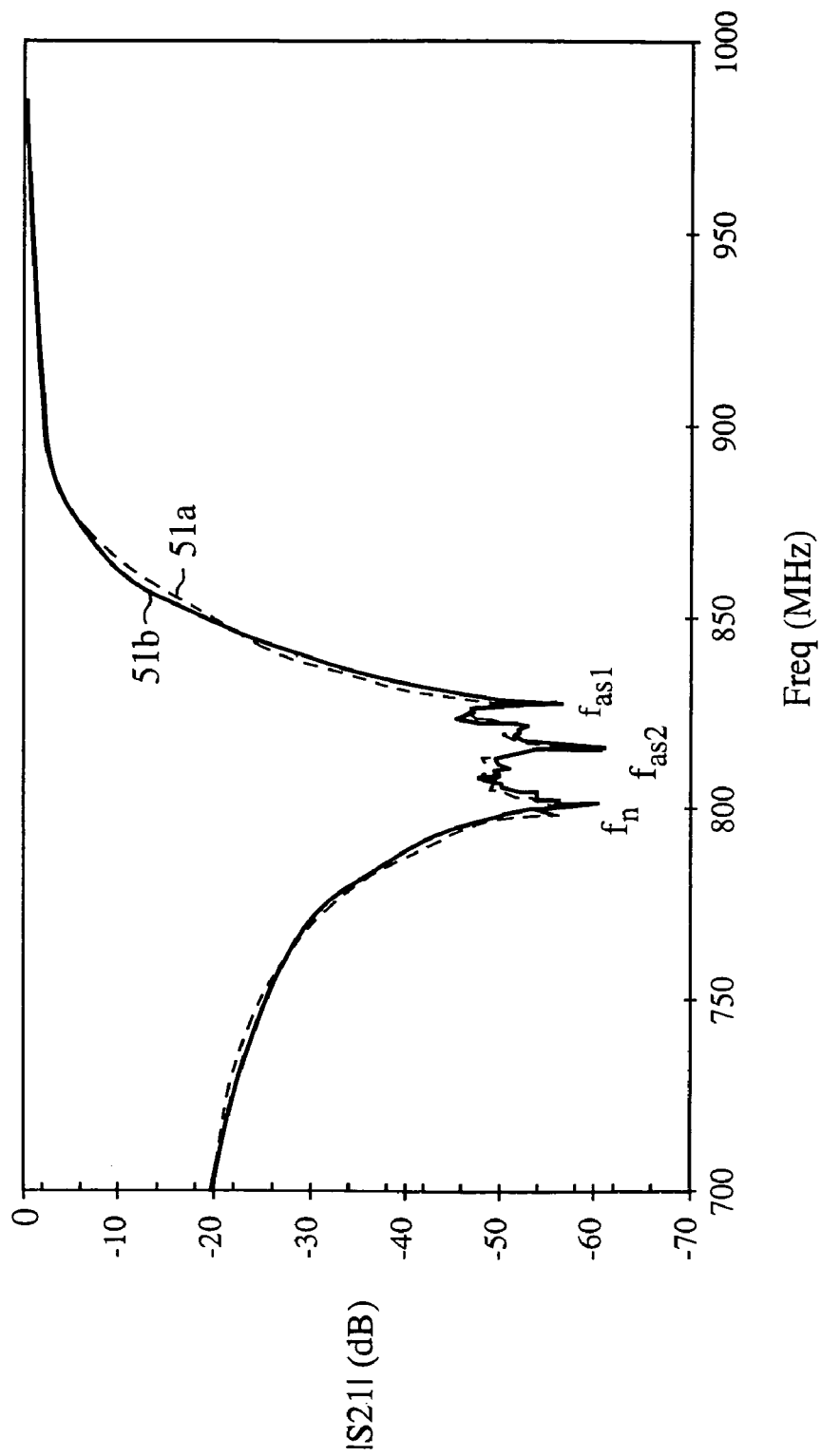
FIG. 39 is an explanatory drawing showing a result of measurement of a pass filter characteristic of the filter circuitry as shown in FIG. 38.
Figure 40:
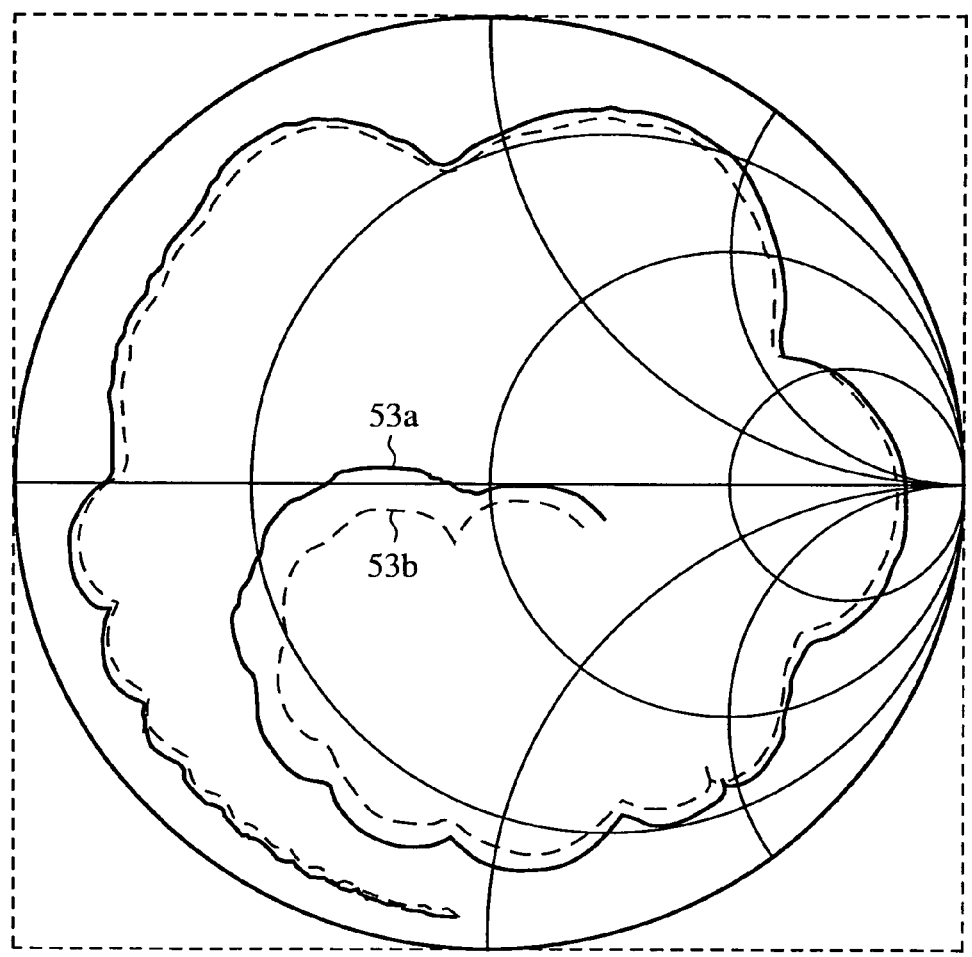
FIG. 40 is an explanatory drawing showing a result of measurement of an impedance characteristic of the filter circuitry as shown in FIG. 38.

FIG. 39 shows an experimental result of the pass filter characteristic of the filter circuitry of FIG. 38 which is actually manufactured, and FIG. 40 shows an experimental result of the impedance characteristic of the filter circuitry of FIG. 38. In the figure, reference numeral 51a shows an experimental result of the pass filter characteristic of the filter circuitry when $L_1/2=24$ nH, $2C_1=24$ pF, and $C_4=1.8$ pF, reference numeral 53a shows an experimental result of the impedance characteristic of the filter circuitry when $L_1/2=24$ nH, $2C_1=24$ pF, and $C_4=1.8$ pF, reference numeral 51b shows an experimental result of the pass filter characteristic of the filter circuitry when $L_1/2=24$ nH, $2C_1=24$ pF, and $C_4=2.0$ pF, and reference numeral 53b shows an experimental result of the impedance characteristic of the filter circuitry when $L_1/2=24$ nH, $2C_1=24$ pF, and $C_4=2.0$ pF.

The filter circuitry of FIG. 38 exhibits a filter characteristic similar to that of the filter circuitry shown in FIG. 36, and can implement an excellent attenuation characteristic over a wide frequency range and an excellent pass filter characteristic.

Furthermore, in the filter circuitry of FIG. 38, the capacitor 52 is made to operate as a matching circuit because the impedance characteristic thereof changes with change in the capacitance $C_4$ thereof. Therefore, the degradation in the characteristics of the filter circuitry due to errors of the component values of the two inductors 47 and the two capacitors 48 can be prevented.

Embodiment 15

Figure 41:
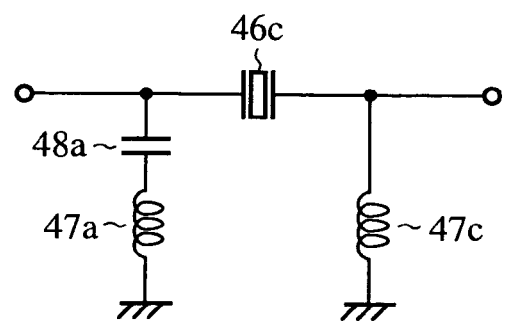
FIG. 41 is a block diagram showing filter circuitry according to embodiment 15 of the present invention.

FIG. 41 is a diagram showing filter circuitry according to embodiment 15 of the present invention. In the figure, reference numeral 46c denotes a surface acoustic wave device, which is used as a series element, reference numeral 47a denotes an inductor, reference numeral 48a denotes a capacitor, the inductor 47a and the capacitor 48a forming a series resonance circuit (referred to a series resonance circuit A from here on), which is a parallel element of the filter circuitry, and reference numeral 47c denotes an inductor connected in parallel with the parallel element.

Figure 42:
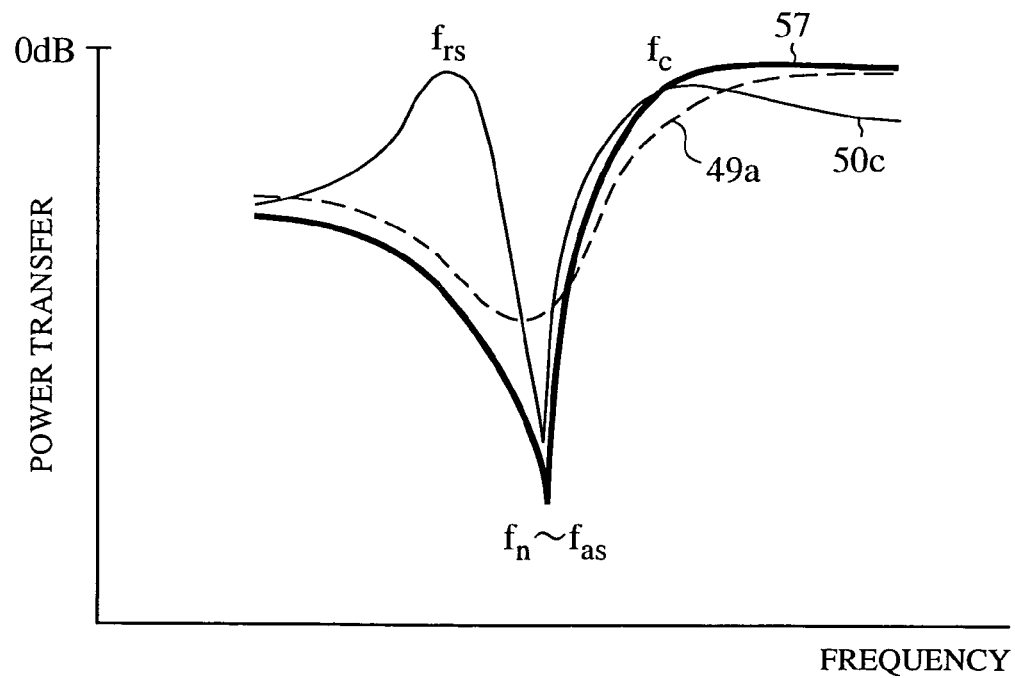
FIG. 42 is an explanatory drawing for explaining an operation of the filter circuitry as shown in FIG. 41.

FIG. 42 is a diagram for explaining an operation of the filter circuitry as shown in FIG. 41. In the figure, reference numeral 50c denotes a pass filter characteristic of the surface acoustic wave device 46c, reference numeral 49a denotes a pass filter characteristic of the series resonance circuit A, and reference numeral 57 denotes a pass filter characteristic of the filter circuitry of FIG. 41.

The surface acoustic wave device 46c has a very steep attenuation characteristic at a frequency $f_{as}$, as indicated by the pass filter characteristic 50c of FIG. 42. However, it is difficult for the filter circuitry to provide a large attenuation over a wide frequency band though the filter circuitry has a steep attenuation characteristic.

On the other hand, the series resonance circuit A comprised of the inductor 47a and the capacitor 48a becomes nearly-short-circuited at a frequency $f_n$ at which the series resonance circuit A produces series resonance, and therefore reflects most of a received high frequency signal. The series resonance circuit A thus has a pass filtering property of greatly attenuating the input signal, as indicated by the pass filter characteristic 49a of FIG. 42. However, in a frequency range from 800 MHz to about 2 GHz, which is used for mobile communications, the inductor 47a has an inductance smaller than 100 nH in most cases, and it is therefore rare that the q-factor of the inductor 47a having such an inductance exceeds at most 100. On the other hand, in the frequency range that is used for mobile communications, the capacitor 48a has a capacitance smaller than 100 pF in most cases, and the q-factor of the capacitor 48a having such a capacitance is of the order of about several hundreds. Therefore, the q-factor of the inductor 47a has a predominant position in the series resonance circuit A. Because the q-factor of the inductor 47a is of the order, at most, of about 100, and is smaller than the q-factor of the surface acoustic wave device 1, the attenuation characteristic of the series resonance circuit A is not so steep, as indicated by the pass filter characteristic 49a.

Then, when the surface acoustic wave device 46c is combined with the series resonance circuit A, as shown in FIG. 41, a large attenuation property of providing a large attenuation over a wide band including the frequency $f_n$ and a steep attenuation characteristic caused by the surface acoustic wave device 46c can be implemented.

Figure 43:
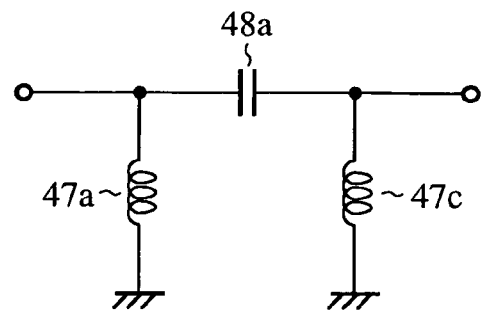
FIG. 43 is a circuit diagram showing an equivalent circuit of the filter circuitry that operates in a range of frequencies in which a SAW resonator included in the filter circuitry doesn't excite any surface acoustic wave.

Furthermore, the inductor 47c serves as impedance matching for the passband. In a frequency range that is higher than the attenuation band, the surface acoustic wave device 46c has a capacitive property and serves as a capacitor. On the other hand, because in the series resonance circuit A the impedance (jωL) of the inductor 47a increases and the impedance (1/jωC) of the capacitor 48a decreases in a frequency band that is higher than the attenuation band, the series resonance circuit A exhibits an inductivity characteristic as a whole and serves as an inductor. Therefore, in a frequency band close to the passband, which is higher than the attenuation band, the filter circuitry of FIG. 41 becomes equivalent to that as shown in FIG. 43 and has a general wide-band pass filtering structure. Then, when the component values of the surface acoustic wave device 46c, the series resonance circuit, and the inductor 47a are selected so that impedance matching is established in a desired frequency range which the filter circuitry can transmit, a low-loss wide-band pass filter characteristic can be implemented.

As mentioned above, the filter circuitry having the structure as shown in FIG. 41 can implement the filtering property of being able to provide a low-loss wide passband and providing a large attenuation over a wide frequency band, even if the passband is separated far apart from the attenuation band.

Embodiment 16

Figure 44:
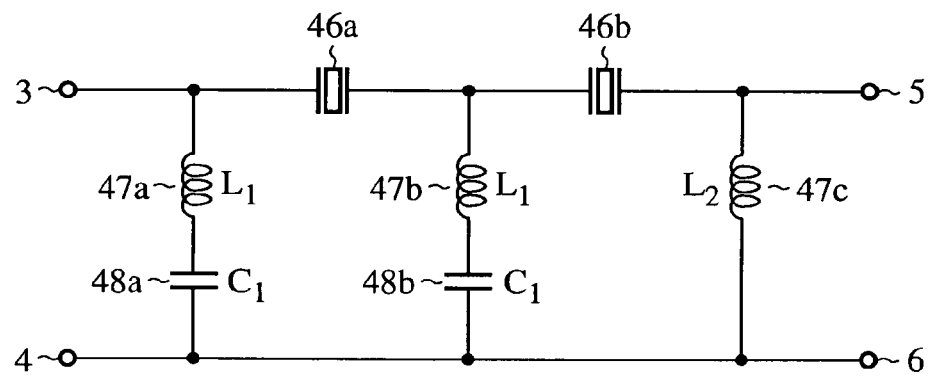
FIG. 44 is a block diagram showing filter circuitry according to embodiment 16 of the present invention.

FIG. 44 is a block diagram showing filter circuitry according to embodiment 16 of the present invention. In the figure, reference numeral 47b denotes an inductor, and reference numeral 48b denotes a capacitor.

A first SAW resonator 46a has a resonance frequency of $f_{rs1}$, an antiresonance frequency of $f_{as1}$, and a capacitance of $C_2$, and a second SAW resonator 46b has a resonance frequency of $f_{rs2}$, an antiresonance frequency of $f_{as2}$, and a capacitance of $C_3$.

Figure 45:
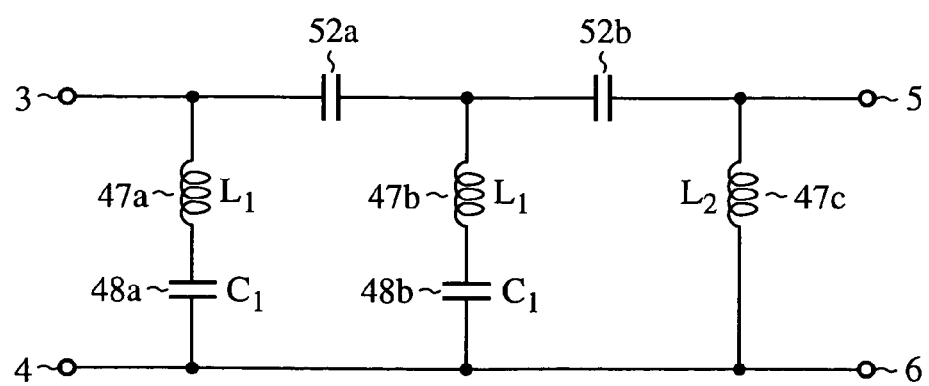
FIG. 45 is a circuit diagram showing an equivalent circuit of the filter circuitry that operates in a range of frequencies in which a SAW resonator included in the filter circuitry doesn't excite any surface acoustic wave.

FIG. 45 is a circuit diagram showing an equivalent circuit of the filter circuitry, which operates in a frequency range in which the first and second SAW resonators 46a and 46b don't excite any surface acoustic wave, i.e., in a range of frequencies lower than a resonance frequency $f_{rs2}$ of the second SAW resonator 46b or a range of frequencies higher than an antiresonance frequency $f_{as1}$ of the first SAW resonator 46a. The first SAW resonator 46a serves as a capacitor having a capacitance of $C_2$ at any frequency within the frequency range in which it doesn't excite any surface acoustic wave, and the second SAW resonator 46b serves as a capacitor having a capacitance of $C_3$ at any frequency within the frequency range in which it doesn't excite any surface acoustic wave.

Therefore, in the frequency range that it doesn't excite any surface acoustic wave, the equivalent circuit can be assumed to be comprised of a first L-shaped circuit including a parallel element that consists of an inductor 47a and a capacitor 48a and a series element that consists of a capacitor 52a, a T-shaped circuit including a parallel element that consists of an inductor 47b and a capacitor 48b and a series element that consists of the capacitor 52a and another capacitor 52b, and a second L-shaped circuit including a parallel element that consists of an inductor 47c and a series element that consists of the capacitor 52b. The combination of the first L-shaped circuit, the T-shaped circuit, and the second L-shaped circuit exhibits a high-pass filter characteristic.

Figure 46:
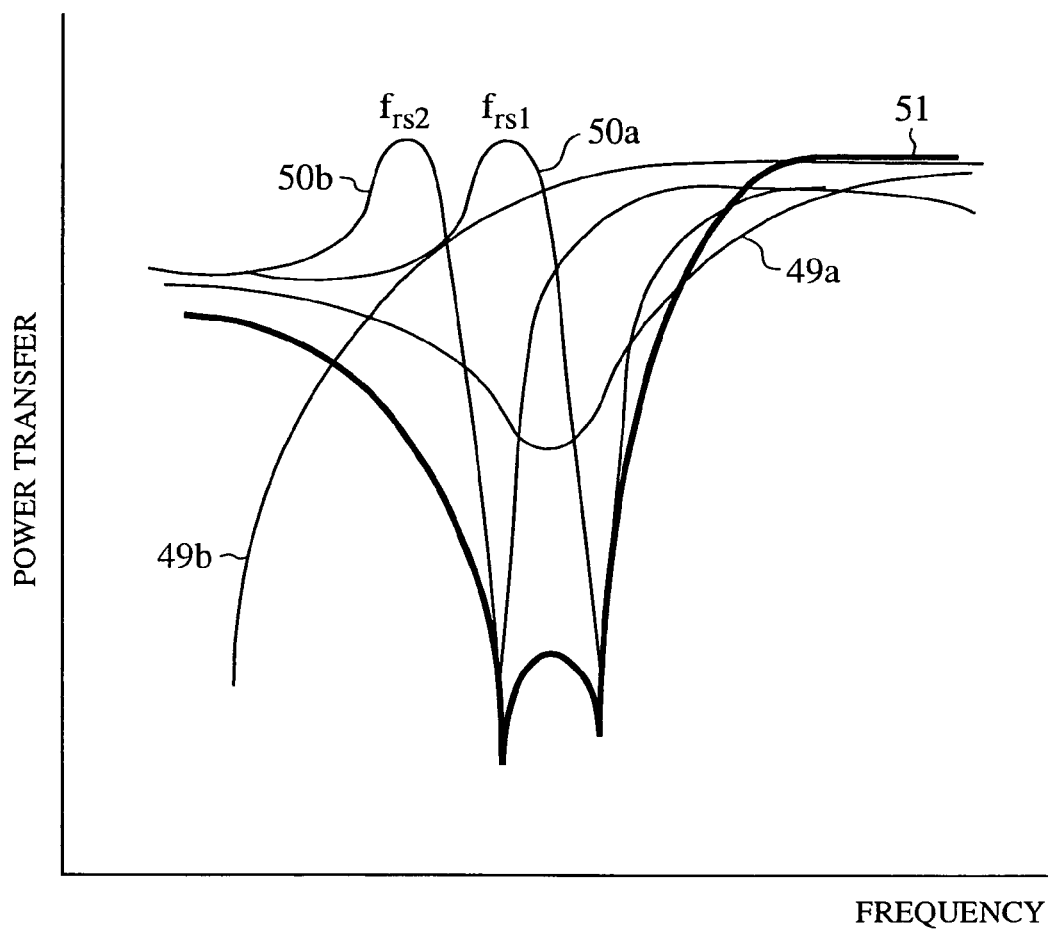
FIG. 46 is an explanatory drawing for explaining an operation of the filter circuitry as shown in FIG. 44.

FIG. 46 is an explanatory drawing for explaining an operation of the filter circuitry of FIG. 44. In the figure, reference numeral 49a denotes a pass filter characteristic which is obtained by superimposing a pass filter characteristic of the first L-shaped circuit of FIG. 45, which is comprised of the inductor 47a, the capacitor 48a, and the capacitor 52a, upon a pass filter characteristic of the T-shaped circuit of FIG. 45, which is comprised of the inductor 47b, the capacitor 48b, and the capacitors 52a and 52b, reference numeral 49b denotes a pass filter characteristic of the second L-shaped circuit of FIG. 45, which is comprised of the inductor 47c and the capacitor 52b, reference numeral 50a denotes a pass filter characteristic of the first SAW resonator 46a, reference numeral 50b denotes a pass filter characteristic of the second SAW resonator 46b, and reference numeral 51 denotes a pass filter characteristic of the filter circuitry of FIG. 44.

The pass filter characteristic 51 of the filter circuitry of FIG. 44 is the one in which the pass filter characteristic 50a of the first SAW resonator 46a, the pass filter characteristic 50b of the second SAW resonator 46b, and the pass filter characteristics 49a and 49b of the filter circuitry of FIG. 45 are superimposed upon one another. With steep attenuation poles formed in the vicinity of the antiresonance frequency $f_{as1}$ of the first SAW resonator 46a and the antiresonance frequency $f_{as2}$ of the second SAW resonator 46b, the filter circuitry can implement a high-pass filtering property of proving excellent attenuation. Furthermore, because the cutoff frequency of the second L-shaped circuit can be varied by changing the inductance of the inductor 47c, the pass filter characteristic of the filter circuitry of FIG. 45 can be adjusted.

Embodiment 17

Figure 47:
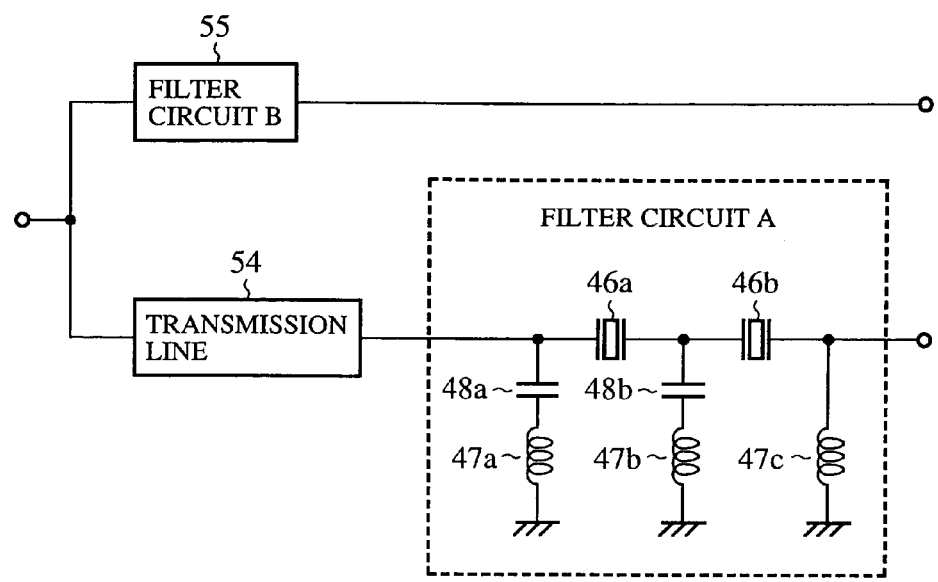
FIG. 47 is a block diagram showing filter circuitry according to embodiment 17 of the present invention.

FIG. 47 is a block diagram showing filter circuitry according to embodiment 17 of the present invention. In the figure, reference numeral 54 denotes a transmission line, and reference numeral 55 denotes a filter circuit B. The filter circuit B has a passband that falls within an attenuation band of a filter circuit A (including SAW resonators 46a and 46b, inductors 47a to 47c, and capacitors 48a and 48b), and has an attenuation band that falls within a passband of the filter circuit A.

In the filter circuit A, a series resonance circuit that consists of the inductor 47a and the capacitor 48a becomes nearly-short-circuited against a ground in the attenuation band of the filter circuit A. Therefore, the impedance of the filter circuit A, which is measured from the side of the transmission line 54, is nearly-short-circuited, too. Because the transmission line 54 has an electrical length that corresponds to λ/4 in the attenuation band, the impedance of the transmission line 54 and the filter circuit A, which is measured from one end of the transmission line 54 connected with the filter circuit B 55, becomes nearly-open-circuited because of phase rotation. Therefore, the filter circuit A hardly exerts an influence upon the pass filter characteristic of the filter circuit B 55 (the attenuation band of the filter circuit A corresponds to the passband of the filter circuit B 55).

On the other hand, when the filter circuit B 55 is also designed so that the impedance thereof looks open-circuited in its own attenuation band, the filter circuit B 55 can be so constructed as to hardly exert an influence upon the pass filter characteristic of the filter circuit A.

As mentioned above, in accordance with this embodiment, there can be provided a low-loss wide-band branching filter in which the filter circuit A and the filter circuit B 55 are connected with each other by way of the transmission line 54, as shown in FIG. 47.

Embodiment 18

Figure 48:
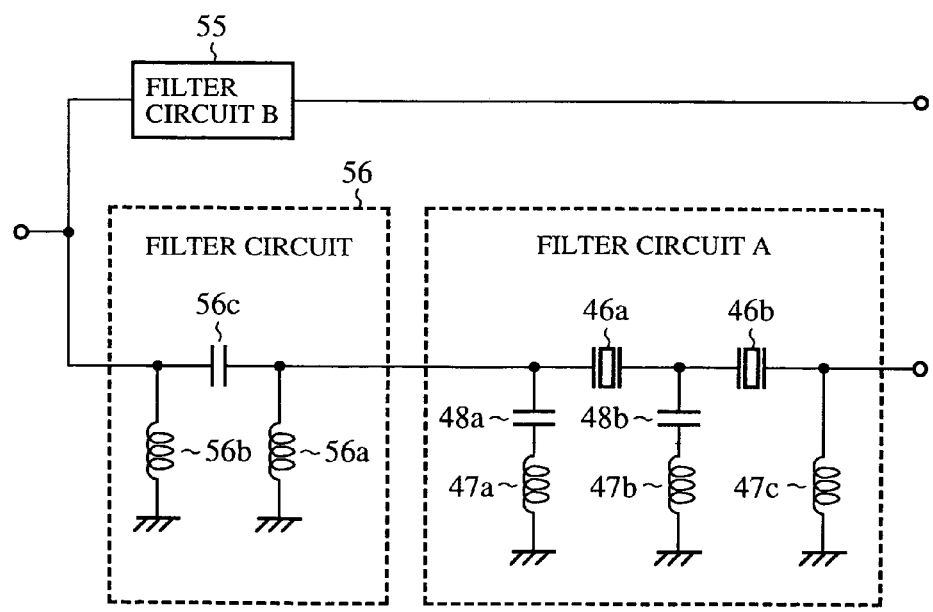
FIG. 48 is a block diagram showing filter circuitry according to embodiment 18 of the present invention.

FIG. 48 is a block diagram showing filter circuitry according to embodiment 18 of the present invention. The filter circuitry of FIG. 48 has a filter circuit 56 instead of the transmission line 54, which is included in the filter circuitry of FIG. 47.

The filter circuit 56 is a π-shaped high-pass filter comprised of inductors 56a and 56b and a capacitor 56c. The filter circuit 56 has a passband that also becomes a passband of the filter circuit A. The values of the inductors 56a and 56b and the capacitor 56c are so determined that the nearly-short-circuited impedance of the filter circuit 56 and the filter circuit A can be converted into the nearly-open-circuited impedance of the filter circuit 56 and the filter circuit A in the attenuation of the filter circuit A. As in the case of above-mentioned embodiment 17, because the impedance of the filter circuit 56 and the filter circuit A, which is measured from one end of the filter circuit 56 connected with the filter circuit B 55, becomes nearly-open-circuited, the same advantage as provided by above-mentioned embodiment 17 is offered.

The filter circuit 56 can be a T-shaped circuit that consists of two capacitors in series and an inductor connected in parallel with the two capacitors. The same advantage is provided in this case.

Each SAW resonator in accordance with any one of above-mentioned embodiments can use, as the piezoelectric element, lithium tantalate such as 36 degrees rotated Y-cut X-propagating lithium tantalate (or 36YX–LiTaO₃) or 42 degrees rotated Y-cut X-propagating lithium tantalate (or 42YX–LiTaO₃) In this case, because though each SAW resonator has a comparatively large electromechanical coupling constant, it has a comparatively excellent temperature characteristic, the difference ($f_{as1}$–$f_{as2}$) between the frequencies of two attenuation poles formed by two SAW resonators in accordance with embodiment 3, as shown in FIG. 17, can be widened, for example. Therefore, there can be provided filter circuitry having excellent temperature stability.

Each SAW resonator in accordance with any one of above-mentioned embodiments can use, as the piezoelectric element, lithium niobate such as 64 degrees rotated Y-cut X-propagating lithium niobate (or 64YX–LiNbO₃) or 41 degrees rotated Y-cut X-propagating lithium niobate (or 41YX–LiNbO₃). In this case, because each SAW resonator has a large electromechanical coupling constant that exceeds 10%, the difference ($f_{as1}$–$f_{as2}$) between the frequencies of two attenuation poles formed by two SAW resonators in accordance with embodiment 3, as shown in FIG. 17, can be widened, for example. As an alternative, each SAW resonator in accordance with any one of above-mentioned embodiments can use, as the piezoelectric element, 128 degrees rotated Y-cut X-propagating lithium niobate (or 128YX–LiNbO₃). In this case, because there is little radiation of unnecessary bulk waves in a frequency range that is higher than the resonance frequency of each SAW resonator, in the case of the filter circuitry of FIG. 9, for example, the loss of the passband within a frequency range that is higher than the antiresonance frequency of the SAW resonator can be reduced.

Each SAW resonator in accordance with any one of above-mentioned embodiments can use, as the piezoelectric element, potassium niobate such as 45 to 75 degrees rotated Y-cut X-propagating potassium niobate (or θYX–KNbO₃). In this case, because each SAW resonator has an extremely large electromechanical coupling constant that exceeds 30%, and has a zero-temperature coefficient at nearly room temperature, the difference ($f_{as1}$ (or $f_{rp1}$)–$f_{as2}$ (or $f_{rp2}$)) between the frequencies of two attenuation poles formed by two SAW resonators in accordance with embodiment 3 or 11, as shown in FIG. 17 or 33, can be widened, for example, and the filter circuitry can provide excellent temperature stability. In addition, because potassium niobate has an extremely large electromechanical coupling constant as a piezoelectric element for use with bulk waves, the difference ($f_{as1}$ (or $f_{rp1}$)–$f_{as2}$ (or $f_{rp2}$)) between the frequencies of two attenuation poles formed by two SAW resonators in accordance with embodiment 3 or 11, as shown in FIG. 17 or 33, can be widened, for example.

Each SAW resonator in accordance with any one of above-mentioned embodiments can use, as the piezoelectric element, zinc oxide (ZnO). In this case, each SAW resonator has an electromechanical coupling constant that is of the order of that of lithium tantalate. Furthermore, each SAW resonator can be formed on a semiconductor substrate. It is therefore possible to implement filter circuitry having an excellent characteristic that is integrated into a semiconductor device. Each SAW resonator in accordance with any one of above-mentioned embodiments can use, as the piezoelectric element, aluminum nitride (AlN). In this case, each SAW resonator has an electromechanical coupling constant that is of the order of those of lithium tantalate and zinc oxide. Furthermore, each SAW resonator can be formed on a semiconductor substrate. It is therefore possible to implement filter circuitry having an excellent characteristic that is integrated into a semiconductor device. In addition, because the propagation velocity of elastic waves propagating through the piezoelectric element composed of aluminum nitride is larger than that of elastic waves propagating through the piezoelectric element composed of another material such as zinc oxide, aluminum nitride is suitable for implementing acoustic wave devices for higher frequencies.

Each SAW resonator in accordance with any one of above-mentioned embodiments can use, as the piezoelectric element, lead titanate (PbTiO$_3$). In this variant, each SAW resonator can have an electromechanical coupling constant that exceeds 10%, and lead titanate provides chemical steady. Therefore, filter circuitry including SAW resonators each composed of an above-mentioned material other than lead titanate should be constructed with airtight seals, whereas the filter circuitry of this variant can be constructed without any airtight seal. Therefore, high-performance filter circuitry can be implemented at a low cost.

Each SAW resonator in accordance with any one of above-mentioned embodiments can use, as the piezoelectric element, lead zirconate titanate (PZT) that consists of a component composed of lead zirconate and a component composed of lead titanate. In this variant, each SAW resonator can have a large electromechanical coupling constant, and therefore the difference ($f_{as1}$ (or $f_{rp1}$)-$f_{as2}$ (or $f_{rp2}$)) between the frequencies of two attenuation poles formed by two SAW resonators in accordance with embodiment 3 or 11, as shown in FIG. 17 or 33, can be widened.

Each SAW resonator in accordance with any one of above-mentioned embodiments need not limitedly use the piezoelectric element. For example, even when each SAW resonator in accordance with any one of above-mentioned embodiments uses a resonance element having an insulator with non-piezoelectricity, such as silicon oxides (SiOx), and utilizing vibrations caused by static electricity, the same advantage can be provided.

Instead of one or more SAW resonators mentioned above, the filter circuitry in accordance with any one of above-mentioned embodiments can use one or more bulk wave resonators each of which utilizes thickness longitudinal vibration, thickness slip vibrations, or the like, for example. Because bulk waves have electromechanical coupling constants that are larger than surface acoustic waves, the difference ($f_{rp1}$-$f_{rp3}$) between the frequencies of two attenuation poles formed by two bulk wave resonators, as shown in FIG. 35, can be widened, for example.

In addition, in accordance with any one of above-mentioned embodiments, surface acoustic waves include leakage surface acoustic waves that propagate through such a material as 36 degrees rotated Y-cut X-propagating lithium-tantalate (or 36YX–LiTaO$_3$) while gradually losing their elastic strain energy, and surface skimming bulk waves (SSBW) that propagate through such a material as 36YX–LiTaO$_3$ while concentrating their energy in the vicinity of a surface of the SAW resonator, in addition to pure surface acoustic waves, such as Rayleigh waves and SH waves, that propagate though the SAW resonator while concentrating their elastic strain energy on the surface of the SAW resonator.

Embodiment 19

As previously mentioned, the filter circuitry in accordance with either of above-mentioned embodiments 1 to 18 can implement a low-loss wide-band pass filter characteristic and provide a large attenuation over a wide frequency band, even though the passband is separated far apart from the attenuation band. However, when ambient temperature changes, it is difficult for the filter circuitry to ensure the low-loss wide-band pass filter characteristic and a large attenuation over a wide frequency band.

In other words, when ambient temperature changes, the inductance $L_1$ of each inductor 14 and the capacitance $C_1$ of each capacitor 15 of the filter circuitry as shown in FIG. 9 can change and therefore the series resonance frequency $f_n$ of each series resonance circuit comprised of one inductor 14 and one capacitor 15, which is a parallel element, can change.

In general, when filter circuitry is used for mobile telecommunication equipment or the like, a range of ambient temperature where the use of the filter circuitry is permitted is set and it is necessary to guarantee the electrical performance of the filter circuitry in the temperature range. However, a problem is that because the component values of each inductor 14 and each capacitor 15 that constitute the filter circuitry change and therefore the resonance frequency of each series resonance circuit changes with change in the ambient temperature, the attenuation characteristic of the filter circuitry degrades and the loss in the passband increases, that is, it is impossible to guarantee the electrical performance of the filter circuitry in the range of ambient temperature where the use of the filter circuitry is permitted.

To solve this problem, filter circuitry in accordance with embodiment 19 is provided with two series resonance circuits each of which is constructed as follows.

Figure 49:
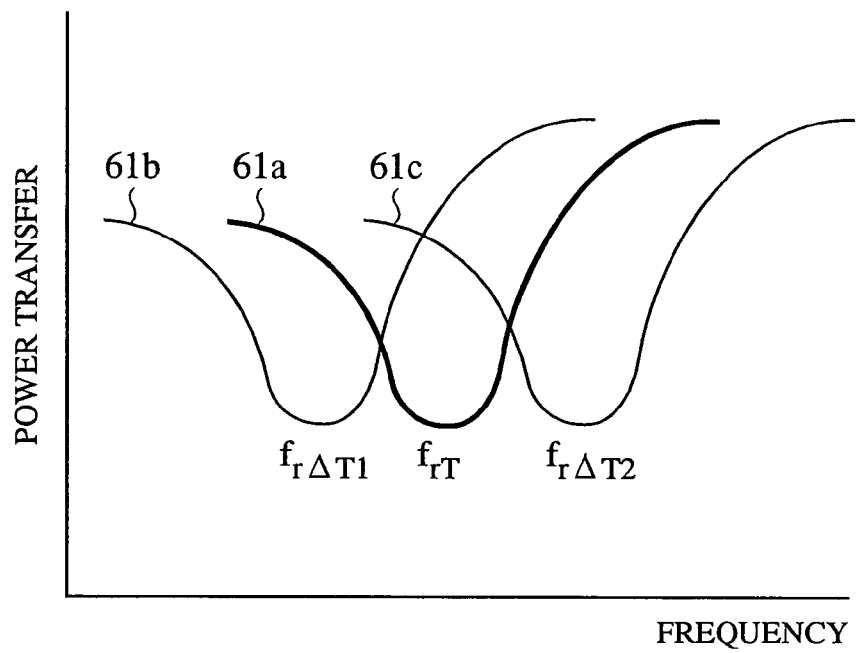
FIG. 49 is an explanatory drawing for explaining an operation of the filter circuitry as shown in FIG. 10.

FIG. 49 is an explanatory drawing for explaining an operation of an equivalent circuit, as shown in FIG. 10, of the filter circuitry. In the figure, reference numeral 61a denotes a pass filter characteristic of the equivalent circuit of FIG. 10 at reference temperature T when it is assumed that there is a loss in each of two inductors 14, two capacitors 15, and a capacitor 22 that constitute the equivalent circuit of FIG. 10. The filter circuitry has a resonance frequency of $f_{rT}$.

When at temperature (T+$\Delta T_1$) to which certain reference temperature T changes by $\Delta T_1$, each series resonance circuit that consists of one inductor 14 and one capacitor 15 has either of the following relationships:

$$\Delta L_1 > 0 \text{ and } \Delta C_1 \geq 0 \quad (16)$$

or $$\Delta L_1 \geq 0 \text{ and } \Delta C_1 > 0 \quad (17)$$

where $\Delta T_1$ is the change in the reference temperature T, a variation in the inductance of the inductor 14 with the temperature variation $\Delta T_1$ is $\Delta L_1$, and a variation in the capacitance of the capacitor 15 with the temperature variation $\Delta T_1$ is $\Delta C_1$, the filter circuitry has a resonance frequency of $f_{r\Delta T1}$ that is lower than the resonance frequency $f_{rT}$ at the reference temperature T, and has a resonance characteristic 61b as shown in FIG. 49.

In other words, when the inductance of the inductor 14 included in each series resonance circuit increases with increase in the ambient temperature, or when the capacitance of the capacitor 15 included in each series resonance circuit increases with increase in the ambient temperature, the resonance frequency $f_{rT}$ of the filter circuitry decreases.

On the other hand, when at temperature ($T+\Delta T_2$) to which the reference temperature T changes by $\Delta T_2$, each series resonance circuit that consists of one inductor 14 and one capacitor 15 has either of the following relationships:

$$\Delta L_1 < 0 \text{ and } \Delta C_1 \leq 0 \quad (18)$$

or $$\Delta L_1 \leq 0 \text{ and } \Delta C_1 < 0 \quad (19)$$

the filter circuitry has a resonance frequency of $f_{r\Delta T2}$ that is higher than the resonance frequency $f_{rT}$ at the reference temperature T, and has a resonance characteristic 61c as shown in FIG. 49.

In other words, when the inductance of the inductor 14 included in each series resonance circuit decreases with increase in the ambient temperature, or when the capacitance of the capacitor 15 included in each series resonance circuit decreases with increase in the ambient temperature, the resonance frequency $f_{rT}$ of the filter circuitry increases.

Therefore, when each series resonance circuit that consists of one inductor 14 and one capacitor 15 is so constructed that the variation $\Delta L$ in the inductance of the inductor 14 and the variation $\Delta C$ in the capacitance of the capacitor 15 with the temperature variation $\Delta T$ are of opposite sign, a variation in the resonance frequency with the change in the inductance of the inductor 14 and a variation in the resonance frequency with the change in the capacitance of the capacitor 15 cancel each other out. Thus, each series resonance circuit that consists of one inductor 14 and one capacitor 15 can be so constructed that the resonance frequency of the filter circuitry doesn't change or hardly changes with a change in the ambient temperature. Therefore, the filter circuitry can implement a low-loss wide-band pass attenuation and provide a large attenuation over a wide frequency band, and the electrical performance of the filter circuitry can be guaranteed regardless of the ambient temperature.

Embodiment 20

Figure 50:
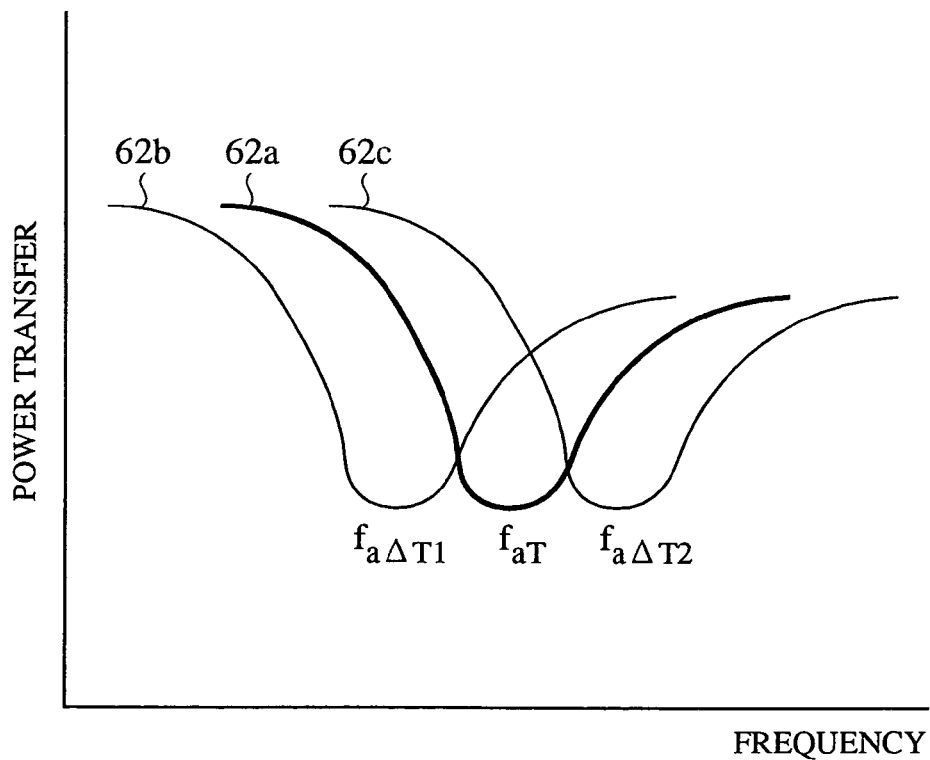
FIG. 50 is an explanatory drawing for explaining an operation of the filter circuitry as shown in FIG. 26.

FIG. 50 is an explanatory drawing for explaining an operation of an equivalent circuit, as shown in FIG. 26, of filter circuitry in accordance with this embodiment. In the figure, reference numeral 62a denotes a pass filter characteristic of the equivalent circuit of FIG. 26 at reference temperature T when it is assumed that there is a loss in each of an inductor 14, a capacitor 15, and two capacitors 22 that constitute the equivalent circuit of FIG. 26. The filter circuitry has an antiresonance frequency of $f_{aT}$.

When at temperature ($T+\Delta T_1$) to which certain reference temperature T changes by $\Delta T_1$, a parallel circuit that consists of the inductor 14 and the capacitor 15 has either of the following relationships:

$$\Delta L_1 > 0 \text{ and } \Delta C_1 \geq 0 \quad (20)$$

or $$\Delta L_1 \geq 0 \text{ and } \Delta C_1 > 0 \quad (21)$$

where $\Delta T_1$ is the change in the reference temperature T, a variation in the inductance of the inductor 14 with the temperature variation $\Delta T_1$ is $\Delta L_1$, and a variation in the capacitance of the capacitor 15 with the temperature variation $\Delta T_1$ is $\Delta C_1$, the filter circuitry has an antiresonance frequency of $f_{a\Delta T1}$ that is lower than the antiresonance frequency $f_{aT}$ at the reference temperature T, and has a resonance characteristic 62b as shown in FIG. 50.

In other words, when the inductance of the inductor 14 included in each series resonance circuit increases with increase in the ambient temperature, or when the capacitance of the capacitor 15 included in each series resonance circuit increases with increase in the ambient temperature, the antiresonance frequency $f_{aT}$ of the filter circuitry decreases.

On the other hand, when at temperature ($T+\Delta T_2$) to which the reference temperature T changes by $\Delta T_2$, the parallel circuit that consists of the inductor 14 and the capacitor 15 has either of the following relationships:

$$\Delta L_1 < 0 \text{ and } \Delta C_1 \leq 0 \quad (22)$$

or $$\Delta L_1 \leq 0 \text{ and } \Delta C_1 < 0 \quad (23)$$

the filter circuitry has an antiresonance frequency of $f_{a\Delta T2}$ that is higher than the antiresonance frequency $f_{aT}$ at the reference temperature T, and has a resonance characteristic 62c as shown in FIG. 50.

In other words, when the inductance of the inductor 14 included in the parallel circuit decreases with increase in the ambient temperature, or when the capacitance of the capacitor 15 included in the parallel circuit decreases with increase in the ambient temperature, the antiresonance frequency $f_{aT}$ of the filter circuitry increases.

Therefore, when the parallel circuit that consists of the inductor 14 and the capacitor 15 is so constructed that the variation $\Delta L$ in the inductance of the inductor 14 and the variation $\Delta C$ in the capacitance of the capacitor 15 with the temperature variation $\Delta T$ are of opposite sign, a variation in the antiresonance frequency with the change in the inductance of the inductor 14 and a variation in the antiresonance frequency with the change in the capacitance of the capacitor 15 cancel each other out. Thus, the parallel circuit that consists of the inductor 14 and the capacitor 15 can be so constructed that the antiresonance frequency of the filter circuitry doesn't change or hardly changes with a change in the ambient temperature. Therefore, the filter circuitry can implement a low-loss wide-band pass attenuation and provide a large attenuation over a wide frequency band, and the electrical performance of the filter circuitry can be guaranteed regardless of the ambient temperature.

Embodiment 21

In FIGS. 9 and 25, the resonance frequency $f_r$ of each resonance circuit comprised of one inductor 14 and one capacitor 15 can be given by the following equation:

$$f_r = 1/(2\pi\sqrt{(L_1 C_1)}) \quad (24)$$

Differentiating of the equation (24) with respect to $C_1$ yields the following equation (25):

$$dL_1/dC_1 = -L_1/C_1 \quad (25)$$

Replacing $dL_1$ and $dC_1$ with $\Delta L_1$ and $\Delta C_1$ respectively, the above equation (25) is transformed into $$\Delta L_1/\Delta C_1 = -L_1/C_1 \quad (26)$$

Therefore, when the relationship given by the equation (26) is established among a variation $\Delta L$ in the inductance of the inductor 14 and a variation $\Delta C$ in the capacitance of the capacitor 15, which are caused by a temperatures variation $\Delta T$ in reference temperature, the inductance L of the inductor 14, and the capacitance C of the capacitor 15, the resonance frequency $f_r$ of the resonance circuit comprised of the inductor 14 and the capacitor 15 doesn't change.

Thus, when the filter circuitry in accordance with each of above-mentioned embodiments 19 and 20 filter is so constructed that the equation (26) is satisfied, the resonance frequency of the filter circuitry doesn't change with change in ambient temperature and the filter circuitry can implement a low-loss wide-band pass attenuation and provide a large attenuation over a wide frequency band. Therefore, the electrical performance of the filter circuitry can be guaranteed regardless of the ambient temperature.

Embodiment 22

Figure 51:
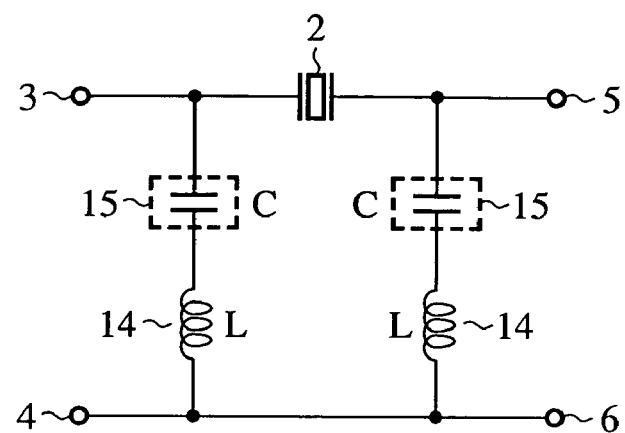
FIG. 51 is a block diagram showing filter circuitry according to embodiment 22 of the present invention.

FIG. 51 is a block diagram showing filter circuitry according to embodiment 22 of the present invention. While the filter circuitry of FIG. 51 basically has the same structure of that of FIG. 9 in accordance with above-mentioned embodiment 1, the filter circuitry of this embodiment differs from that of embodiment 1 in that the capacitor 15 included in each series resonance circuit is an interdigital capacitor formed on a piezoelectric substrate.

Figure 52:
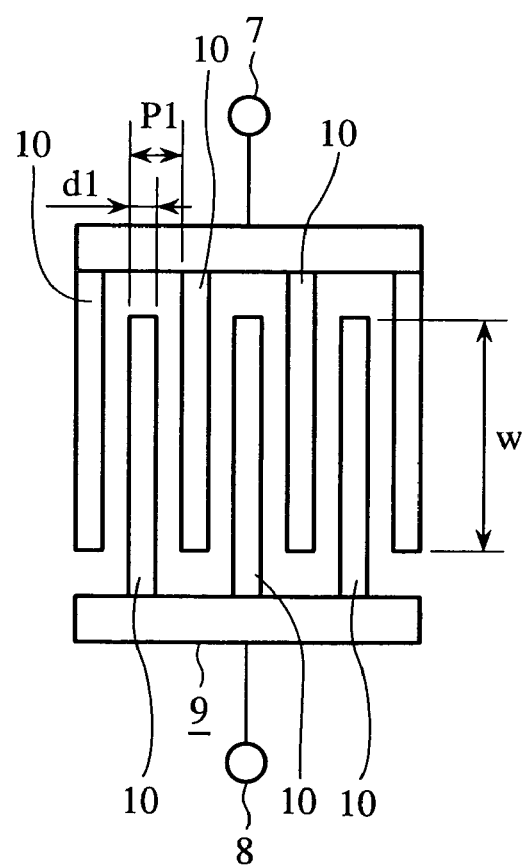
FIG. 52 is a diagram showing the structure of an interdigital capacitor.

FIG. 52 is a view showing the structure of the interdigital capacitor. The interdigital capacitor of FIG. 52 has the same structure as an IDT 9 of FIG. 3.

An IDT 9 serves as a simple capacitor in a frequency range in which it doesn't excite any surface acoustic wave. The interdigital capacitor can be implemented by forming an IDT 9 having a frequency that differs greatly from the antiresonance frequency of a SAW resonator 2.

Because such an IDT 9 has a pattern that is formed with a high degree of accuracy, it can have a capacitance to be more accurate than normal chip capacitors and so on. Furthermore, because the interdigital capacitor can be formed to be smaller than normal chip capacitors, the size of the filter circuitry can be reduced.

It should be noted that the concept of this embodiment is not limitedly applied to the structure of the filter circuitry of FIG. 51 as previously mentioned. For example, the capacitor included in the series element of the filter circuitry of FIG. 25 can be an interdigital capacitor. In this case, the same advantage as mentioned above can be provided.

Embodiment 23

Figure 53:
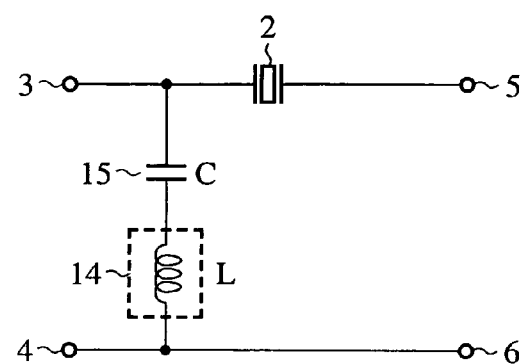
FIG. 53 is a block diagram showing filter circuitry according to embodiment 23 of the present invention.

FIG. 53 is a block diagram showing filter circuitry according to embodiment 23 of the present invention. The filter circuitry of FIG. 53 has an inductor 14 that is formed by using an air-core coil.

When the filter circuitry has a capacitor 15 that is an interdigital capacitor formed on LiNbO$_3$, which is often used as a piezoelectric substrate, a variation $\Delta C$ in the capacitance of the capacitor due to a temperature change $\Delta T$ has a positive sign. On the other hand, a variation $\Delta L$ in the inductance of the air-core coil due to the temperature change $\Delta T$ has a negative sign.

Therefore, because $\Delta L$ and $\Delta C$ are of opposite sign, the amount of change in the resonance frequency is reduced, and therefore the filter circuitry can implement a low-loss wide-band pass attenuation and provide a large attenuation over a wide frequency band regardless of change in temperature. Therefore, the electrical performance of the filter circuitry can be guaranteed regardless of the ambient temperature.

Figure 54:
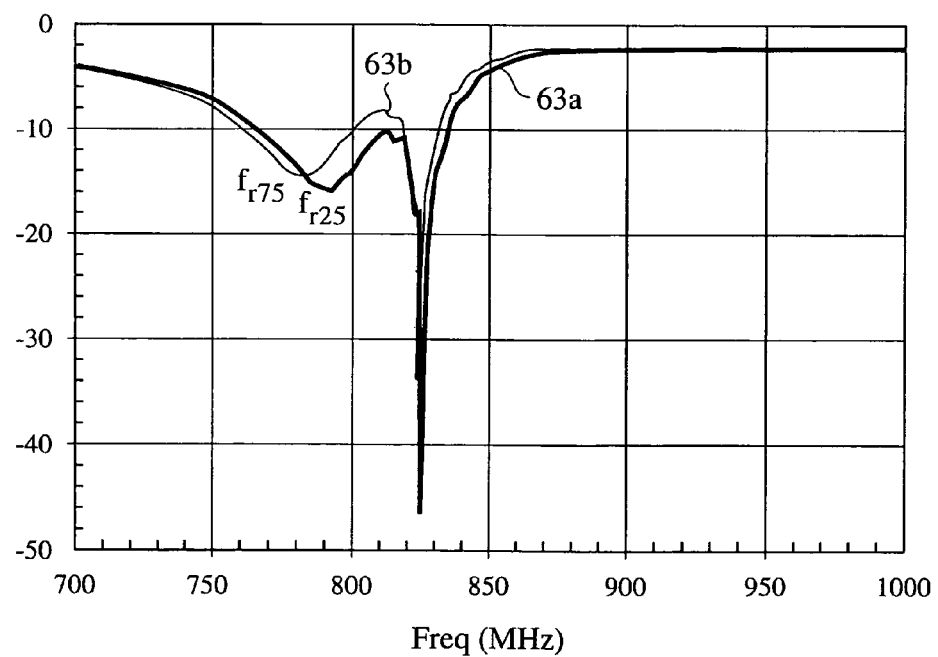
FIG. 54 is an explanatory drawing showing a result of measurement of a pass filter characteristic of the filter circuitry of embodiment 23 that is actually constructed by using a chip inductor and an interdigital capacitor formed on a $LiNbO_3$ substrate.

FIG. 54 shows a pass filter characteristic that is obtained when the filter circuitry is actually constructed by using a chip inductor and an interdigital capacitor formed on a LiNbO$_3$ substrate. In FIG. 54, reference numeral 63a denotes a pass filter characteristic that is obtained when the filter circuitry is held at a temperature of 25° C., reference character $f_{r25}$ denotes the resonance frequency of a parallel element comprised of the chip inductor and the interdigital capacitor, which is held at the temperature of 25° C., reference numeral 63b denotes a pass filter characteristic that is obtained when the filter circuitry is held at a temperature of 75° C., and reference character $f_{r75}$ denotes the resonance frequency of the parallel element, which is held at the temperature of 75° C.

Figure 55:
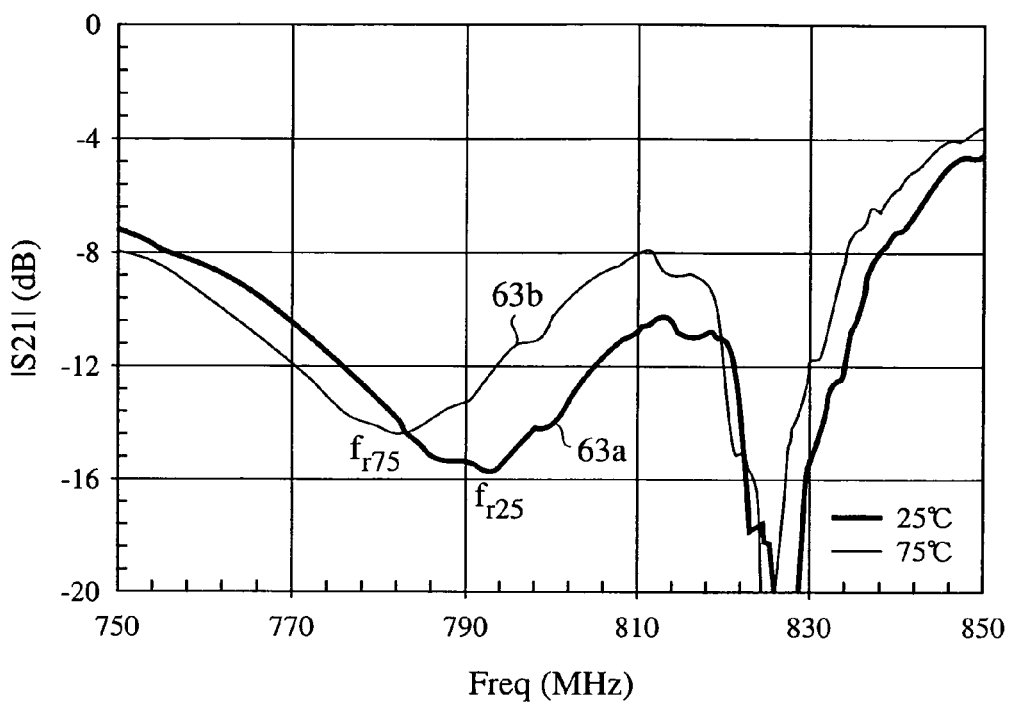
FIG. 55 is an explanatory drawing showing an enlarged part of FIG. 54 in the vicinity of a resonance frequency.

FIG. 55 is a diagram showing an enlarged part of FIG. 54 in the vicinity of the resonance frequency of the parallel element. The amount of change in the resonance frequency due to the temperature change $|f_{r25} - f_{r75}|$ is about 15 MHz. The resonance frequency of the parallel element decreases.

Figure 56:
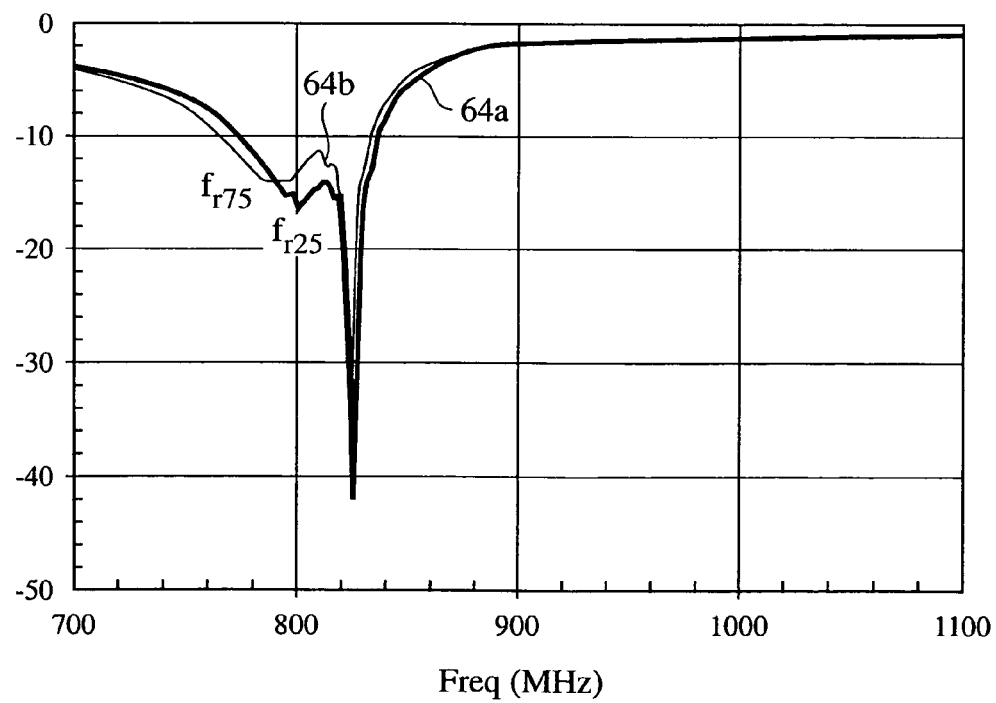
FIG. 56 is an explanatory drawing showing a result of measurement of a pass filter characteristic of the filter circuitry of embodiment 23 that is actually constructed by using an air-core coil and an interdigital capacitor formed on a $LiNbO_3$ substrate.

FIG. 56 shows a pass filter characteristic that is obtained when the filter circuitry in accordance with embodiment 23 of the present invention is actually constructed by using an air-core coil and an interdigital capacitor formed on a LiNbO$_3$ substrate. In FIG. 56, reference numeral 64a denotes a pass filter characteristic that is obtained when the filter circuitry is held at a temperature of 25° C., reference character $f_{r25}$ denotes the resonance frequency of a parallel element comprised of the air-core coil and the interdigital capacitor, which is held at the temperature of 25° C., reference numeral 64b denotes a pass filter characteristic that is obtained when the filter circuitry is held at a temperature of 75° C., and reference character $f_{r75}$ denotes the resonance frequency of the parallel element, which is held at the temperature of 75° C.

Figure 57:
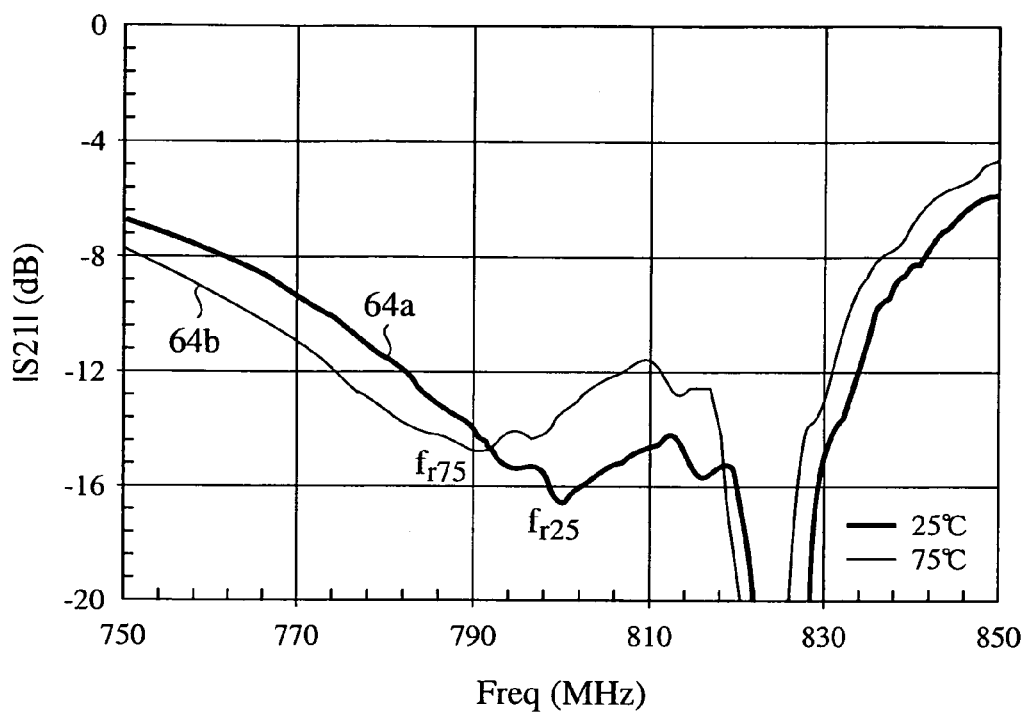
FIG. 57 is an explanatory drawing showing an enlarged part of FIG. 56 in the vicinity of a resonance frequency.

FIG. 57 is a diagram showing an enlarged part of FIG. 56 in the vicinity of the resonance frequency of the parallel element. The amount of change in the resonance frequency due to the temperature change $|f_{r25} - f_{r75}|$ is about 10 MHz. The resonance frequency of the parallel element decreases. In this case where the inductor is an air-core coil, the amount of change in the resonance frequency of the parallel element can be reduced as compared with the case where the filter circuitry includes a chip coil instead of the air-core coil.

Though the resonance frequency of the parallel element that consists of the coil and the capacitor is so set as to be lower than the antiresonance frequency of the SAW resonator 2 in order to verify the resonance frequency of the parallel element, because the same advantage is provided even if the resonance frequency of the parallel element is so set as to be close to the antiresonance frequency of the SAW resonator 2, the filter circuitry can implement a low-loss wide-band pass attenuation and provide a large attenuation over a wide frequency band regardless of change in the ambient temperature. Therefore, the electrical performance of the filter circuitry can be guaranteed regardless of the ambient temperature.

It should be noted that the concept of this embodiment is not limitedly applied to the structure of the filter circuitry of FIG. 53 as previously mentioned. For example, even if the filter circuitry has two or more series resonance circuits each of which is a parallel element, the same advantage can be provided. In the filter circuitry of FIG. 25, the inductor included in the series element can be an air-core coil. In this variant, the same advantage can be provided.

Embodiment 24

Figure 58:
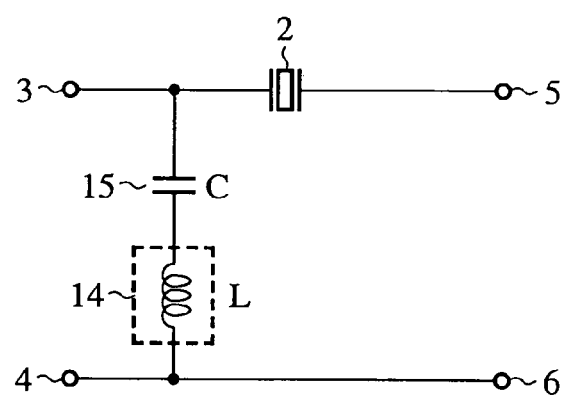
FIG. 58 is a block diagram showing filter circuitry according to embodiment 24 of the present invention.

FIG. 58 is a block diagram showing filter circuitry according to embodiment 24 of the present invention. In the filter circuitry of FIG. 58, an inductor 14 is constructed of a coil composed of polystyrene having a linear expansion coefficient of about 380 ppm/° C.

Figure 59:
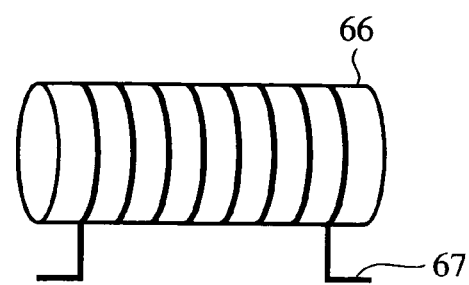
FIG. 59 is an explanatory drawing showing a coil 67 having a core 66 composed of polystyrene.

FIG. 59 shows the coil 67 having the core 66 composed of above-mentioned polystyrene.

As disclosed in "Electromagnetism", 1st ed., pp. 206–207, written by Yasuharu Suematsu and published on October, 1973 by Kyoritsu Shuppan (referred to as reference 6 from here on), the inductance L of the inductor can be given by the following equation:

$$L = \gamma \mu \pi a^2 N^2 / l \qquad (27)$$

where $\gamma$ is a Nagaoka coefficient, $\mu$ is permeability, a is the radius of the core, N is the number of turns of the coil, and l is the length of the core.

In the coil 67 having the core 66 composed of polystyrene having a linear expansion coefficient of about 380 ppm/° C., the core 66 expands along with a temperature change $\Delta T$. However, because the core 66 is restricted by the coil 67 and hardly expands radially, and the expansion in a direction of the length of the core becomes predominant, the inductance L of the coil decreases according to the equation (27).

In other words, a variation $\Delta L$ in the inductance of the coil has a negative sign. In general, when the filter circuitry has a capacitor 15 that is an interdigital capacitor formed on a LiNbO$_3$ substrate, which is often used as a piezoelectricity substrate, the permittivity of LiNbO$_3$ has a positive temperature coefficient, as shown in pp. 544 of reference 2, for example, and therefore a variation $\Delta C$ of the capacitance of the capacitor 15 with the temperature change $\Delta T$ has a positive sign.

Therefore, $\Delta L$ and $\Delta C$ are of opposite sign, a change of the resonance frequency of a parallel element with the change in the inductance of the inductor 14 and a change of the resonance frequency with the change in the capacitance of the capacitor 15 cancel each other out, and the change of the resonance frequency is reduced.

Figure 60:
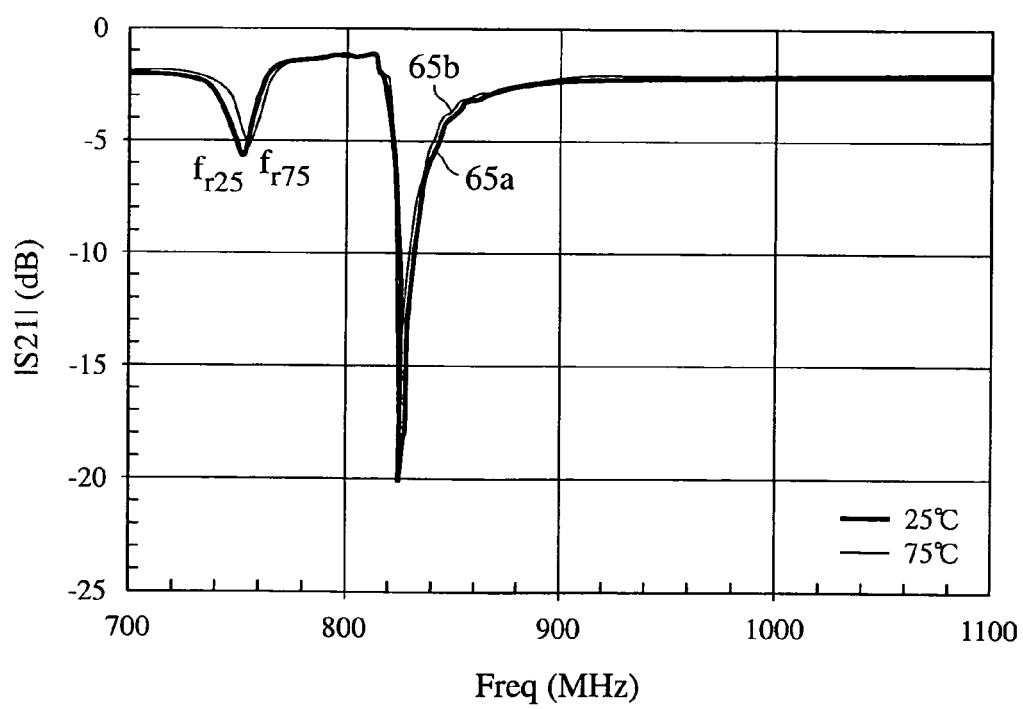
FIG. 60 is an explanatory drawing showing a result of measurement of a pass filter characteristic of the filter circuitry of embodiment 23 that is actually constructed by using the coil having the core composed of polystyrene and an interdigital capacitor formed on a LiNb0$_3$ substrate.
Figure 61:
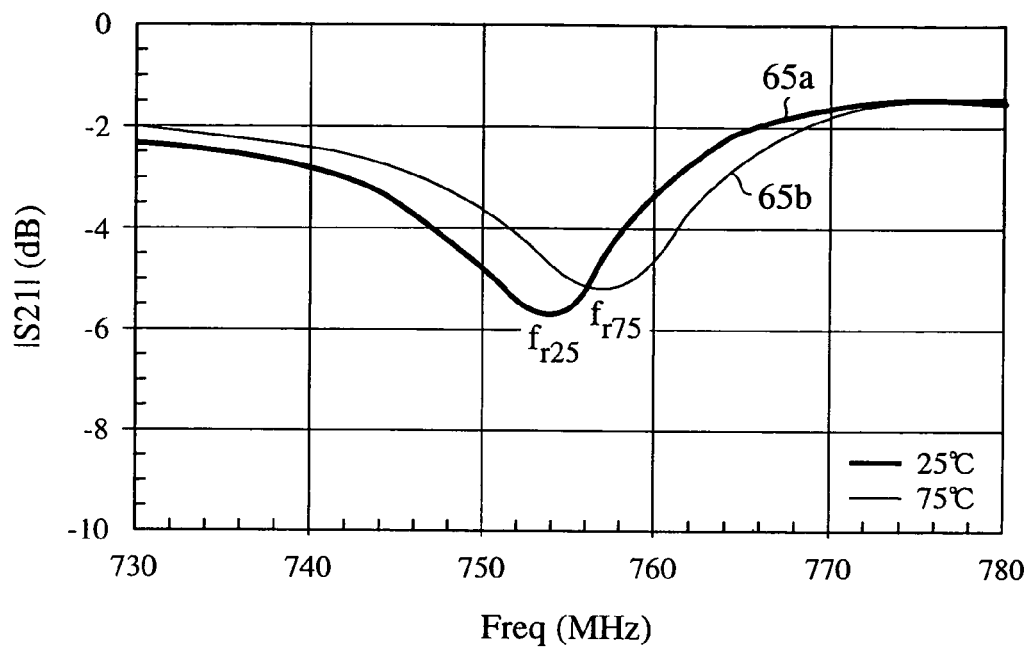
FIG. 61 is an explanatory drawing showing an enlarged part of FIG. 60 in the vicinity of a resonance frequency.

FIG. 60 shows a pass filter characteristic that is measured when the filter circuitry is actually constructed by using the coil 67 having the core 66 composed of polystyrene and an interdigital capacitor formed on a LiNbO$_3$ substrate. In FIG. 60, reference numeral 65a denotes a pass filter characteristic that is measured when the filter circuitry is held at a temperature of 25° C., reference character $f_{r25}$ denotes the resonance frequency of the parallel element comprised of the coil and the interdigital capacitor, which is held at the temperature of 25° C. FIG. 61 is a diagram showing an enlarged part of FIG. 60 in the vicinity of the resonance frequency of the parallel element.

At this time, the capacitance of the above-mentioned interdigital capacitor is C=2.52 pF, the inductance of the coil 67 having the core 66 composed of polystyrene is L=17.67 nH, and the resonance frequency of the parallel element is $f_{r25}$=754 MHz.

In FIG. 60, reference numeral 65b denotes a pass filter characteristic that is measured when the filter circuitry is held at a temperature of 75° C., reference character $f_{r75}$ denotes the resonance frequency of the parallel element, which is held at the temperature of 75° C. At this time, the capacitance of the above-mentioned interdigital capacitor changes to C=2.55 pF and the inductance of the coil 67 having the core 66 composed of polystyrene changes to L=17.34 nH along with the temperature change.

Therefore, because the change in the capacitance of the capacitor with the temperature change $\Delta T$ is $\Delta C$=0.025 pF and the change of the inductance of the coil is $\Delta L$=−0.33 nH, and they are of opposite sign, the change of the resonance frequency of the parallel element with the change in the capacitance of the capacitor and the change of the resonance frequency with the change in the inductance of the inductor cancel each other out and the change of the resonance frequency is therefore reduced to about 3.5 MHz. The change of the resonance frequency is smaller than that in the case where the inductor is a chip inductor and that in the case where the inductor is an air-core coil.

In accordance with this embodiment 24, the resonance frequency of the parallel element has a change ($f_{r75}$−$f_{r25}$) of about 3.5 MHz with the temperature change $\Delta T$=50° C., as previously mentioned, and increases with increase in the ambient temperature. Therefore, in order to reduce the change in the resonance frequency of the parallel element to 0, it is preferable that the core of the coil is composed of a material having a linear expansion coefficient of about 146 ppm/° C. Furthermore, when −3 MHz of change of the resonance frequency is acceptable, a material having a linear expansion coefficient of about 7 ppm/° C. or more can be used as the core.

Though the resonance frequency of the series circuit that consists of the coil and the capacitor is so set as to be lower than the antiresonance frequency of a SAW resonator 2 in order to verify the resonance frequency of the series circuit, the same advantage is provided even if the resonance frequency of the series circuit is so set as to be close to the antiresonance frequency of the SAW resonator 2.

When a material having a linear expansion coefficient of about 7 ppm/° C. or more is used as the core of the coil included in the series circuit that is the parallel element, the change of the resonance frequency of the parallel element with both the variation $\Delta C$ of the capacitance of the interdigital capacitor and the variation $\Delta L$ of the inductance of the coil having the core composed of polystyrene, which are caused by the temperature change, cancel each other out and therefore the change of the resonance frequency of the parallel element can be further reduced as compared with the case of the use of a chip inductor. Therefore, the filter circuitry can implement a low-loss wide-band pass attenuation and provide a large attenuation over a wide frequency band regardless of change in the ambient temperature, and the electrical performance of the filter circuitry can be guaranteed regardless of the ambient temperature.

It should be noted that the concept of this embodiment is not limitedly applied to the structure of the filter circuitry of FIG. 53 as previously mentioned. For example, even if the filter circuitry has two or more series resonance circuits each of which is a parallel element, the same advantage can be provided. In the filter circuitry of FIG. 25, the inductor included in the series element can be a coil having a core composed of a material having a linear expansion coefficient of about 7 ppm/° C. or more. In this variant, the same advantage can be provided.

Embodiment 25

Figure 62:
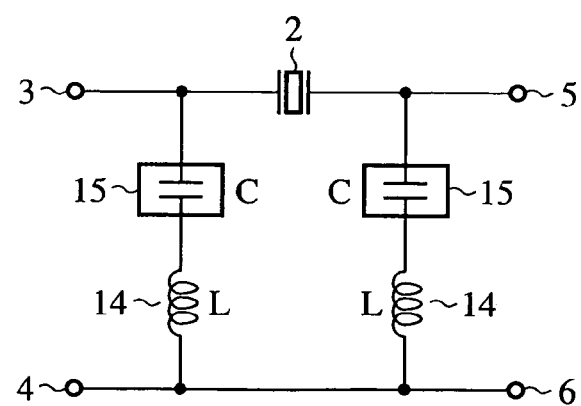
FIG. 62 is a block diagram showing filter circuitry according to embodiment 25 of the present invention.

FIG. 62 is a block diagram showing filter circuitry according to embodiment 25 of the present invention. While the filter circuitry of FIG. 62 basically has the same structure as the filter circuitry of FIG. 9 in accordance with above-mentioned embodiment 1, the filter circuitry of FIG. 62 differs from that of FIG. 9 in that a capacitor 15 included in each parallel element is an interdigital capacitor formed on a quartz substrate.

The quartz substrate does not change its characteristics greatly, i.e., has a so-called zero-temperature characteristic over a wide range of temperatures, as disclosed in the reference 2, pp. 111 to 113. The interdigital capacitor formed on the quartz substrate has a capacitance that doesn't change depending on the ambient temperature, and exhibits stable characteristics. Therefore, the filter circuitry can implement a low-loss wide-band pass attenuation and provide a large attenuation over a wide frequency band, and the electrical performance of the filter circuitry can be guaranteed regardless of the ambient temperature.

It should be noted that the concept of this embodiment is not limitedly applied to the structure of the filter circuitry of FIG. 62 as previously mentioned. For example, in the filter circuitry of FIG. 25, the capacitor included in the series element can be an interdigital capacitor. In this variant, the same advantage can be provided.

INDUSTRIAL APPLICABILITY

As mentioned above, the filter circuitry in accordance with the present invention is suitable for transmitting signals that fall within a certain passband for use with communication equipment and so on, and, when attenuating signals that don't fall within the certain passband, implementing a low-loss wide-band pass filter characteristic and providing a large attenuation over a wide frequency band, even though the passband is separated far apart from the attenuation band.

The invention claimed is:

1. A filter circuit for transmitting signals that fall within a certain passband and for attenuating signals that don't fall within the certain passband, comprising:
   a series element including a resonance element having an antiresonance characteristic; and
   a parallel element including a series circuit including an inductor and a capacitor, wherein
   said resonance element has an antiresonance frequency lower than any frequency within the passband, and
   said series circuit has a resonance frequency lower than any frequency within the passband.

2. The filter circuit according to claim 1, wherein said series circuit has a resonance frequency lower than an antiresonance frequency of said resonance element.

3. The filter circuit according to claim 1, further comprising:
   a plurality of series elements having different antiresonance frequencies.

4. The filter circuit according to claim 1, further comprising:
   a plurality of parallel elements having different resonance frequencies.

5. The filter circuit according to claim 1, wherein said resonance element of said series element is provided with an acoustic wave resonator.

6. The filter circuit according to claim 5, wherein said acoustic wave resonator is constructed of a piezoelectric element predominantly composed of lithium niobate.

7. The filter circuit according to claim 1, wherein there is a temperature change $\Delta T$ with respect to reference temperature, a change $\Delta C$ in a capacitance C of the capacitor, which is caused by the temperature change $\Delta T$, has a sign opposite to that of a change $\Delta L$ in an inductance L of the inductor, which is caused by the temperature change $\Delta T$.

8. The filter circuit according to claim 7, wherein the relationship between the capacitance C of the capacitor and the inductance L of the inductor is $\Delta L/\Delta C = -L/C$.

9. A filter circuit for transmitting signals that fall within a certain passband and for attenuating signals that don't fall within the certain passband, comprising:
   a series element including a resonance element having an antiresonance characteristic, and
   a parallel element including an open stub that is a distributed constant transmission line having an end connected with said resonance element and another end that is open, wherein the filter circuit attenuates signals that fall below and signals that fall above the certain passband.

10. A filter circuit for transmitting signals that fall within a certain passband and for attenuating signals that don't fall within the certain passband, comprising:
    a parallel element including a resonance element having a resonance characteristic; and
    a series element including a parallel circuit including an inductor and a capacitor, wherein
    said resonance element has a resonance frequency higher than any frequency within the passband, and
    said parallel circuit has an antiresonance frequency higher than any frequency within the passband.

11. The filter circuit according to claim 10, wherein said parallel circuit has an antiresonance frequency higher than a resonance frequency of said resonance element.

12. The filter circuit according to claim 10, further comprising:
    a plurality of series elements having different antiresonance frequencies.

13. The filter circuit according to claim 10, further comprising:
    a plurality of parallel elements having different resonance frequencies.

14. The filter circuitry circuit according to claim 10, wherein said resonance element of said parallel element is provided with an acoustic wave resonator.

15. The filter circuit according to claim 14, wherein said acoustic wave resonator is constructed of a piezoelectric element predominantly composed of lithium niobate.

16. The filter circuit according to claim 10, wherein when there is a temperature change $\Delta C$ in a capacitance C of the capacitor, which is caused by the temperature change $\Delta T$, has a sign opposite to that of a change $\Delta L$ in an inductance L of the inductor, which is caused by the temperature change $\Delta T$.

17. The filter circuit according to claim 16, wherein the relationship between the capacitance C of the capacitor and the inductance L of the inductor is $\Delta L/\Delta C = -L/C$.

* * * * *

UNITED STATES PATENT AND TRADEMARK OFFICE
CERTIFICATE OF CORRECTION

| | | |
|---|---|---|
| PATENT NO. | : 7,061,345 B2 | Page 1 of 1 |
| APPLICATION NO. | : 10/493662 | |
| DATED | : June 13, 2006 | |
| INVENTOR(S) | : Koichiro Misu et al. | |

It is certified that error appears in the above-identified patent and that said Letters Patent is hereby corrected as shown below:

Column 36,
Line 50, Claim 14, delete "circuitry".

Signed and Sealed this

Twelfth Day of December, 2006

JON W. DUDAS
*Director of the United States Patent and Trademark Office*